United States Patent [19]

Mikhailovsky

[11] 4,059,803

[45] Nov. 22, 1977

[54] METHOD OF CONVERTING THE ELECTROMAGNETIC SPECTRUM CARRIER FREQUENCY AND AN ELECTROMAGNETIC ENERGY RECEIVER FOR SAME

[76] Inventor: Leonard Konstantinovich Mikhailovsky, Fakultetsky pereulok 6, kv. 25, Moscow, U.S.S.R.

[21] Appl. No.: 678,723

[22] Filed: Apr. 20, 1976

Related U.S. Application Data

[63] Continuation of Ser. No. 424,611, Dec. 13, 1973, abandoned.

[51] Int. Cl.$^2$ .............................................. H03D 7/00
[52] U.S. Cl. .................................................... 325/445
[58] Field of Search .................... 325/445, 446, 24; 307/88.3; 321/69 R, 69 WG, 69 WL

[56] References Cited

U.S. PATENT DOCUMENTS

| 2,810,904 | 10/1957 | Blitz | 325/24 |
|---|---|---|---|
| 3,118,113 | 1/1964 | Ferrar et al. | 325/445 |
| 3,573,632 | 4/1971 | Kuhn | 325/445 |

*Primary Examiner*—Benedict V. Safourek
*Attorney, Agent, or Firm*—Haseltine, Lake & Waters

[57] ABSTRACT

A method of converting the carrier frequency of an incoming electromagnetic wave spectrum in an electromagnetic energy receiver comprising a converter, whereby the energy of the electromagnetic waves received by the receiver is accumulated in the input resonant system of the aforementioned converter which is frequency-selective and can be returned in the operating frequency range of this receiver. The electromagnetic energy is accumulated either directly in the material of the semiconductor, in particular, dielectric element used in the above input resonant system, or in a resonator which is contained in the same input resonant system and is built on sections of a lumped- and/or distributed-parameter line and which includes a semiconductor element. The electromagnetic characteristics of the semiconductor element depend on the electromagnetic parameters of constant and variable magnetic and electric fields acting upon this element. A periodic time change in the magnitude of the incoming electromagnetic energy accumulated in the input resonant system of the converter, i.e. auxiliary power modulation of the incoming electromagnetic waves, is brought about by selecting appropriate electromagnetic parameters of the constant and variable magnetic and electric fields acting upon the material of the aforementioned semiconductor element. An electromagnetic energy receiver comprising at least one converter and an output device connected in series. The converter is made in the form of an input resonant system and an output resonant system connected by means of a spatial detection system; the input resonant system comprises at least one semiconductor element and is tuned to the time-average value of the carrier frequency of the incoming electromagnetic waves, while the output resonant system is tuned to a frequency which is a multiple of the time-constant frequency of the auxiliary power modulation imposed on the incoming electromagnetic waves. The invention is intended for application mainly in the field of radio physics and electronics.

25 Claims, 25 Drawing Figures a)

b)

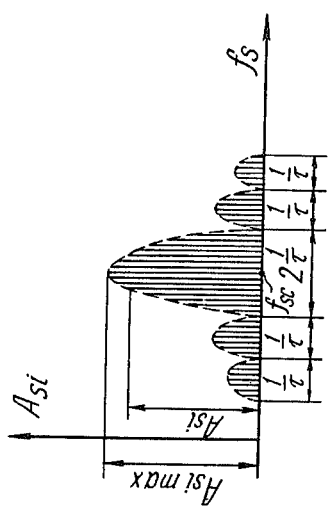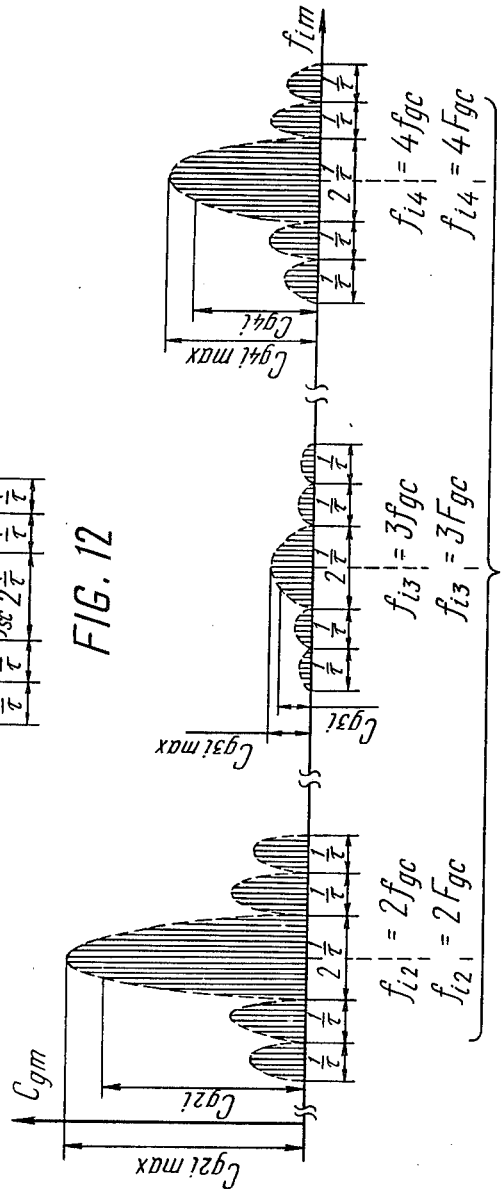
FIG. 12
FIG. 13

METHOD OF CONVERTING THE ELECTROMAGNETIC SPECTRUM CARRIER FREQUENCY AND AN ELECTROMAGNETIC ENERGY RECEIVER FOR SAME

CROSS-RELATED APPLICATION

This application is a continuation of copending application 424,611 filed Dec. 13, 1973, now abandoned.

FIELD OF THE INVENTION

The present invention relates to the fields of radiophysics and electronics and in particular to methods of converting electromagnetic frequency spectra and to electromagnetic energy receivers for same. It can be used, for instance, to design receivers for amplitude-modulated, frequency-modulated and amplitude-frequency modulated electromagnetic waves such as panoramic receivers intended to measure the intensity of electromagnetic fields at various frequencies of electromagnetic waves required, for example, for solving problems of electromagnetic compatibility of radio equipments or systems located within a limited area; panoramic receivers to measure out-ot-band and spurious radiation from sources of electromagnetic waves within waveguides; precision pulse power meters (devices for measuring instantaneous peak power values), low- and average- accuracy meters for measuring the frequency of electromagnetic waves; straight frequency-selective broadcast receivers with electric or magnetic tuners serving to receive amplitude-modulated signals undergoing also auxiliary sinewave frequency or amplitude modulation, etc., theoretically at all frequencies of the electromagnetic spectrum.

DISCUSSION OF THE PRIOR ART

Widely known in the prior art is a method of converting the carrier frequency of the electromagnetic spectrum which is employed in superheterodyne receivers. Such a receiver contains a converter using at least one semiconductor element whose electromagnetic characteristics depend on the intensity, polarization and frequency of the field generated by the received and locally generated (auxiliary) electromagnetic waves. In the superheterodyne receiver the carrier frequency $f_s$ of the received spectrum is changed to a so-called intermediate carrier frequency $f_i$ of converted electromagnetic waves which is functionally related to the magnitude of said carrier frequency $f_s$ of the received spectrum and the magnitude of the carrier frequency $f_g$ of auxiliary electromagnetic waves generated by the tunable local oscillator of the receiver. A classic superheterodyne receiver is shown in the form of a block diagram in FIG. 1.

The receiver comprises an input waveguide-feeder system 1, input circuits 2 and a frequency-selective amplifier 3 connected in series to form an input device 1 of the receiver. The output of the frequency-selective amplifier 3 is connected to the input of a mixer 4 which in its turn is coupled to a local oscillator 5 generating auxiliary electromagnetic waves. The output of the mixer 4 is connected to an intermediate-frequency amplifier 6. In a receiver designed for receiving amplitude-modulated electromagnetic waves the intermediate-frequency amplifier 6 is connected to a peak detector 7. A frequency-modulation receiver has the intermediate frequency amplifier 6 placed in series with an amplitude limiter 8 and a frequency-sensitive detector 9. The output of the frequency-sensitive detector 9 or that of the peak detector 7, respectively, will be connected to an audio amplifier 10 coupled with an output unit 11.

Consider the sequence of events that occur in the superheterodyne receiver of FIG. 1 when electromagnetic waves are passing through it. The electromagnetic waves coming to the receiver at the carrier frequency $f_s$ are injected into the receiver input waveguide-feeder system 1, pass through the input circuits 2, where electromagnetic waves that are not to be received are preliminarily filtered out, undergo amplification in the frequency-selective amplifier 3 and arrive at the mixer 4. The term input waveguide-feeder system 1 as used in the context has a broad meaning: it may imply a coaxial line, a double-wire circuit, a waveguide and so on, i.e. a channel for transmitting to the receiver electromagnetic waves to be frequency-converted with the carrier frequency lying in any region of the electromagnetic spectrum. The mixer 4 also accepts auxiliary electromagnetic waves at the carrier frequency $f_g$ generated by the local oscillator 5 tunable within the operating frequency range of the superheterodyne receiver. The electromagnetic output signals of the mixer 4 have the intermediate carrier frequency $f_i$ given by $f_i = f_s - f_g$. These signals are amplified in the intermediate-frequency amplifier 6 and, in case the system receives amplitude-modulated electromagnetic waves, demodulated by the peak detector 7. If the received waves are frequency-modulated, the output of the intermediate-frequency amplifier 6 is fed to the amplitude limiter 8 and further to the frequency-sensitive detector 9. After being demodulated by the amplitude detector 7 or the frequency detector 9, whichever the case may be, the signals are amplified by the audio amplifier 10 and fed to the output unit 11 which may be a cathode-ray tube, a loudspeaker, a pointer indicator, a recorder, etc. The superheterodyne receiver is tuned to the electromagnetic wave carrier by simultaneously adjusting the frequencies of the local oscillator 5, the input circuits 2 and the frequency-selective amplifier 3. As a result, the intermediate carrier frequency $f_i$ of the converted electromagnetic waves becomes constant, i.e. $f_i =$ const. This way of tuning and, hence, returning of the receiver is termed ganged tuning. The frequency selectivity and sensitivity of the superheterodyne receiver depend on the resonance qualities of the tuned circuits of the intermediate-frequency amplifier 6, while the efficiency of noise suppression at so-called image and reception combination frequencies is determined by the Q-factor of the tuned circuits in the input circuits 2 and of the frequency-selective amplifier 3. By an "image frequency" is meant the carrier frequency $f_{ss}$ of received electromagnetic waves which is related to the carrier frequency $f_g$ of the auxiliary electromagnetic waves generated by the local osillator 5 and to the intermediate carrier frequency $f_i$ of the converted electromagnetic waves as $f_{ss} = f_g - f_i$. The term "reception combination frequencies " $f_{smn}$ is used herein to denote the carrier frequencies of the electromagnetic waves at the input of the superheterodyne receiver which are related to the carrier frequency $f_g$ of auxiliary electromagnetic waves and to the intermediate carrier frequency $f_i$ as $f_{smn} \pm (f_i \mp m_1 f_g)/(\mp n)$ where $m_1$ and $n$ are integers.

This known method of converting the electromagnetic spectrum carrier frequency and the superheterodyne receiver designed to carry this method into effect have a number of serious disadvantages to be presented below.

First, a superheterodyne receiver must have a local oscillator to enable its tuning within a required frequency band. If the receiver bandwidth must be quite large or if the electromagnetic waves belong to frequency bands for which local oscillators are not yet available, the method of frequency conversion used in the known superheterodyne receivers becomes theoretically unfeasible and hence it is impossible to design superheterodyne receivers for the purpose.

Second, the presence of the image frequency $f_{ss}$ and of the reception combination frequencies $f_{smn}$ requires that the signals being received be more effectively filtered in the input circuits 2 of the superheterodyne receiver, particularly in broadband superheterodyne receivers tunable within a very wide range and accepting signals that may differ in power by more than 100 decibels.

Third, as is known the input circuits 2 of a superheterodyne receiver including microwave passband filters and filters of the frequency-selective amplifiers 3 are turned to the carrier frequency $f_s$ of electromagnetic waves to be converted, while the local oscillator operates at the carrier frequency $f_g$ of auxiliary electromagnetic waves which differs from the frequency $f_s$ of the electromagnetic waves by the value of the intermediate carrier frequency $f_i$. This difference between the carrier frequency $f_g$ of the local oscillator 5 and the carrier frequency $f_s$ of the signals being received makes it difficult to effect ganged tuning of the aforementioned input circuits 2, the frequency-selective amplifiers 3 and the local oscillator 5. This ganged tuning is particularly difficult to achieve in superheterodyne panoramic measurement microwave receivers that have to be tuned in a very broad range of operating frequencies.

Fourth, the frequencies and phases of the spectral components of the converted electromagnetic waves, i.e. the outputs of the mixer 4 of the superheterodyne receiver, are related functionally to the frequencies and phases of the spectral components of the received electromagnetic waves, i.e. to the inputs of the mixer 4. In case the signals subject to conversion are almost monochrome or have very narrow bands this functional relationship makes it rather difficult to obtain the sensitivity which is theoretically attainable in known superheterodyne receivers with respect to such signals. The main reason due to which the theoretically feasible sensitivity is impossible to obtain is that the carrier frequency $f_s$ of the electromagnetic signals to be converted and the carrier frequency $f_g$ of the auxiliary electromagnetic-wave generated by the tunable local oscillator 5 are practically always unstable with time. This instability requires that the amplification band of the intermediate-frequency amplifier 6 of the electromagnetic energy receiver be broader than the band required for reception of narrow-band signals. In practice, the amplification band of the intermediate-frequency amplifier 6 designed so as to take into account the instability of the frequencies $f_s$ and $f_g$ in case the system receives monochrome or quite narrow-band signals will be several orders of magnitude higher than the band required for these signals, which degrades the theoretically attainable sensitivity of the superheterodyne receiver by more than an order of magnitude.

SUMMARY OF THE INVENTION

The object of the present invention is to provide a method for converting the carrier frequency in a spectrum of electromagnetic waves whereby the carrier frequency of converted electromagnetic waves would be independent of the frequency of auxiliary electromagnetic waves and, correspondingly, to provide an electromagnetic energy receiver carrying the proposed method into effect which would comprise a local oscillator generating auxiliary electromagnetic waves at a carrier frequency invariable with time or which would not have a local oscillator whatsoever (provided the receiver is frequency-selective).

This object is achieved by means of developing a method for converting the carrier frequency of a spectrum of electromagnetic waves in an electromagnetic energy receiver, having a converter with the input thereof receiving electromagnetic waves to be converted and the output producing converted electromagnetic waves, the converter containing at least one semiconductor element with the electromagnetic characteristics depending on the intensity, polarization and frequency of the incoming electromagnetic waves setting up the field that where upon this element wherein, according to the invention, the incoming electromagnetic waves are subjected to auxiliary power modulation so that the frequency spectrum, polarization and intensity of the field associated with the electromagnetic waves that have underwent auxiliary modulation determine the magnitudes and the directions of the magnetic and-/or electric moments, conductance and impedance of the semiconductor element in the converter in such a way that the carrier frequency in every region of the frequency spectrum of the converted electromagnetic waves becomes a multiple of the frequency of the auxiliary power modulation of the incoming electromagnetic waves.

Preferably, the semiconductor element of the converter is placed in a constant magnetic and/or constant electric field. In this case the magnitude and the direction of the field intensity vector produce an additional effect on the magnitudes and directions of the magnetic and/or electric moments, conductance an impedance of the semiconductor, element.

It is also preferable that at least one semiconductor element of the receiver converter is subjected to the effect of an auxiliary electromagnetic field, the auxiliary power modulation of the received electromagnetic waves being produced by the field associated with said auxiliary electromagnetic waves. In this case, the frequency, a polarization and intensity of the field of the auxiliary electromagnetic waves produce an additional effect on the magnitude and directions of the magnetic-/and/or electric moments, the conductance and the impedance of the semiconductor element, due to which the carrier frequency in every region of the converted electromagnetic wave spectrum becomes a multiple of the carrier frequency of these auxiliary electromagnetic waves determining the frequency of auxiliary power modulation of the electromagnetic waves to be converted.

When it is necessary to convert electromagnetic waves whose carrier frequency varies periodically with time, the auxiliary power modulation of the electromagnetic waves to be converted is provided by utilizing the resonance performance of the resistive component of the converter impedance and the periodic time variations of the carrier frequency of the electromagnetic waves to be converted, due to which the carrier frequency is every region of the converted electromagnetic spectrum becomes a multiple of the rate of periodic time variations of the electromagnetic wave carrier frequency which determines the frequency of the auxiliary power modulation applied to the electromagnetic waves to be converted.

Auxiliary power modulation of the electromagnetic waves to be converted can be provided by selecting the amplitude and frequency of the auxiliary electromagnetic waves so that the difference between the resonance frequency of the resistive component of the converter impedance and the time-varying carrier frequency of the incoming electromagnetic waves changes periodically with time, due to which the carrier frequency in every region of the converted electromagnetic spectrum becomes a multiple of the rate of change of the aforementioned difference that determines the frequency of the auxiliary power modulation applied to the electromagnetic waves to be converted.

In the low-, high- and superhigh-frequency bands of incoming electromagnetic waves the semiconductor element may be operated so that the reactive or resistive component of its impedance depends linearly on the field of the auxiliary electromagnetic waves acting upon this element while the frequency, polarization and intensity of the field associated with the auxiliary electromagnetic waves are functions of this linear relationship range.

It is advisable that for a microwave frequency band of the incoming electromagnetic waves the semiconductor element in the converter be a ferrite operating as a ferromagnetic resonator.

The object is also achieved in that there is provided an electromagnetic energy receiver to carry into effect the proposed method of converting the electromagnetic spectrum carrier frequency comprising: an input device which contains a waveguide-feeder system, input circuits and a frequency-selective amplifier connected in series; an output device which contains an intermediate-frequency amplifier, peak detector, audio amplifier and an output unit connected in series relation, the output device being connected to the input device via at least one converter which contains at least one semiconductor element; wherein, according to the invention, every converter is made in the form of an input resonant system and an output resonant system intercoupled through a spatial detection system, while the input resonant system contains said semiconductor element, said input resonant system being tuned to its own frequency, determining the time-average value of the carrier frequency of the electromagnetic waves to be converted, and the output resonant system is tuned to a frequency which is a multiple of the time-constant frequency of the auxiliary power modulation of the incoming electromagnetic waves.

It is advisable that the receiver contain a source of a constant magnetic and/or constant electric field with at least one semiconductor element of the converter input resonant system placed therein.

The receiver may comprise a local oscillator to generate the aforementioned auxiliary electromagnetic waves at a timeconstant carrier frequency, while the above input resonant system of the converter has an auxiliary input to which this local oscillator is connected. The magnitudes and the directions of the magnetic and/or electric moments, the conductance and the impedance of at least one semiconductor element in the input resonant system are determined additionally by the frequency, polarization and intensity of the field set up by the auxiliary electromagnetic waves generated by the local oscillator, while the output resonant system is tuned to its time-constant natural frequency which is a multiple of the carrier frequency of the auxiliary electromagnetic waves generated by the local oscillator.

Besides, the receiver may contain a means to vary the intensity of the constant magnetic and/or constant electric field in which the semiconductor element of the input resonant system is situated. In this case, variation of the frequency to which the aforementioned input resonant system is tuned is additionally determined by variations of the intensity of the constant magnetic and/or constant electric field. The receiver may also comprise an additional oscillator generating auxiliary electromagnetic waves. The output resonant system of the converter will then contain a separate semiconductor element and will have an additional input connecting the above additional oscillator, the frequency of the additional electromagnetic waves being equal to the rate of change of the frequency with which the carrier frequency of the electromagnetic waves to be converted is varied, and the tuning frequency of the converter output resonant system varying with time at a rate equal to the frequency of the additional electromagnetic waves.

In addition to the above semiconductor element coupled to the auxiliary input and made in the form of a ferrite operating as a ferromagnetic resonator, the converter input resonant system may also contain a waveguide. In this case, the output resonant system of the converter contains an output resonant circuit comprising a conductor with one section thereof located in the immediate vicinity of the semiconductor element of the input resonant system, a tuned LC-circuit to which the terminals of this conductor are connected and an additional filter connected to the LC-circuit, while the spatial detection system of the converter includes the semiconductor element of the input resonant system and one of the sections of the output resonant system conductor which is disposed in the immediate vicinity of this semiconductor element.

Apart from at least one semiconductor element, the input resonant system of the converter may also contain a distributed-parameter circuit. In this case the output resonant system of the converter is designed as another distributed-parameter circuit, while the spatial detection system of the converter comprises at least one semiconductor element of the input resonant system and a section of the other distributed-parameter circuit of the output resonant system, the above section being disposed in the immediate vicinity of this semiconductor element.

Preferably, the distributed-parameter circuit of the input resonant system is made as a cavity resonator and an other distributed-parameter circuit of the output resonant system is also a cavity resonator.

Another distributed-parameter circuit of the output resonant system may be a short-circuited coaxial section.

The input resonant system and the spatial detection system of the converter may be designed in the form of a common waveguide with two partitions that divide it into an input section, a resonator and an output section, the semiconductor element which is a ferrite operating as a ferromagnetic resonator being located in a coupling slot made in the first partition and coupled with the auxiliary input of the input resonant system; the resonator comprises another semiconductor element which is a varactor diode connected to an oscillatory RC-circuit outside the waveguide and, via an adjustable resistor, to a source of a constant electric field. The output section of the waveguide contains an additional semiconductor element which is a crystal detector connected to another RC-circuit disposed outside the waveguide and, via another variable resistor, to another source of a constant electric field. This additional semiconductor element is preceded by a directional coupler connected to the output waveguide section so that the electromagnetic power produced by another additional generator which passes through the directional coupler is reflected from the second partition to be directed to the additional semiconductor element. The output resonant system is designed as another oscillatory LC-circuit which is connected, via a capacitor, to the additional semiconductor element.

The input section of the waveguide may be designed as an independent waveguide containing another additional semiconductor element made in the form of a crystal detector mounted in series relation after the above semiconductor element and connected to its local oscillatory RC-circuit located outside this waveguide, the resonator and the output section of the waveguide making up another independent waveguide with another semiconductor element connected to the above other additional semiconductor element via a capacitor.

It is feasible that the resonator contains at least one capacitance probe mounted in its wall between the first semiconductor element and the second semiconductor element, while the semiconductor element of the input resonant system is coupled with its auxiliary input through the input resonant circuit comprising a conductor one section of which is located in the immediate vicinity of this semiconductor element, and an oscillatory LC-circuit to which the leads of this conductor are connected, the terminals of the capacitor C forming the above auxiliary input of the input resonant system.

Such an arrangement makes it possible to considerably simplify the design of electromagnetic energy receivers tunable within the operating frequency range as well as to broaden the given operating frequency range appreciably.

Below are given definitions and explanations of some new terms used in the description of the proposed invention.

1. Spatial detection is the establishment of the time dependence of the magnitude of electromagnetic energy accumulated in any electromagnetic wave resonator. As a rule, such detection is accomplished outside this resonator. The above time dependence may be established, for example, by determining the time dependence of the value of electromagnetic energy retransmitted by a given resonator in steady-state and quasi-steady-state conditions of electromagnetic oscillations in the resonator, or, to cite another example, by eliminating a change in the magnitude of the axial magnetic component in a ferrite sphere in the site of ferromagnetic resonance in which energy is accumulated. Both cases are used in the embodiments to be described below for carrying into effect the proposed method of converting the carrier frequency of an incoming electromagnetic wave spectrum.

2. A spatial detection system is an assemblage of devices and elements designed to carry out spatial detection.

3. Auxiliary power modulation of incoming electromagnetic waves is a periodic time change of the magnitude of the incoming electromagnetic energy accumulated in the resonator.

4. A semiconductor element is an element made from any solid, liquid or gaseous material (semiconductor) possessing finite conductivity for electric current and comprising magnetic and electric dipole moments. Thus, the term "semiconductor" is used in its physical meaning and implies any substance which by virtue of its properties cannot be classified as a conductor, i.e. a material exhibiting conductivity for electric current. In the convertors described below semiconductor elements are crystal detectors, varactor diodes and magnetic semiconductors ferrites. It should be pointed out that ferrites cannot be placed in the group of magnetic-dielectrics, because magnetic-dielectrics are usually defined as a mechanical mixture of magnetic conductors and dielectrics. Besides, semiconductors in the context also cover, for instance, segneto-electrics and dielectrics used in practical radioelectronic equipment which do not exhibit zero conductivity for electric current.

BRIEF DESCRIPTION OF THE DRAWINGS

The present invention will be better understood from the following description of its embodiments given by way of example and with reference to the accompanying drawings wherein:

FIG. 12 illustrates a frequency spectrum of amplitude-modulated electromagnetic pulses at the A-input of the converter according to the invention;

FIG. 13 shows regions of the frequency spectrum of converted electromagnetic waves at the D-output of the converter when its A-input receives amplitude-modulated electromagnetic pulses to be converted, while its auxiliary B-input is fed with auxiliary electromagnetic waves, according to the invention;

DETAILED DESCRIPTION

Figure 1:
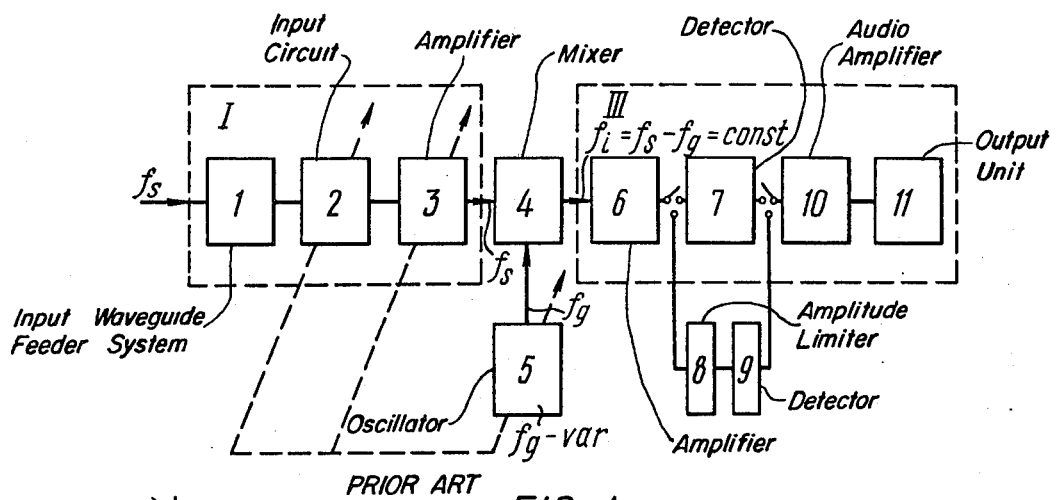
FIG. 1 is a block diagram of a known superheterodyne receiver.

The proposed method of converting the electromagnetic spectrum carrier frequency $f_s$ is carried into effect in an electromagnetic energy receiver comprising an input device I (FIG. 2), a converter 12 having at least one semiconductor element II, and an output device III. The converter 12 is provided with inputs A, B and C and an output D.

The A-input which receives incoming electromagnetic waves at a carrier frequency $f_s$ is connected to the output of the input device I. The auxiliary B-input accepting auxiliary electromagnetic waves at a constant carrier frequency $f_{gc}$ is connected to a local oscillator 13 (used to generate these auxiliary electromagnetic waves) through a filter 14. The D-output of the converter 12 which gives out converted electromagnetic waves is connected to the output device III. The system comprises at least one semiconductor element II whose electromagnetic parameters depend on the intensity, polarization and frequency of the electromagnetic waves which are applied to the A-input of the converter 12, and also on the intensity, polarization and frequency of auxiliary electromagnetic waves applied to the auxiliary B-input of the same converter. The receiver may include a means for producing a constant magnetic and/or constant electric field with the intensity variable within a range required for operation, of the receiver. If this is the case, at least one semiconductor element II is placed in this field and subjected to the effect of incoming electromagnetic waves and, in some cases, to the effect of auxiliary electromagnetic waves the auxiliary electromagnetic waves being required only when conventional amplitude-modulated electromagnetic waves are converted.

In the absence of either auxiliary electromagnetic waves or incoming electromagnetic waves, the intensity and the direction of the constant magnetic and/or constant electric field will determine the magnitudes and directions of the magnetic and/or electric moments as well as the conductance and corresponding impedance of at least one semiconductor element II, thus determining, in particular, the resonant frequency $f_A$ (FIG. 3) of tuning the resultant impedance $Z_A$ as seen looking into its A-input of the converter 12 receiving the electromagnetic waves to be converted. The bandwidth $\Delta F_A$ within which the resistive component $R_A$ of this impedance $Z_A$ will vary as a function of the frequency $f_s$ of the electromagnetic waves to be converted is selected so as to make it approximately equal to the width of the frequency spectrum of the intelligence — carrying electromagnetic waves to be converted.

To implement the proposed method of converting the carrier frequency $f_s$ of the electromagnetic spectrum it is required that the power of the received electromagnetic waves stored in the input resonant system of the converter 12, in particular in the material of the semiconductor II, be additionally periodically varied with time. This additional time variation which hereinafter will be called auxiliary power modulation of incoming electromagnetic waves is provided by applying either auxiliary frequency modulation or auxiliary amplitude modulation which is inherent in the electromagnetic waves to be converted and which serves as auxiliary power modulation of these waves stored in the input resonant system of the converter 12. This auxiliary power of received electromagnetic waves stored in the input system is achieved due to the fact that the difference $\Delta f_{AS}$ $= f_A - f_S$ at the A-input of the converter 12, i.e. the difference between the resonance frequency $f_A$ (FIG. 3) of the converter impedance $Z_A$ as seen looking into its A-input and the carrier frequency $f_S$ of the electromagnetic waves to be converted, is periodically varied with time. In this case the frequency $F_{AS}$ at which the difference $\Delta f_{AS}$ changes with time (FIG. 4) remains constant and can assume different fixed values. In the description that follows the rate of change $F_{AS}$ will be termed the reference time rate of change of the difference $\Delta f_{AS}$.

Figure 2:
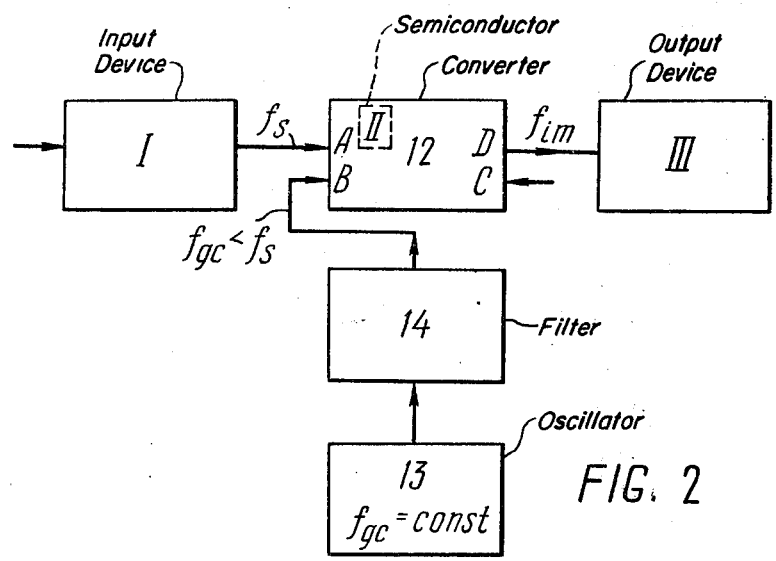
FIG. 2 is a block diagram of an arrangement which, according to the invention, converts the carrier frequency of electromagnetic waves into another carrier frequency by means of applying auxiliary electromagnetic waves generated by a local oscillator, to a converter.

The auxiliary power modulation of the electromagnetic waves in the input resonant system of the converter 12 can also be effected with the aid of a conventional amplitude modulator mounted either in the transmitter or before the receiver under consideration (FIG. 2). This receiver will produce a required modulation at a frequency which is a multiple (also meaning equal to) of the frequency $f_{gc}$ of the auxiliary electromagnetic waves which in this particular case control operation of the modulator. This method of ensuring auxiliary power modulation of the electromagnetic waves to be converted can be employed in case when it is required that bandwidth $\Delta F_A$ (FIG. 3) within which the resistive component $R_A$ of the converter impedance $Z_A$ as seen looking into the A-input is varying be as broad as possible (or correspondingly, in case it is impossible to make this bandwidth sufficiently narrow).

There are three ways of varying the value of $\Delta f_{AS} = f_A - f_S$ (FIG. 4) which is the difference between the frequency $f_A$ of tuning the converter impedance $Z_A$ as seen looking into the A-input and the carrier frequency $f_S$ of the electromagnetic waves to be converted.

Figure 5:
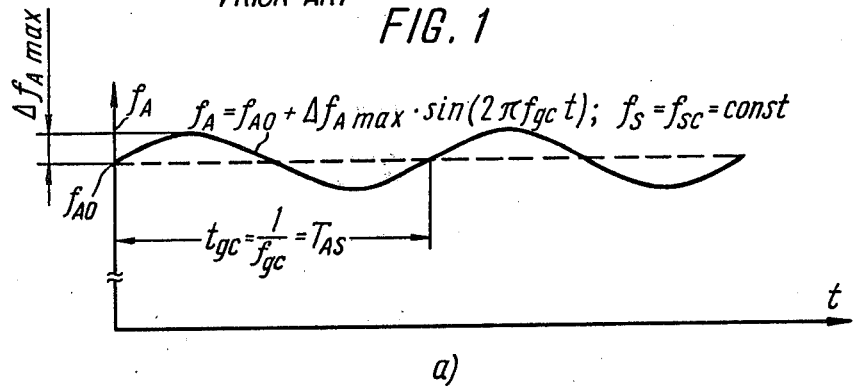
FIG. 5a is the time-response curve of the resonance frequency $f_A$ of tuning the converter impedance $Z_A$ as seen looking into the A-input, according to the invention.
FIG. 5b is the time-response curve of the carrier frequency $f_g$ of the electromagnetic waves to be converted, according to the invention.
Figure 5:
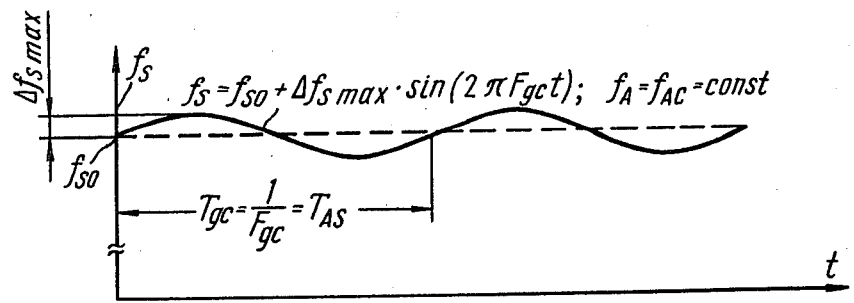

First, periodic variation of the difference $\Delta f_{AS}$ at the reference rate $F_{AS}$ can be obtained with the carrier $f_S$ of the received electromagnetic spectrum being constant, by periodically varying the resonance frequency $f_A$ (FIGS. 3, 5a) of the impedance $Z_A$ of the converter 12. The requirement that the carrier $f_S$ of the electromagnetic waves to be converted should remain unchanged with time is met in this case, i.e. $f_S = f_{SC} =$ const., where $f_{SC}$ denotes any time-constant value of the carrier frequency $f_S$. Second, periodic variation of the difference $\Delta f_{AS}$ at the reference rate $F_{AS}$ which is required to carry the proposed invention into effect, is attainable by periodically varying with time the carrier frequency $f_S$ (FIG. 5b) of the electromagnetic waves to be converted. Such variation can be effected either in the transmitter or right before the input of the receiver under consideration (FIG. 2). This second case satisfies the requirement that the resonance frequency $f_A$ (FIG. 3) of the converter impedance $Z_A$ as seen looking into the A-input should remain unchanged, i.e. $f_A = f_{AC} =$ const. where $f_{AC}$ denotes any value of the frequency $f_A$ of tuning the impedance $Z_A$ of the converter 12 as seen looking into the A-input. Finally, in the last of the three cases under consideration both the resonance frequency $f_A$ of the impedance $Z_A$ of the converter 12 as seen looking into the A-input and the resonance frequency $f_S$ of the incoming electromagnetic waves undergo periodic changes with time. Consider each of the three cases in greater detail.

In the first of these three cases, i.e. when $f_S = f_{SC} =$ const. the periodic time dependence of the resonance frequency $f_A$ of the impedance $Z_A$ of the converter 12 (FIG. 2) is realized using periodic auxiliary electromagnetic waves fed, as was mentioned above, to the auxiliary B-input of the converter 12. In this case the maximum amplitude $\Delta f_{AS\,max}$ (FIG. 4) of the periodic time change of $\Delta f_{AS}$ equals to the maximum amplitude $\Delta f_A$ $_{max}$ (FIG. 5a) of the periodic time change of the resonance frequency $f_A$ of the converter impedance $Z_A$ as seen looking into the A-input and is determined by the maximum amplitude of the auxiliary electromagnetic waves. Here, the reference time rate $F_{AS}$ (FIG. 4) of change of $\Delta f_{AS}$ is identically equal to the time-constant value of the carrier $f_{gc}$ (FIG. 5a) of these auxiliary electromagnetic waves whose period is $t_{gc} = (1/f_{gc})$. If the resonance frequency $f_A$ of tuning the impedance $Z_A$ of the converter 12 as seen looking into the A-input varies sinusoidally, the first case under consideration will involve the following relations $$f_s = f_{sc} = \text{const, and } f_A(t) = f_{AO} + \Delta f_{A\,max}/\sin(2\pi f_{gc}t) + \rho_A/,$$

where $\rho_A$ is the arbitrary initial phase with which the resonance frequency $f_A$ of the impedance $Z_A$ of the converter 12 as seen looking into the A-input starts varying with time. If no electromagnetic waves to be converted are applied to the A-input of the converter 12 (FIG. 2) the present device, when viewed from the auxiliary B-input, should in the optimum case be linear in the sense that it should not multiply the carrier frequency $f_{gc}$ of the auxiliary electromagnetic waves within the area between its auxiliary B-input and the D-output.

If the A-input of the converter 12 receives amplitude-modulated electromagnetic waves to be converted the transfer ratio of the auxiliary electromagnetic waves between the auxiliary B-input and the D-output of the converter 12 will change during the time these waves are present at the A-input (as compared with the case when these electromagnetic waves are absent at the A-input of the converter). The value of this transfer ratio variation is made proportional to the amplitude or the power of the amplitude-modulated electromagnetic waves fed to the A-input. Besides, this arrangement makes it possible to meet the requirement that the carrier $f_{gc}$ of the auxiliary electromagnetic waves is five to ten or more times as high as the maximum frequency in the intelligence-carrying video-spectrum used for the amplitude modulation of the received electromagnetic waves.

The second of the three cases under consideration, when the resonance frequency $f_A$ (FIG. 5c) of the impedance $Z_A$ (converter 12) as seen looking into the A-input is constant in time, i.e. when $F_A = f_{AC} =$ const., implies that the carrier frequency $f_s$ of the electromagnetic waves to be converted is made timedependent with period $T_{gs} = (1/F_{gc}) = T_{AS}$, where $F_{gc}$ is tge sub-carrier frequency of the rate of change of the given carrier $f_s$. As has been noted above, this is accomplished before the waves to be converted arrive at the input of the receiver (FIG. 2). The required amplitude-frequency-modulated waves can be obtained, for instance, by varying the carrier frequency $f_s$ of the amplitude-modulated electromagnetic waves to be converted just before they are applied to the receiver input (FIG. 2). To do this, the amplitude-modulated electromagnetic waves from the antenna (not shown in the drawings) is fed, for instance, to a ferrite phase shifter that produces a periodically-varying phase lead in the signals passing through it. Such phase shifters are described by a number of authors, i.e. Fox A. PIRE, 1947, v. 35, No. 12, p. 1489; Cacheris I. PIRE, 1954, v. 42, No. 8; p. 1242; Mikaelyan A. "Teoriya i primeneniye ferritov na sverkhvysokikh chastotakh", Gosenergoizdat, Moscow, 1963, pp. 640–648. Since the phase lead periodically varies with time, the ferrite phase shifter output produces a time-varying carrier frequency of the waves that pass through the this phase shifter. In the optimum case the maximum amplitude $\Delta f_{s\,max}$ of the $f_s$ carrier rate of change at the output of this phase shifter should be approximately equal to the bandwidth $\Delta F_A$ within which the resistive component $R_A$ of the impedance $Z_A$ of the converter 12 is varying. The amplitude-frequency-modulated electromagnetic waves obtained in this way having a required rate of change of the carrier frequency $f_s$ are applied from the output of the phase shifter to the receiver (FIG. 2) where the local oscillator 13 and the filter 14 are cut off. As a result, the second of the three cases under consideration in which the difference $\Delta f_{As}$ (FIG. 4) must periodically vary with time by a sine law, which is required to realize the proposed invention, is characterized by the following relations $F_A = f_{AC} =$ const. and $f_s(t) = f_{so} + \Delta f_{s\,max}\sin(2\pi F_{gc}t + \psi_s)$, where $\psi_s$ is the arbitrary initial phase of the time change in the carrier frequency $f_s$ (FIG. 5c) to be converted, and $f_s$ is the time-average of the carrier frequency $f_s$ of the received electromagnetic waves.

The third case when both the resonance frequency $f_A$ of the impedance $Z_A$ (converter 12) as seen looking into the A-input, and the carrier frequency $f_s$ of the received waves depend on time, is essentially a combination of the first two cases. Selection of the time dependence of the frequencies $f_A$ and $f_s$ is guided by the above requirement that the reference time rate $F_{AS}$ of the periodic change of the difference $\Delta f_{AS}$ (FIG. 4) be constant. Thus, the time dependence of the resonance frequency $f_A$ of tuning the impedance $Z_A$ (converter 12) as seen looking into the A-input and, that of the carrier frequency $f_s$ of the waves to be converted can be written in this third case respectively, as:

$$f_A(t) = f_{A0} + 3\Delta f_{A3} \cdot \sin(2\pi f_{gc}t), \text{ and}$$

$$f_s(t) = f_{so} + 4\Delta f_{S4} \cdot \sin^3(2\pi F_{gc}t).$$

Then, with $f_{gc} = F_{gc} =$ const. and $\Delta f_{A3} = \Delta f_{S4}$ we have $$\Delta f_{AS}(t) = f_A(t) - f_s(t) = (f_{A0} - f_{so}) + \Delta f_{A3} \cdot [3\sin(2\pi f_{gc}t) - 4\sin^3(2\pi f_{gc}t)].$$

Now if we make the average value $f_{A0}$ of the resonance frequency $f_A$ equal to the average value $f_{so}$ of the carrier frequency $f_s$ of the received electromagnetic waves by tuning the impedance $Z_A$ (converter 12) as seen looking into the A-input i.e. if we make $f_{A0} = f_{so} =$ const., in accordance with the known trigonometrical formula $3\sin\alpha - 4\sin^3\alpha = \sin 3\alpha$, we obtain $$\Delta f_{AS}(t) = \Delta f_{A3} \cdot \sin(2\pi F_{As}t),$$

where the reference time rate $F_{AS}$ of change of the difference $\Delta f_{AS}$ is defined by the relation $F_{AS} = 3 f_{gc} = F_{gc} =$ const.

The reference time rate $F_{AS}$ of change of the difference $\Delta f_{AS}$ in the above three cases is determined either by the carrier frequency $f_{gc}$ of the auxiliary electromagnetic waves or by the subcarrier $F_{gc}$ of the rate of change of the carrier frequency $f_s$ of the received waves, or by both the carrier frequency $f_{gc}$ and the subcarrier frequency $F_{gc}$. It should be borne in mind that ultimately, these three cases are intended to impose auxiliary modulation upon the power of the received electromagnetic waves or, to put it more precisely, to periodically vary in time the energy of the waves which is stored in the input resonant system of the converter 12.

Thus, in concrete cases the term "reference time rate $F_{AS}$ of change of the difference $f_{AS}$" will mean either the carrier frequency $f_{gc}$ of the auxiliary electromagnetic waves or the subcarrier frequency $F_{gc}$ of the variation of the carrier frequency $f_s$ of the received electromagnetic waves, or a quantity which is determined by both the auxiliary wave carrier frequency $f_{gc}$ and the subcarrier frequency $F_{gc}$ of the variation of the carrier $f_s$ of the received electromagnetic waves.

After auxiliary modulation is imposed on the energy of the electromagnetic waves to be converted in the input resonant system of the converter 12 (FIG. 2) spatial detection is started. The latter uses variations of the electromagnetic parameters of the semiconductor element II. These variations depend on the magnitude of the energy stored in the input resonant system of the converter 12. Suppose that no auxiliary modulation is imposed upon the electromagnetic waves to be converted. Then, an increase of voltage across a certain RC-circuit, for instance, obtained through spatial detection under steady-state conditions of the electromagnetic waves in the input resonant system of the converter 12 will be determined by the magnitude of the electromagnetic energy stored in this input resonant system. The auxiliary modulation of the energy under consideration causes auxiliary amplitude modulation of the voltage across said RC-circuit. The frequency of this auxiliary modulation is identically equal to the frequency of the auxiliary power modulation applied to the received electromagnetic waves. Using the aforementioned voltage rise across the RC-circuit obtained through spatial detection, it is possible to vary the electromagnetic parameters, for instance, of the semiconductor element II with the help of which this voltage has been obtained. Due to auxiliary amplitude modulation of this voltage rise, electromagnetic characteristics of the above semiconductor element II can vary with time at a rate equal to the frequency of the auxiliary power modulation of the received electromagnetic waves, in other words, they can vary with a frequency which is a multiple of the reference time rate $F_{AS}$ of change of the above difference $\Delta f_{AS}$. Variations of the electromagnetic parameters of the semiconductor element II are used to obtain time-dependent variations in the impedance of the resonant system for electromagnetic waves generated by the additional generator of the spatial detection system. In another instance, when the spatial detection process involves an increase in the magnetization of the semiconductor element II, such as a ferrite, the time-dependent variation of this increase at auxiliary power modulation applied in the ferrite induces an alternating electrical voltage in the loops of a conductor arranged so that their plane is normal to the respective time-varying magnetic field. The frequency of the alternating voltage set up across the aforementioned conductor loops is equal to the frequency of the auxiliary power modulation applied to the received electromagnetic waves. On account of the resonance shape of the resistive component of the impedance as seen looking into the A-input of the converter 12 this auxiliary modulation frequency is a multiple of the reference time rate $F_{AS}$ of change of the difference $\Delta f_{AS}$, while the amplitude of the alternating voltage set up across the aforementioned conductor loops in the course of spatial detection is determined by the magnitude of the received electromagnetic energy stored in the input resonant system of the converter 12 (e.g. in a ferrite) and the percentage of the auxiliary modulation applied to this energy.

The value of the intermediate carrier frequency $f_{im}$ (FIG.2) in the region of the converted electromagnetic frequency band under consideration at the D-output of the converter 12 in different concrete situations may be either a multiple of the carrier frequency $f_{gc}$ of the auxiliary electromagnetic waves fed to the auxiliary B-input of the converter, or, respectively, a multiple of the subcarrier frequency of the rate $F_{gc}$ of charge of the received electromagnetic wave carrier frequency $f_s$.

Each of said frequency bands of the converted electromagnetic spectrum has an envelope whose shape is determined by the shape of the envelope of the intelligence — carrying video spectrum. In this case the values of the intermediate carrier frequencies $f_{im}$ in the regions of the converted electromagnetic spectrum are described by the formula $f_{im} = mF_{AS}$, where $m$ is an infinite series of numbers, i.e. $m = 1,2,3,4\ldots$ The value of $m$ indicates the multiplicity index of the carrier frequency $F_{AS}$ or, which amounts to the same thing, the number of the place occupied by the selected frequency band at the D-output of the converter 12 along the frequency axis. At uneven values of $m$, i.e. when $m = 1,3,5,7,\ldots$, etc. converted electromagnetic waves will arise if the average value $f_{Ao}$(FIG. 5a) of the time-variable resonance frequency $f_A$ of the impedance $Z_A$ (converter 12) as seen looking into the A-input, deviates from the constant value of the carrier frequency $f_{SC}$ of the received electromagnetic waves or, respectively, if the time-constant resonance frequency $f_A = f_{AC}$ deviates from the average value $f_{SO}$(FIG. 5b) of the time variable carrier frequency $f_S$ of the received electromagnetic waves.

Figure 6:
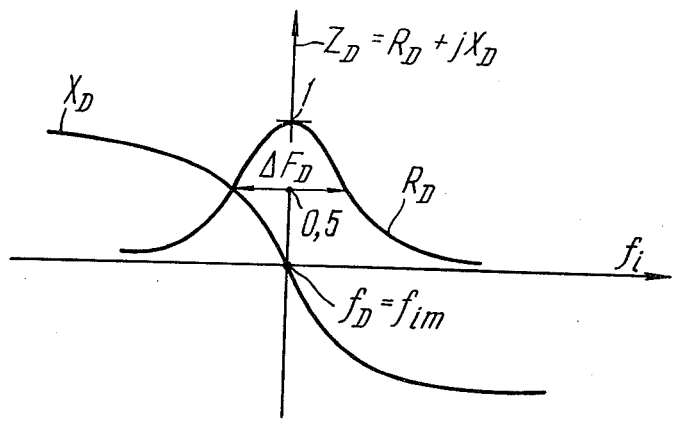
FIG. 6 shows the response curves of the resistive component $R_D$ and reactive component $X_D$ of the converter impedance $Z_D$ as seen looking into D-output for the case when no auxiliary electromagnetic waves are applied to the auxiliary B-input of the given device and no additional electromagnetic waves come to the C-input, according to the invention.

Readjustment of the converter 12 as seen looking into the A-input which results in the readjustment of the entire receiver occurs due to the change of the average value $f_{AO}$(FIG. 5a) of, respectively, the time-variable or time-constant resonance frequency $f_A$ of the impedance $Z_A$ as seen looking into the A-input of the converter 12 within the receiver operating frequency range. This change of the average value $f_{AO}$ is the result of the change in the magnitude of a constant magnetic field $\overline{H}_{AO}$ and/or a constant electric field $\overline{E}_{AO}$ applied to the semiconductor element II of the converter 12, the above magnetic and/or electric fields being, respectively, the time-constant components of the resultant magnetic field $\overline{H}_A$ and/or the resultant electric field $\overline{E}_A$ acting on this semiconductor element. Additional electromagnetic waves are furnished to the additional C-input of the converter 12 in a very particual case only, i.e. when in the course of transmitting information with the aid of electromagnetic waves, it is required to change in time the intermediate carrier frequency $f_{im}$ of the converted electromagnetic waves. These additional electromagnetic waves are applied to the C-input only if the converter 12 has one more local semiconductor element in its output resonant system. In this case, these additional electromagnetic waves with the local semiconductor element continuously provide the equation, $f_D = f_{im}$ in the time domain, i.e. make their natural resonance frequency $f_D$(FIG. 6) of the impedance $Z_D$(converter 12) as seen looking into the D-output equal to the time-varying intermediate carrier frequency $f_{im}$ of the converted electromagnetic waves. On the other hand, in most cases, when the intermediate carrier frequency $f_{im}$ is constant in time (the amount of this stability depends on the time stability of the reference rate $F_{AS}$), the natural resonance frequency $f_D$ of the impedance $Z_D$ as seen looking into the D-output of the converter 12 also remains invariable with time.

The converter 12 comprises an input resonant system 12a (FIG. 7) and an output resonant system 12b interconnected by a spatial detection system 12c. The input resonant system 12a of the converter 12 has an input A and may also have an additional input B. The output resonant system 12b of the converter 12 has an output D and may also have an input C. The spatial detection system 12c (FIG. 7) effects spatial detection of electromagnetic waves between the input resonant system 12a and the output resonant system 12b. When the semiconductor element II is, for instance a ferrite sphere, spatial detection consists in determining the magnitude of a variable magnetic field along the Z-axis (FIG. 8) which is induced by the reduced magnetic moment density $\overline{M}$ of this semiconductor element II when the procession angle $\theta$ is changed, the latter being the result of auxiliary modulation of energy accumulated in this semiconductor element II. The resultant magnetic moment density $\overline{M}(t)$ is the geometric sum of the magnetic moments of the semiconductor element II performing precessional motion about the Z-axis. The semiconductor element II is acted upon by an external constant magnetic field with intensity $\overline{H}_{AO}$ applied along the Z-axis. The projection of the magnetic moment density $\overline{M}(t)$ onto the Z-axis is the vector $\overline{M}_Z(t)$ shown in FIG. 8. The magnitude of the above variable magnetic field along the Z-axis which is set up by the time-variable vector $\overline{M}_Z(t)$ can be measured, for example, by means of some conductor turns with a surface normal to the Z-axis, or by means of a cavity or coaxial resonator oriented in an appropriate manner, or else using electromagnetic waves retransmitted by the ferrite.

For carrying into effect the proposed frequency conversion method, motivation will be given below for certain requirements which must be met by the converter 12, local oscillator 13 and the filter 14 of the electromagnetic energy receiver (FIG. 2). These requirements will be demonstrated in a mode of operation when only auxiliary electromagnetic waves are applied to the auxiliary B-input of the converter 12, while the A-input receives no electromagnetic waves, in other words, when the amplitudes of all the components of the electromagnetic frequency spectrum at the A-input of the converter 12 are zero. On this case, no information to be received is supplied and, therefore, no signals must appear at the D-output of the converter 12. Since in conformity with the proposed conversion method the intermediate carrier frequency of the converted electromagnetic waves is a multiple of the time-constant frequency $f_{gc}$ of the auxiliary electromagnetic oscillations generated by the receiver local oscillator 13, information at the D-output of the converter 12 must be amplitude-dependent on the time of electromagnetic waves at the D-output. It follows, therefore, that the amplitude of the electromagnetic signals at the D-output of the converter 12 must be either identically equal to zero or be constant in time, if the A-input receives no electromagnetic waves. The amplitudes of the electromagnetic waves may change under the effect of noise, and for this reason it is preferable that at any time instant the amplitude of electromagnetic signals at the D-output of the converter 12 is zero provided there are no electromagnetic waves applied to its A-input. This requirement implies, in the first place, that spurious power of auxiliary electromagnetic waves passing directly from the auxiliary B-input to the D-output must be suppressed as much as possible. Direct transmission of spurious power from the B-input to the D-output occurs when $m = 1$. From the same requirement it follows that when the A-input of the converter 12 receives no waves to be converted, receiver operation must be linear for auxiliary electromagnetic waves at the auxiliary B-input. Stated another way, if no electromagnetic waves are delivered to the A-input of the converter 12, the frequency of the auxiliary electromagnetic waves applied to the auxiliary B-input of the converter 12 must not undergo multiplication. Essentially, linear operation of the converter 12 at the auxiliary B-input in case when the A-input receives no electromagnetic waves results in all the amplitudes of the electromagnetic waves at the D-output being zero as corresponds to $m = 2,3,4, \ldots$ For this reason, in some cases it would be advantageous to convert the carrier frequency $f_S$ of the electromagnetic waves coming to the converter, into the intermediate carrier frequency $f_{im} = mF_{AS}$ of the converted electromagnetic waves at $m = 2,4,6 \ldots$, where $F_{AS}$ is the reference time rate of variations of the above difference $\Delta f_{AS}$.

In order that no electromagnetic waves could appear at the D-output of the converter if electromagnetic waves do not come to the A-input, a certain requirement is also imposed on the local oscillator 13. This requirement which is to be applied in some of the cases described below is as follows. In these cases, for carrying into effect the proposed method of converting the carrier frequency of electromagnetic waves, only such a local oscillator 13 must be selected as generates electromagnetic oscillations with as pure frequency spectrum as possible; in other words, the amplitudes of all the frequency spectrum components generated by the local oscillator 13 must be as close to zero as possible, with the exception of the fundamental component of this spectrum whose frequency is $f_{gc}$. If it is required, therefore, to obtain auxiliary electromagnetic pulses, the selected local oscillator 13 must generate electromagnetic oscillations practically with the frequency spectrum in the vicinity of the carrier frequency $f_{gc}$ of auxiliary electromagnetic waves and, consequently, provide the smallest possible amplitudes of all the other components of the spectrum it generates. As practically no local oscillators used provide ideally pure frequency spectra, in such cases the filter 14 (FIG. 2) is connected between the local oscillator 13 and the converter 12 with a view to fully meeting the requirement of the pure spectrum of the auxiliary electromagnetic wave frequencies. The filter 14 is responsible for passing only electromagnetic signals at the frequency $f_{gc}$ and suppressing all other spurious spectral components generated by the local oscillator 13. The bandwidth of the filter 14 is made as small as possible, the minimum bandwidth being limited by time instability of the carrier frequency $f_{gc}$ of the auxiliary electromagnetic oscillations. When auxiliary electromagnetic oscillations are of pulse nature, the selection of the bandwidth of the filter 14 is guided, apart from this time instability, also by the permissible transient time of the amplitude of the auxiliary electromagnetic signals at the output of the filter 14. The magnitude of this permissible transient time depends on a required time between the beginning of an auxiliary electromagnetic pulse at the auxiliary B-input of the converter 12 and delivery of the electromagnetic wave to be converted to the A-input of the converter 12. If the local oscillator operates in a continuous generation mode and produces a pure monochrome frequency spectrum without harmonics, the filter 14 will be required for carrying into effect the proposed method of converting the carrier frequency of electromagnetic waves.

Figure 9:
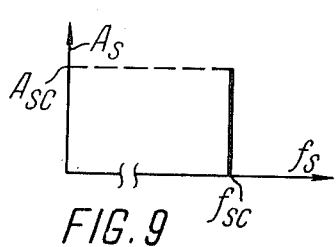
FIG. 9 illustrates a frequency spectrum of monochrome electromagnetic waves to be converted as applied to the A-input of the converter, according to the invention.

Consider now some specific features of converting the carrier frequency of the electromagnetic spectrum in the converter 12 if electromagnetic waves are applied to its A-input. The first case to be considered is conversion of the carrier frequency $f_S$ of monochrome electromagnetic signals with a constant amplitude and oscillation frequency. Let us apply monochrome electromagnetic signals with the time-constant amplitude $A_{SC}$ and the time-constant frequency $f_{SC}$ (FIG. 9) to the A-input of the converter 12. Let us also apply auxiliary electromagnetic signals with the time-constant carrier frequency $f_{gc}$ and the time-constant amplitude $B_{gc}$ (FIG. 10) to the auxiliary B-input of this converter. The electromagnetic waves delivered to the converter 12 (FIG. 2 and FIG. 7) make the section of the converter 12 between the auxiliary B-input and the D-output nonlinear for auxiliary electromagnetic oscillation. This nonlinearity must be proportional to the amplitude $A_{SC}$ (FIG. 9) or to the power of the electromagnetic waves, to be converted. As a result, the D-output of the converter 12 gives out a continuous converted electromagnetic wave containing a sequential row of components in the $f_{im}$ intermediate frequency spectrum (see FIG. II). Each of these spectrum regions has its own carrier frequency characteristics of this particular region. In a general case, the magnitude of the carrier frequency is defined as $f_{im} = mf_{gc}$, where $m = 1,2,3,4, \ldots$ etc. indicates the sequential number of a particular region in the intermediate frequency spectrum of the converted electromagnetic waves. The time-constant amplitudes $C_{g1}$, $C_{g2}$, $C_{g4}$, $C_{g6}$, etc. of the electromagnetic waves each of which refers to each particular region of the intermediate frequency spectrum are found from the equation $C_{gm} = \alpha_m \cdot A_{SC}$. Substituting various values of $m$ into this equation, we shall obtain for the amplitude $C_{gm}$ the following relations: $C_{g1} = \alpha_1 A_{SC}$, $C_{g2} = \alpha_2 A_{SC}$, $C_{g3} = \alpha_3 A_{SC}$, $C_{g4} = \alpha_4 A_{SC}$, etc. The proportionality factors in these expressions may either be constant or depend on the amplitude $A_{SC}$ of the electromagnetic waves being converted. If the proportionality factors are constant, it means that conversion of the amplitude $A_{SC}$ of the monochrome (unmodulated) electromagnetic waves being converted is linear; if the above factors depend on the magnitude of the amplitude $A_{SC}$, non-linear conversion of this amplitude $A_{SC}$ is implied. Thus, for instance, we may have the proportionality factor $\alpha_m = \alpha_{mo} \cdot A_{SC}$, where the other proportionality factor $\alpha_{mo} = $ const. Then, the equation for the above amplitudes will be $C_{gm} = \alpha_{mo} \cdot A_{SC}^2$, etc. The amplitudes $C_{g1}$, $C_{g3}$, $C_{g5}$, $C_{g7}$, etc. corresponding to the uneven values of $m$ are obtained when the input system 12a (FIG. 7) of the converter 12 is incorrectly tuned to the constant value of the carrier frequency $f_{SC}$ (FIG. 3) of the electromagnetic waves being converted either accidentally (FIG. II) or identically (not shown in the figure), i.e. when $f_{SC} \neq f_{AO}$, where $f_{AO}$ is the mean value of the time-variable resonance frequency $f_A$ of the impedance $Z_A$ as seen looking into the A-input of the converter 12. Besides, these amplitudes also occur when $f_{SC} = f_{AO}$, in case the resistive component $R_A$ and the reactive component $X_A$ of the impedance $Z_A$ as seen looking into the A-input of the converter 12 are non-symmetric with respect to the Y-axis passing through the resonance frequency $f_A$. It should be noted that if the value of the carrier frequency $f_S$ of the received electromagnetic waves in time-constant, this value of the carrier frequency equal to $f_{SC}$ is also identically coincident with the time-average value of the carrier frequency $f_{SO}$ (FIG. 5b) of the electromagnetic waves being converted, i.e. $f_{SC} = f_{SO}$.

Consider now conversion of electromagnetic pulses with their carrier frequency $f_S$ relatively constant in time, when auxiliary electromagnetic waves are generated. Let us apply a frequency spectrum (FIG. 12) corresponding to square electromagnetic pulses in the high or superhigh frequency bands with a time constant wave length $\tau$, to the A-input of the converter 12. The value $(1/\tau)$ defines a distance between the minimum in the frequency spectrum of the electromagnetic waves being converted. The time-constant carrier frequency of the electromagnetic pulses will be denoted $f_{sci}$, the current amplitude of the spectral components of this frequency spectrum $A_{si}$ and the maximum value of these current frequency amplitudes $A_{si\,max}$. Similar to the previous case, auxiliary electromagnetic waves with the time-constant carrier frequency $f_{gc}$ and, consequently, with the time-constant amplitude $B_{gc}$ (FIG. 10) will be delivered to the auxiliary B-input. Under the effect of the electromagnetic waves, the section of the converter 12 between the auxiliary B-input and D-output becomes non-linear for the auxiliary electromagnetic wave for the period while electromagnetic pulses are being delivered. As a result, the D-output of the converter 12 gives out converted electromagnetic pulses which contain a succession of intermediate-frequency spectral regions (FIG. 13), each of the regions being determined by the frequency spectrum within its limits the envelope of which depends on the envelope of the frequency spectrum being converted, and having a carrier frequency given by the expression $f_{im} = mf_{gc}$, where $m = 1,2,3,4\ldots$ etc. indicates the No. of the region in the succession of spectrum regions (the first region that has not been used in our example corresponding to $m = 1$ is not shown in FIG. 13). The instantaneous amplitudes $C_{g2i}$, $C_{g3i}$, $C_{g4i}$, etc. of the frequency components of the above spectrum regions are found from the equation $C_{gmi} = \alpha_{mi}A_{si}$. Assuming $m = 2$, the equation gives an expression for the instantaneous amplitude of the spectral components of the second region in the intermediate frequency spectrum of the converted electromagnetic waves: $C_{g2i} = \alpha_{2i} \cdot A_{si}$. For $m = 3$, it will be, respectively, $C_{g3i} = \alpha_{3i} \cdot A_{si}$; for $m = 4$ $C_{g4i} = \alpha_{4i} \cdot A_{si}$, etc. The coefficients $\alpha_{2i}$, $\alpha_{3i}$, $\alpha_{4i}$, etc., in the above equations may be either constants or values depending on the instantaneous magnitudes of the amplitudes $A_{si}$ (FIG. 12) of the components of the electromagnetic pulse frequency spectrum. If the coefficients are constant, this means that the converter 12 effects linear conversion of the pulse waveform of the received electromagnetic waves. Contrariwise, if the coefficients depend on the instantaneous magnitude of the amplitude $A_{si}$ or on the frequency of the components of the frequency spectrum of the electromagnetic pulses being converted, non-linear conversion of the pulse waveform is performed by the converter 12. For the sake of illustration, the amplitudes of individual frequency components of the electromagnetic frequency spectra and, respectively, the envelopes of these amplitudes in FIGS. 11,12,13,14,15 are not proportional in scale with respect to the largest maximum values of these amplitudes and, consequently, with respect to the largest maxima of the fundamental envelopes of the same amplitudes. Any of the above regions of the converted frequency spectrum can be used when carrying into effect the proposed method of converting the carrier frequency of the electromagnetic wave spectrum.

In a general case, the proposed method of converting the time-constant carrier frequency $f_{sci}$ of electromagnetic pulses of an arbitrary waveform is carried out in a similar manner. In such conversion, the regions of the converted electromagnetic pulse frequency spectrum have carrier frequencies which are multiples of the carrier frequency $f_{gc}$ of the auxiliary electromagnetic waves.

When the carrier frequency $f_{sci}$ of the frequency spectrum of received electromagnetic waves is converted by means of the proposed method with the aid of the converter 12, the shape of the frequency spectrum envelope will not be distorted only if the bandwidth of the reception video-frequency spectrum with due account of time variations of the magnitude of the received carrier frequency $f_{sci}$ will be smaller narrower than the bandwidth $\Delta F_A$ (FIG. 3) within which varies the resistive component $R_A$ of the impedance $Z_A$ as seen looking into the A-input of the converter 12.

For converting amplitude-frequency-modulated waves with their carrier frequency $f_s$ varying sinusoidally with time (FIG. 5b) and the amplitude of this variation being $f_{s\,max}$ comparable with, or larger than, the above bandwidth $\Delta F_A$, the same converter 12 (FIG. 2 and FIG. 7) converts the mean value $f_{so}$ of the time-varying carrier frequency $f_s$ of such amplitude-frequency-modulated electromagnetic waves without auxiliary electromagnetic waves, i.e. without the local oscillator 13 or the filter 14. Then, the converted electromagnetic waves at the D-output of the converter 12 will have the carrier frequencies $f_{im}$ of the electromagnetic frequency spectrum regions which will be multiples of the value of the subcarrier frequency $F_{gc}$ at which varies the carrier frequency $f_s$ of the amplitude-frequency-modulated electromagnetic waves, i.e. $f_{im} = mF_{gc}$ (FIG. 11 and FIG. 13) where $m = 1,2,3,4,5$, etc. As to the shapes of the envelopes of the spectral components in these spectrum regions, they will depend on the shape of the envelope of the spectral components in a video-frequency spectrum of the intelligence-carrying electromagnetic waves being converted.

Below are given some peculiar features of amplitude-frequency-modulated electromagnetic waves as compared with conventional amplitude-modulated electromagnetic waves.

First example. When information is transmitted by means of amplitude-frequency-modulated electromagnetic waves, the monochrome electromagnetic waves to be converted, with a time-constant amplitude and frequency, correspond to electromagnetic waves having a time-constant amplitude and a frequency varying with time sinusoidally (at a rate of this sinusoidal situation equal to the above subcarrier frequency $F_{gc}$).

Second example. When information is transmitted by means of amplitude-frequency-modulated electromagnetic waves, the amplitude-modulated electromagnetic pulses to be converted with a time-constant value of the carrier frequency $f_{SC}$ and, for instance, with a square waveform of identical recurrent pulses correspond to electromagnetic pulses of square waveform having a carrier frequency $f_s$ varying with time sinusoidally (FIG. 5b) with a period $T_{gc}$ which is five or ten times shorter than the length of the above pulses.

Third example. In transmitting information using amplitude-frequency-modulated waves, any amplitude-modulated electromagnetic waves to be converted correspond to the same waveshape of their envelope in time, but the magnitude of their carrier frequency $f_s$ will continuously vary sinusoidally with a period $T_{gc}$. The magnitude of the subcarrier frequency $F_{gc}$ of the amplitude-frequency-modulated electromagnetic waves must be sufficiently large to reproduce the waveshape of the converted electromagnetic waves carrying intelligence and having the intermediate carrier $f_{im} = mF_{gc}$ at the D-output of the converter 12.

Figure 16:
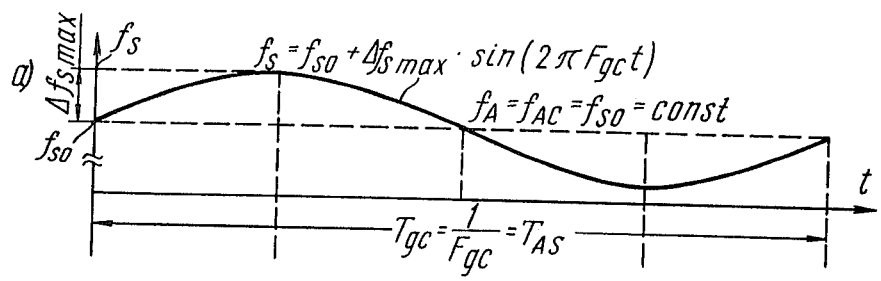
FIG. 16a is the time-response curve of the carrier frequency $f_s$ of the electromagnetic waves to be converted according to the invention.
FIG. 16b is the time-response curve of the instantaneous value of the resistive component $R_A$ of the converter impedance $Z_A$ as seen looking into the A-input for incoming electromagnetic waves which are applied to this A-input and have a carrier frequency $f_s$ varying with time, while no auxiliary electromagnetic waves are fed to the auxiliary B-input and no additional electromagnetic waves are fed to the C-input of the converter, according to the invention.
Figure 16:
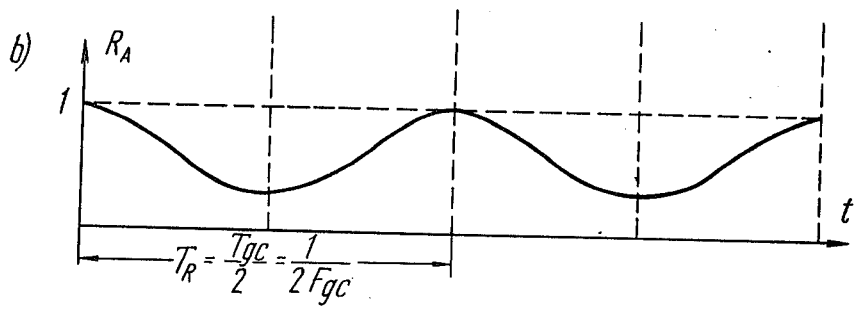
Figure 17:
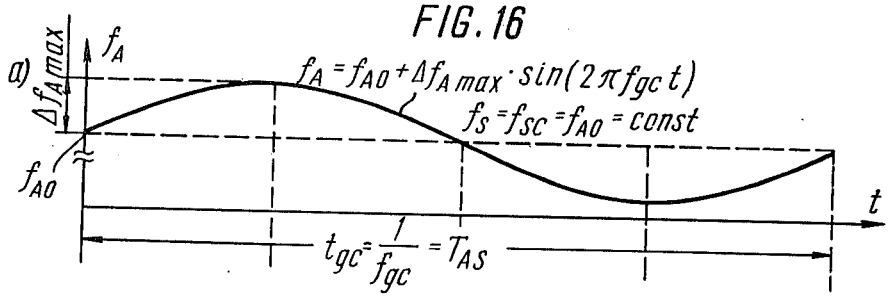
FIG. 17a is the time-response curve of the resonant frequency $f_A$ of tuning the converter impedance $Z_A$ as seen looking into the A-input, according to the invention.
FIG. 17b is the time-response curve of the instantaneous value of the resistive component $R_A$ of the converter impedance $Z_A$ as seen looking into the A-input for incoming electromagnetic waves which are applied to this A-input and have a time-constant carrier frequency $f_s$, when the auxiliary B-input of the converter receives auxiliary electromagnetic waves at a frequency $f_{gc}$ and when no additional electromagnetic waves are applied to the C-input of the converter, according to the invention.
Figure 17:
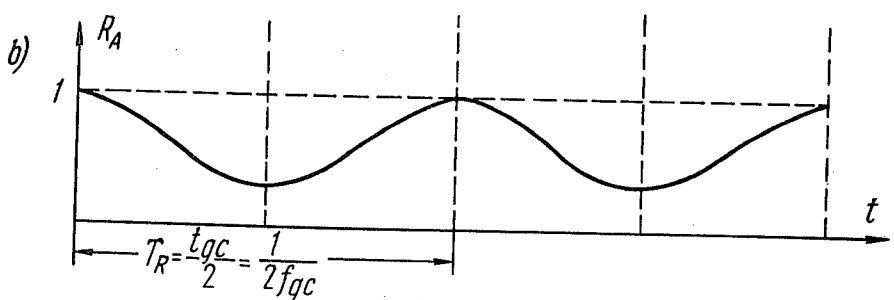

We shall now proceed to consideration of certain aspects of conversion of amplitude-frequency-modulated waves and amplitude-modulated waves by means of the converter 12. Let us assume that the carrier frequency $f_s$ of the received electromagnetic waves varies with time $t$ sinusoidally with a period $T_{gc} = (1/F_{gc})$, the time average value of this sinusoidal change of the carrier frequency $f_s$ being equal to $f_{so}$. By adjusting the intensity $H_{AO}$ of the constant magnetic field and/or the intensity $E_{AO}$ of the constant electric field we make the resonance frequency $f_A$ of the impedance $Z_A$ as seen looking into the A-input of the converter 12 equal to the above average value $f_{SO}$ of the time-varying carrier frequency $f_s$ of the electromagnetic waves to be converted, in other words, we satisfy the equation $f_A = f_{AC} = f_{SO} = $ const. Since the carrier frequency $f_s$ of the electromagnetic waves to be converted varies with time sinusoidally (FIG. 16a), the resistive component $R_A$ (FIG. 16b) of the impedance $Z_A$ as seen looking into the A-input of the converter 12 will also change with time. Due to the resonance nature of relationship of the component $R_A$ with the frequency of electromagnetic waves coming to the A-input of the converter 12, the fundamental frequency at which $R_A$ will change in time will be twice the magnitude of the subcarrier frequency $F_{gc}$ of the electromagnetic waves to be converted. Consequently, the period $T_B$ of the changes of the component $E_A$ will be twice as small as the period $T_{gc}$ of the subcarrier frequency $F_{gc}$, i.e. $T_R = (T_{gc}/2) = (1/2\ F_{gc})$ (FIG. 16b). Note for comparison that in the case of conversion of amplitude-modulated electromagnetic waves with a time-constant carrier frequency $f_{sc}$ using the converter 12 (FIGS. 2, 7), the resistive component $R_A$ will change with time in the identical manner, but provided auxiliary electromagnetic waves are applied to the auxiliary B-input of the converter 12 at a frequency $f_{gc}$. Indeed, if the carrier frequency $f_s$ of the amplitude-modulated electromagnetic waves supplied to the converter is constant in time, i.e. $f_s = f_{sc} = $ const., and if auxiliary electromagnetic waves delivered to the auxiliary B-input of the converter 12 make the resonance frequency $f_A$ (FIG. 17a) of the impedance $Z_A$ as seen looking into the A-input of the converter 12 vary with time sinusoidally (the average change rate $f_{AO}$ being equal to $f_{sc}$), the resistive component $R_A$ (FIG. 17b) of this impedance $Z_A$ for the electromagnetic waves being converted will vary periodically, the period $T_R$ of the variation of $R_A$ being in this case half the period $t_{gc}$ (FIG. 17a) of the time variations of the resonance frequency $f_A$. Thus, $T_R = (t_{gc}/2) = (1/2\ F_{gc})$ (FIG. 17b), where $f_{gc}$ is the subcarrier frequency of the auxiliary electromagnetic waves. When selecting the amplitude $\Delta f_{s\ max}$ (FIG. 16a), the time dependence of the resistive component $R_A$ (FIG. 16b) of the impedance $Z_A$ for amplitude-frequency-modulated electromagnetic waves can be made identical (without auxiliary electromagnetic waves) to the time dependence of the resistive component $R_A$ (FIG. 17b) of the impedance $Z_A$ for amplitude-modulated electromagnetic waves (when auxiliary electromagnetic waves are applied to the auxiliary B-input of the converter 12). The latter condition is obviously satisfied if the subcarrier $F_{gc}$ of the amplitude-frequency-modulated electromagnetic waves applied to the A-input of the converter 12 equals the carrier frequency $f_{gc}$ of the auxiliary electromagnetic waves delivered to the auxiliary B-input of the same converter.

Periodic time variation of the resistance $R_A$ is equivalent to the time change of the energy stored in the input resonant system 12a under the effect of received electromagnetic waves. Therefore, the maximum value of the subcarrier frequency $F_{gc}$ of amplitude-frequency-modulated electromagnetic waves to be converted or, respectively, the maximum value of the carrier frequency $f_{gc}$ of the auxiliary electromagnetic waves is defined by the value $\Delta F_A$ (FIG. 3) of the bandwidth within which changes the resistive component $R_A$ of the impedance $Z_A$ of this converter. By subjecting the value of the electromagnetic energy stored in the input resonant system 12a (FIG. 7) to periodic time changes (for example, by periodically changing in time the above value $R_A$), we obtain auxiliary amplitude modulation imposed on the electromagnetic waves at the output of this resonant system. After spatial detection, we detect a concrete region of the frequency spectrum of the converted electromagnetic waves in the output resonant system 12b having the intermediate carrier frequency which is a multiple of the energy modulation frequency in the input resonant system 12a of the converter 12.

In a particular case, when the relationship between the resistive component $R_A$ of the impedance $Z_A$ as seen looking into the A-input of the converter 12 and the frequency of the electromagnetic waves applied to this input is ideally symmetrical, and when the input resonant system 12a is tuned precisely to the time-average value of the carrier frequency $f_{SO}$ of the electromagnetic waves to be converted, the magnitude of the intermediate carrier frequency $f_{im}$ of the converted electromagnetic waves at the D-input of the converter 12 will be given by $f_{im} = mF_{AS}$, where $F_{AS}$ is the reference frequency at $m = 2,4,6, \ldots$ etc., i.e. $m$ has only even values.

Figure 18:
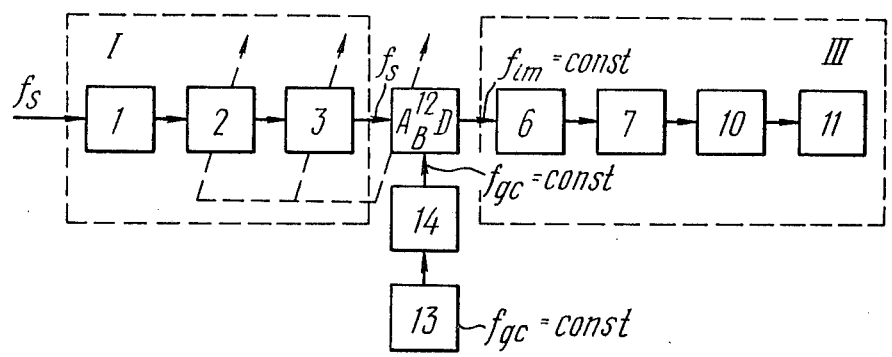
FIG. 18 is a block diagram of the proposed receiver which uses the method of electromagnetic carrier conversion, according to the invention.

One of the devices using the proposed method of carrier frequency conversion in the electromagnetic frequency spectrum is an electromagnetic energy receiver the block diagram of which is illustrated in FIG. 18. The preferred embodiment of the receiver comprises an input device 1 (FIG. 2), a converter 12, a local oscillator 13, a filter 14, and an output device III. If the receiver is intended for receiving amplitude-frequency-modulated waves with a periodically varying carrier frequency or if the electromagnetic waves coming to the receiver input undergo auxiliary amplitude modulation, the local oscillator 13 and the filter 14 are not included in the receiver circuitry. The input device I contains an input waveguide-feeder system I, input circuits 2 and a frequency-selective amplifier 3, connected in series. The output of the frequencyselective amplifier 3 is connected to the input A of the converter 12. The output device III, in its turn, comprises an intermediate-frequency amplifier 6, a peak detector 7, an audio amplifier 10, and an output device 11, also connected in series relation. The input of the intermediate-frequency amplifier 6 is connected to the D-output of the converter 12. If an auxiliary B-input is provided in the converter 12, this auxiliary input is connected to the local oscillator 13 through the filter 14. The converter 12 includes a semiconductor element II, and may also incorporate a source (not shown) of a constant magnetic and/or constant field of variable intensity. The semiconductor element II is placed in this constant magnetic and/or constant electric field.

Figure 10:
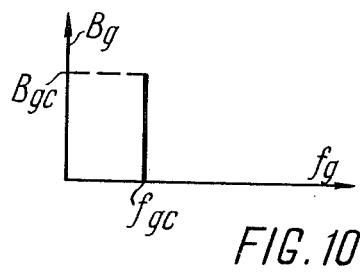
FIG. 10 illustrates a frequency spectrum of auxiliary electromagnetic waves as applied to the auxiliary B-input of the converter, according to the invention.

The electromagnetic waves come into the input waveguide-feeder system 1 of the receiver, pass through the receiver input circuits 2 which additionally filter out the electromagnetic waves outside the reception range, are amplified by the frequency-selective amplifier 3 and are applied to the A-input of the frequency-selective converter 12 that can be adjusted within the operating frequency range of the signals received. When the receiver accepts amplitude-modulated electromagnetic waves with the carrier frequency $f_{sc}$ relatively constant in time, auxiliary electromagnetic waves generated by the local oscillator 13 are furnished to the auxiliary B-input of the converter 12. The carrier frequency $f_{gc}$ (FIG. 10) of the auxiliary electromagnetic waves is constant, i.e. this frequency $f_{gc}$ remains unchanged when the receiver is readjusted within the operating frequency range (FIG. 18). The electromagnetic waves generated by the local oscillator 13 are sent to the converter 12, when so required, through the filter 14. The filter 14 is responsible for passing auxiliary electromagnetic waves at the carrier frequency $f_{gc}$ = const. only (FIG. 10). In other words, the filter 14 must block all other spurious components of the electromagnetic wave frequency spectrum generated by the local oscillator 13. In case the receiver receives and converts amplitude-frequency-modulated waves the carrier frequency $f_s$ of which periodically changes (FIG. 16a) at the subcarrier frequency $F_{gc}$, the local oscillator 13 is cut off.

The converted electromagnetic waves at the D-output of the converter 12 (FIG. 2 and FIG. 18) consist of frequency spectrum regions carrying intelligence (such as illustrated, for instance, in FIG. II and FIG. 13), with their carrier frequencies being multiples of the reference frequency $F_{AS}$ which characterizes the time change of the difference $f_{AS}$. In a general case, the magnitude of the difference $f_{AS}$ is a multiple of the carrier frequency $f_{gc}$ (FIGS. 10, 17a) when amplitude-modulated electromagnetic waves are received, or it is a multiple of the magnitude of the subcarrier frequency $F_{gc}$ (FIG. 16a) when the received waves are amplitude-frequency-modulated. In a general case, the magnitude of the intermediate carrier frequency $f_{im}$ of the converted electromagnetic waves at the D-output of the converter 12 is dependent on the energy modulation frequency in the input resonant system 12a of this converter. When designing the receivers of the present invention it is preferable that the magnitude of the intermediate carrier frequency $f_{im}$ of converted electromagnetic waves be selected on the basis of the intermediate-frequency amplifiers that have been already developed and used. In this case, the carrier frequency $f_{gc}$ (FIG. 10) of the electromagnetic waves generated by the local oscillator 13 (FIG. 2 and FIG. 18) will be found from the expression $f_{gc} = (1/m) \cdot f_{im}$, where $m = 1,2,3,4,5, \ldots$ etc. Accordingly, the subcarrier $F_{gc}$ (FIG. 16a) of amplitude-frequency-modulated waves is defined by the equation $F_{gc} = (1/m) \cdot f_{im}$, where $m = 1,2,3,4 \ldots$ etc. The electromagnetic waves converted by the converter 12 are amplified by the intermediate-frequency amplifier 6 (FIG. 18), detected by the peak detector 7, amplified by the audio amplifier 10 and supplied to the output device 11 which may be a cathode-ray tube, a loudspeaker, a pointer-type instrument, a recorder, etc. Thus, the receiver using the proposed method of converting the carrier frequency $f_s$ of the received electromagnetic waves comprises, apart from the converter 12 and in some cases the local oscillator 13 and the filter 14, all well-known components of superheterodyne receivers and straight receivers.

Retuning of the receiver of the present invention (FIG. 18) in its working frequency range is effected by varying the intensity of the constant magnetic and/or constant electric field in which the semiconductor element II of the input resonant system of the converter 12 is disposed.

The returning is accomplished by changing the tuning frequency of this input resonant system through varying the intensity of the constant magnetic and/or constant electric field. The intensity of the constant magnetic and/or constant electric field may be varied by such means as, for instance, an adjustable resistor.

Thus, the receiver under consideration receives and converts the carrier frequency of the frequency spectrum of the electromagnetic waves in accordance with the proposed conversion method. It should be noted that in some special cases the electromagnetic waves to be converted having the carrier frequency $f_s$ may be applied directly to the A-input (FIG. 7) of the converter 12 of the receiver, whereas the converted electromagnetic waves having the intermediate carrier frequency $f_{im}$ may be used as taken directly from the D-output of this converter 12.

The receiver of the present invention has the following basic advantages:

First, its block diagram comprises no retunable local oscillator 5 (FIG. 1) included in the design of a superheterodyne receiver. This feature not only simplifies the block diagram of the receiver of the present invention, but also makes it possible to design a frequency-selective panoramic receiver with a magnetic and/or electric tuner operating within a comparatively broad frequency range. Due to additional frequency selectivity of the converter 12, such a panoramic receiver provides frequency selectivity which is two or three orders of magnitudes higher than that of a retunable superheterodyne receiver having a similar filter in the receiver input circuits 2.

Second, in the receiver of this invention, the intermediate carrier frequency $f_{im}$ of the converted electromagnetic waves is completely independent of the magnitude and time stability of the carrier frequency $f_s$ of the electromagnetic waves being converted. Due to this design feature, selection of the amplification bandwidth of the intermediate-frequency amplifier 6 may not be guided by considerations of the instability of the carrier frequency $f_s$ of the electromagnetic waves being converted, i.e. the amplifier bandwidth may be decreased, thereby increasing the sensitivity of the entire receiver. The above instability of the carrier frequency $f_s$ of the electromagnetic waves being converted is taken into account in the selection of the bandwidth $\Delta F_A$ of the input resonant system 12a (FIG. 7) of the converter 12 (FIG. 13). This property of the proposed receiver permits appreciable improvement of the sensitivity of the receiver for very narrow-band signals with the carrier frequency $f_{gc}$ of the auxiliary electromagnetic waves generated by the local oscillator 13 stabilized by means of a quartz crystal. Then, the amplification bandwidth of the intermediate-frequency amplifier 6 will depend only on the time stability of the carrier frequency $f_{gc}$ of the auxiliary electromagnetic waves.

Consider a numerical example. Assume that it is required to receive continuous microwave signals with stability of their carrier frequency $f_s$ equal to 1 MHz, the local oscillator 13 producing signals having the carrier frequency $f_{gc}$ stable to within I Hz. In this example, in order to obtain the maximum possible sensitivity of the receiver the amplification pass of the intermediate-frequency amplifier 6 must be taken equal to about I Hz. On the other hand, in a superheterodyne receiver employing no automatic tuning to the frequency $f_s$ of the electromagnetic waves being converted, in which the instability of this carrier frequency $f_s$ is I MHz, the amplification bandwidth of the intermediate-frequency amplifier 6 must also be about I MHz. It is evident, therefore, from this example that the required amplification bandwidth of the intermediate-frequency amplifier 6 in the receiver of the present invention (FIG. 18) is appreciably narrower as compared with a corresponding superheterodyne receiver. The sensitivity of the receiver is known to be inversely proportional to the sqiare root of the reception frequency bandwidth, therefore, other conditions being equal, the sensitivity of the receiver of this invention operating on very narrow-band signals will be better than that of its superheterodyne receiver counterpart.

Third, on the condition that instability of the carrier frequency $f_s$ of the electromagnetic waves being converted is smaller than the bandwidth $\Delta F_A$ (FIG. 3) of the input resonant system 12a (FIG. 7) of the converter 12 (FIG. 18), the receiver of the present invention does not need automatic frequency control which makes the design and circuitry of this receiver simpler an against a superheterodyne receiver.

Fourth, the receiver of the present invention using the proposed method of carrier frequency conversion, employs theoretically no image frequency $f_{ss}$ and all the other combination frequencies $f_{smn}$ shown above. This makes the requirements for efficiency of filtering signals in the input circuits 2 of the receiver (FIG. 18) less stringent as compared with similar filtering of signals in the input circuits 2 of a superheterodyne receiver (FIG. 1). The above advantage is particularly pronounced in wideband panoramic receivers which can receive signals at a power level differing by 100 dB and above.

Another advantage of the receiver of this invention lies in that in the microwave region matching of the magnetically tunable bandpass ferrite filters (incorporated in the input circuits 2 of the receiver and in he frequency-selective amplifier 3) with the magnetically tunable converter 12 is much more easy as compared with matching on the same bandpass ferrite filters with the tunable local oscillator 5 of a superheterodyne receiver (FIG. 1). This is because the single ferrite crystals of the input bandpass ferrite filters and the single ferrite crystal of the input resonant system 12a (FIG. 7) of the converter 12 (FIG. 18) can be disposed one above the another within two successive air gaps in he magnetic circuit of a magnetic system (not shown). The gaps are located, respectively, between the three pole pieces of one magnetic system which is electrically tunable within the working frequency range of the receiver of the present invention.

Figure 7:
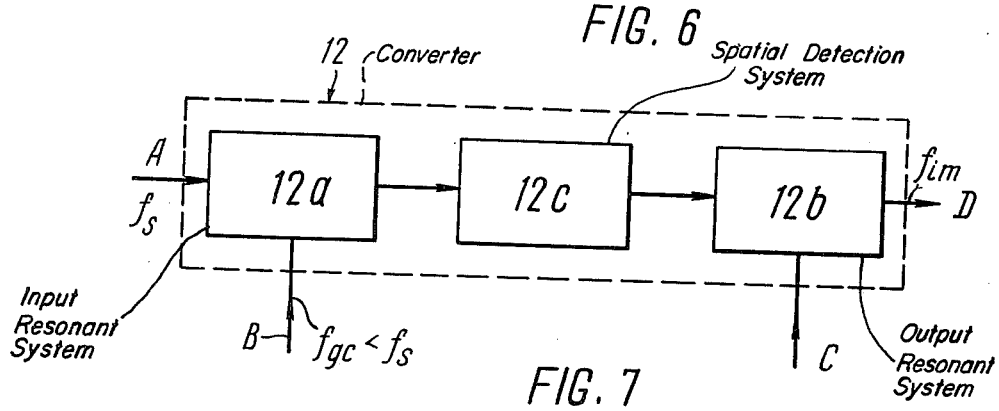
FIG. 7 presents a block diagram of the converter, according to the invention.
Figure 19:
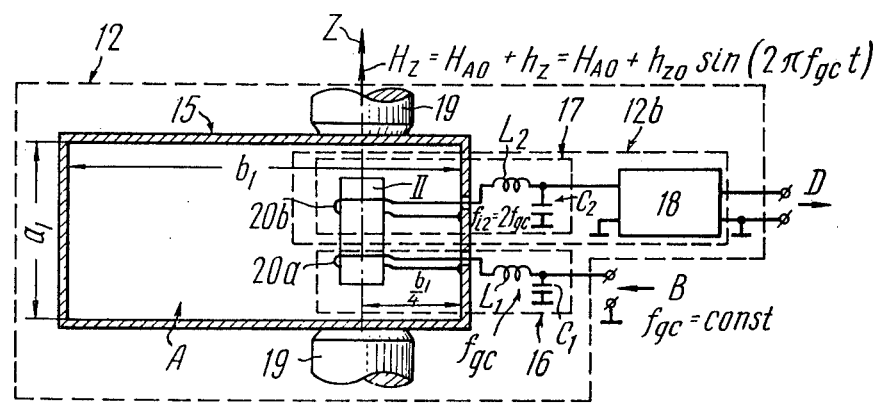
FIGS. 19, 20, 21, 22 illustrate various embodiments of the converter according to the invention.

An example of one embodiment of the converter 12 (FIGS. 2,7,18) is a device schematically illustrated in FIG. 19. This converting device comprises a rectangular metal waveguide 15, an input resonant circuit 16, an output resonant circuit 17, an additional filter 18, and a source 19 of a constant magnetic field $H_{AO-}$. The input A of the entire converter 12 is one input of the waveguide 15 (FIGS. 2,7,18). The waveguide 15 (FIG. 19) accommodates the semiconductor element II (FIG. 2) which is made of a magnetic semiconductor material-ferrite. Inside the waveguide 15 two groups of the conductor loops are disposed in the immediate vicinity of the semiconductor element II: conductor loops 20a which are comprised in the input resonant circuit 16, and conductor loops 20b which constitute the output resonant circuit 17. The leeds of the conductor loops 20a are series-connected through the narrow wall of the rectangular metal waveguide 15 to an inductor $L_I$ and a capacitor $C_I$ placed outside the waveguide 15. The loops 20a, inductor $L_I$ and capacitor $C_I$ from the input resonant circuit 16. The terminals of the capacitor $C_I$ serve as the auxiliary B-input (FIG. 19) of the converter 12 (FIGS. 2,7,18). The leads of the conductor loops 20b are series-connected via the narrow wall of the waveguide 15 to an inductor $L_2$ and a capacitor $C_2$ located outside the waveguide 15. The loops 20b, the inductor $L_2$ and the capacitor $C_2$ form the output resonant circuit 17. The terminals of the capacitor $C_2$ form the output resonant circuit 17. The terminals of the capacitor $C_2$ are connected to the input of the additional filter 18 with the terminals thereof acting as the D-output of the converter 12 (FIGS. 2,7,18,19). The leads of the conductor loops 20a and 20b (FIG. 19) connected to the capacitors $C_1$ and $C_2$ are earthed by being shorted out to the body of the waveguide 15. One input terminal and one output terminal of the additional filter 18 are also connected to the body of the waveguide 15.

The input resonant system 12a (FIG. 7) in our example of the embodiment of the converter 12 (FIG. 19) consists of the rectangular metal waveguide 15, the semiconductor element II, and the input resonant circuit 16. The output resonant system 12b (FIG. 7) of the converter 12 (FIG. 19) comprises the output resonant circuit 17, and the additional filter 18. The D-output (FIGS. 2,7,18,19) of the converter 12 (FIG. 19) is the output of the additional filter 18. The spatial detection system 12c (FIG. 7) contains the semiconductor element II (FIG. 19) and a group of the loops 20 b of the conductor 20 included in the output resonant circuit 17. The C-input (FIG. 7) is not provided in this embodiment.

The semiconductor element II (FIG. 19) is shaped as a cylinder, sphere or a disk and is disposed at a distance b/4 from the narrow wall of the waveguide 15 (FIG. 19), where b is the dimension of the broad wall of this waveguide. To put it more precisely, the semiconductor element II is placed in the region of the waveguide 15 which is characterized by right-hand circular polarization of the magnetic field vector in the field associated with the electromagnetic waves being converted. The output of the waveguide 15 (FIG. 19) is connected to a matched termination (not shown in FIG. 19) which does not reflect the electromagnetic waves along the waveguide. The diameter of the conductor in the loops 20a and 20b (FIG. 19) is selected as small as possible in order to provide minimum screening of the ferrite material of the semiconductor element II from the incident electromagnetic field. The choice of the diameter of the loops 20a is guided by the magnitude of current passing through these loops from the local oscillator 13 (FIG.

18). Single ferrite crystals are used as a magnetic semiconductor material in the decimeter-, centimeter- and millimeter-wave bands. For obtaining the maximum power of a converted signal at an invariable power level of the signal being converted, use is made of single ferrite crystals with the narrowest possible ferromagnetic resonance band. On decimeter and long centimeter waves this requirement is met by well-known single-crystal calcium-bismuth-vanadium garnet; on short centimeter and long millimeter waves, by well-known single-crystal yttrium -iron garnet. Finally, the optimum material to be used in long millimeter wave range is conventional single-crystal ferrite with oriented internal fields of crystal anisotropy, also called single-crystal hexaferrite. The diameter of a cylinder (sphere) of the semiconductor element II is selected such as to be considerably smaller than the wavelength of the electromagnetic oscillations which are transmitted through the waveguide 15. Thus, for example, if the carrier frequency $f_s$ of the frequency spectrum of electromagnetic waves to be converted is $10^{10}$ Hz which corresponds to the 3-cm wavelength of the electromagnetic waves to be converted, the diameter of the cylinder (sphere) must be about 1 mm. A more accurate size of the ferrite element is selected experimentally in a concrete design of the converter 12 so as to obtain the maximum conversion coefficient in a given converter. By the conversion coefficient of the converter 12 is meant the ratio of the power of the output electromagnetic waves having an intermediate carrier frequency $f_{im}$ to the power of the input electromagnetic waves with a carrier frequency $f_s$.

The intensity of a constant magnetic field $\overline{H}_{AO}$ (FIGS. 19,8) (the field can be varied, for instance, by varying current in the electromagnet windings by means of an adjustable resistor) must be selected such as to obtain ferromagnetic, or, more precisely, ferrimagnetic resonance in the ferrite (see, for example, B. Lax, K. J. Button "Microwave ferrites and ferrimagnetics", McGraw-Hill Book Company, Inc., New-York, San-Francisco, Toronto, London, 1962).

The intensity of a constant magnetic field (which is set up, for example, by means of an electromagnet) can be varied by changing the resistance of an adjustable resistor connected in series with the electromagnet windings. Here, the adjustable resistor is a means for varying the intensity of the above magnetic field. When calcium-bismuth-vanadium garnet and iron-yttrium garnet are used, the intensity $H_{AO}$ of the external constant magnetic field is defined by the expression $H_{AO} = (2\pi/\gamma)f_s$, where $(\gamma/2\pi) = 2.8$ (MHz/oersted), and $f_s$ is the carrier frequency of the frequency spectrum of the electromagnetic waves being converted, in MHz. If hexaferrite single crystals are employed for producing ferrimagnetic resonance, a required intensity $H_{AO}$ of the external constant magnetic field is smaller as against calcium-bismuth-vanadium and yttrium-iron garnets. In the case of hexaferrite single crystals when the external constant magnetic field $H_{AO}$ is oriented along a direction of easy magnetization of these single crystals, the intensity $H_{AO}$ of the field is given (see C. Kittel, Phys.Rev. 73, 155, 1948) by $H_{AO} = (2\pi/\gamma)f_s - H_{an}$, where $H_{an}$ is the intensity of an oriented internal field of crystal anisotropy in single hexaferrite crystals. Auxiliary electromagnetic waves having a constant carrier frequency $f_{gc}$ are delivered from the local oscillator 13 (FIG. 18) to the auxiliary B-input of the input resonant circuit 16 (FIG. 19) via the filter 14 (FIG. 18). The value of the frequency $f_{gc}$ is determined by the characteristics of the ferrite used in the converter 12 (FIG. 19). When a calcium-bismuth-vanadium garnet and an yttrium-iron garnet with a ferromagnetic resonance band of about 1 oersted are employed, the frequency $f_{gc}$ may be equal to several megahertz. The input resonant circuit 16 is tuned to a frequency equal to $f_{gc}$. The loops 20a are intended to set up a variable magnetic field having the frequency $f_{gc}$ and oriented in the direction of the external constant magnetic field $H_{AO}$ induced by the source 19. The amplitude of this variable magnetic field is selected so as to be twice or thrice the ferrimagnetic resonance bandwidth. Thus, for single-crystal calcium-bismuth-vanadium garnets and yttrium-iron garnets, the amplitude of this field must be about 2–3 oersteds, that is, 15–20 loops 20a of a conductor with a diameter about 0.05 mm are required to provide such an amplitude at $f = 1-5$ MHz. The output resonant circuit 17 is tuned at its natural resonance frequency $f_D$ (FIG. 6) equal to twice the frequency $f_{gc}$ of auxiliary electromagnetic waves. Theoretically, for carrying the proposed method into effect the output resonant circuit 17 (FIG. 19) may also be tuned to its natural resonance frequency $f_D$ (FIG. 6) equal to $4 f_{gc}$, or to the natural resonance frequency $f_D$ equal to $6 f_{gc}$, etc. Stated another way, the output resonant circuit 17 (FIG. 19) can be tuned to any natural resonance frequency equal to $mf_{gc}$, where $m = 2,4,6, \ldots$ etc. The additional filter 18 in these cases performs additional rejection of the electromagnetic waves having a frequency equal to the auxiliary electromagnetic wave frequency $f_{gc}$.

Figure 8:
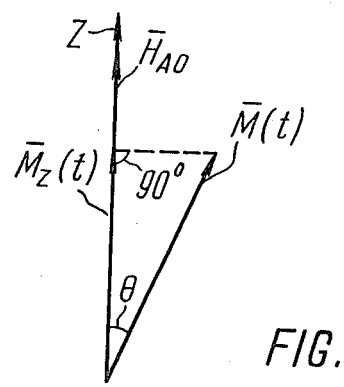
FIG. 8 is a diagram of instantaneous spatial direction of the magnetic moment density $\overline{M}$ and its projection $\overline{M}_Z$ for precessional motion of the magnetic moment density vector $\overline{M}$ of the semiconductor element about the Z-axis, according to the invention.

Consider operation of the converter 12 in this concrete embodiment of the invention, i.e. consider the process of passage of electromagnetic waves through the converter 12 used for converting the time-constant value of the carrier frequency $f_s = f_{sc} =$ const. of the frequency spectrum of amplitude-modulated electromagnetic waves. The received electromagnetic waves come to the A-input of the waveguide 15 of the converter 12 and are transmitted through the waveguide to the semiconductor element II. Under the effect of the incoming electromagnetic waves ferromagnetic resonance occurs in the semiconductor element II (see, for example, B. Lax, K. J. Button "Microwave ferrites and ferrimagnetics", McGraw-Hill Book Company, New-York, Inc. 1962), the phenomenon characterized by the precessional motion of the magnetic moment density vector $\overline{M}$ (FIG. 8) about the direction of the constant magnetic field $\overline{H}_{AO}$ oriented along the Z-axis. The frequency of this precessional motion depends on the magnitude of the carrier frequency $f_{sc}$ of the electromagnetic waves to be converted, whereas the steady-state value of the precession angle $\theta$ is determined by the power level of these electromagnetic waves at definite values of the intensity $H_{AO}$ of the constant magnetic field and at the above frequency $f_{sc}$. The magnitude of the precession angle $\theta$ determines the amount of energy of the electromagnetic waves accumulated in the course of this precession. The magnitude of the resonance frequency $f_A$ (FIG. 3) of the impedance $Z_A$ as seen looking into the A-input of the converter 12 (FIG. 19) is determined by the intensity $H_{AO}$ of the external constant magnetic field $\overline{H}_{AO}$ (FIGS 8, 19). If the value of this intensity $H_{AO}$ obeys the above relationship $H_{AO} = (2\pi/\gamma) f_{sc}$, the resonance frequency $f_A$ (FIG. 3) of the impedance $Z_A$ as seen looking into the A-input of the converter 12 (FIG. 19) will be equal to the carrier frequency $f_{sc}$ of the frequency spectrum of the incoming electromagnetic waves, i.e. the equation $f_A = f_{SC} =$ $(\gamma/2\pi)$ H$_{AO}$ is satisfied. In this case the output of the waveguide 15 (this output is disposed at the waveguide end opposite to the A-input) has a matched termination or an appropriately oriented short-circuiting surface of this waveguide. If $f_A = f_{SC}$, the value of the precession angle $\theta$ (FIG. 8) is at its maximum as determined by the power level of the electromagnetic waves being converted. At $f_A=f_{SC}$, the precession angle $\theta$ defines the maximum amount of the input electromagnetic energy stored in the course of this precessional motion of the magnetic moment density vector $\overline{M}$. In the state of ferromagnetic resonance, the energy of the precessional motion of the magnetic moment density vector $\overline{M}$ equals to the electromagnetic energy stored in the input resonant system 12a of the converter 12. This energy in accordance with the proposed method, is stored for a time larger than the period of the electromagnetic wave carrier frequency, but smaller than the relaxation time of the magnetic moment density vector $\overline{M}$ of the ferrite. The actual storage is effected by a quantity M$_z$ which is the projection of the magnetic moment density vector $\overline{M}$ of the ferrite onto the Z-axis direction. Due to the amplitude modulation of the incoming electromagnetic waves, the precession angle $\theta$ changes with time following the law of changing the intensity of the magnetic field component of the electromagnetic waves being converted.

Let us now apply auxiliary electromagnetic waves having the constant carrier frequency $f_{gc}$ to the auxiliary B-input (FIG. 19) of the converter 12. If the semiconductor element II of the converter 12 is made of ferrite of the calcium-bismuth-vanadium garnet or yttrium-iron garnet type, the carrier frequency $f_{gc}$ of the auxiliary electromagnetic waves may range from fractions of one hertz to several megahertz. In these limits the magnitude of the carrier frequency $f_{gc}$ of the auxiliary electromagnetic waves must be such as to exceed by at least 5 or 10 times the maximum amplitude modulation frequency of the converted amplitude-modulated electromagnetic waves that is taken into account in calculations. The input resonant circuit 16 of the input resonant system 12a of the converter 12 is tuned to the constant value of the resonance frequency equal to the carrier frequency $f_{gc}$ of the auxiliary electromagnetic waves by adjusting the iductance of the inductor L$_1$ and the magnitude of the capacitor C$_1$. Then, the amplitude h$_{zo}$ of the intensity of the magnetic field induced by the loops 20a of the input resonant circuit 16 along the Z-axis must be equal to several oersteds. More accurately, this amplitude h$_{zo}$ is adjusted during tuning of the entire converter 12 by selecting the optimum amplitude value ensuring the maximum power of the converted electromagnetic waves at the D-output of the converter 12 under consideration. The variable magnetic field created by the conductor loops 20a along the Z-axis having intensity h$_z$ = h$_{zo}$ sin($2\pi f_{gc} t$), where h$_{zo}$ is the amplitude of this variable magnetic field, adds to the external constant magnetic field $\overline{H}_{AO}$ directed along the same Z-axis to form a resultant magnetic field with the intensity H$_z$=H$_{AO}$+h$_z$. Periodic time variations of the intensity H$_z$ of the resultant magnetic field causes periodic time changes of the resonance frequency $f_A$ (FIG. 5a) of the impedance Z$_A$ as seen looking into the A-input of the converter 12 (FIG. 19). The above quantities are related as follows:

$$f_A = (\gamma/2\pi) H_z = (\gamma/2\pi) H_{AO} + (\gamma/2\pi) h_{zo} \sin(2\pi f_{gc} t).$$

In the description of the proposed conversion method, the relationship for the resonance frequency $f_A$ (FIG. 5a) was given in the form: $f_A(t) = f_{AO} + f_{A\,max}\sin(2\pi f_{gc} t)$, where $f_{AO}$ is the average value of the time-varying resonance frequency $f_A$(FIG. 3) of the impedance Z$_A$ of the converter 12 (FIGS. 2,7,18), and $\Delta f_{A\,max}$ (FIG. 5a) is the maximum amplitude of the time variation of this resonance frequency $f_A$. The last two equaltions show, that for the concrete embodiment of the converter 12 (FIG. 19) being described, we have $f_{AO} = (\gamma/2\pi) H_{AO}$ and $\Delta f_{A\,max} = (\gamma/2\pi) h_{zo}$, where H$_{AO}$ = the intensity of the external constant magnetic field along the Z-axis, and h$_{zo}$ = the amplitude of the intensity of the variable magnetic field induced by the conductor loops 20a. A periodic change of the resonance frequency $f_A$ (FIG. 5a) of the impedance Z$_A$ as seen looking into the A-input of the converter 12 (FIG. 19) causes a periodic time change of $\Delta f_{AS}$(FIG. 4) which is a difference between the above resonance frequency $f_A$ and the carrier frequency $f_S$ of the frequency spectrum of the incoming electromagnetic waves. In this way, the input electromagnetic energy stored in the input resonant system 12a of the converter 12 is changed as required. It should be remembered that the frequency of auxiliary modulation applied to this power is a multiple of the carrier frequency $f_{gc}$ of the auxiliary electromagnetic waves delivered to the auxiliary B-input of the converter 12 (FIG. 19).

The converter 12 effects spatial detection by means of the conductor loops 20b in the following way. The incoming electromagnetic waves and auxiliary electromagnetic waves acting upon the semiconductor element II lead to periodic time changes of the projection of the magnetic moment density vector $\overline{M}$ (FIG. 8) of the semiconductor element II (FIG. 19) upon the Z-axis. This periodic change is denoted by M$_z$. Due to the periodic time changes in the value of the projection M$_z$ of the magnetic moment density vector $\overline{M}$, an electromotive force is set up in the conductor loops 20b, thereby making possible the spatial detection being considered. The projection M$_z$ of them magnetic moment density vector $\overline{M}$ changes in time on account of periodic time changes of the value of the precession angle $\theta$(FIG. 8) of the magnetic moment density $\overline{M}$.

As the resistive component R$_A$ (FIG. 3) of the impedance Z$_A$ as seen looking into the A-input (FIG. 19) of the converter 12 is of resonance nature, the conductor loops 20b set up converted electromagnetic oscillations having a carrier frequency given by $f_{im} = m f_{gc}$, where $m = 2,4,6, \ldots$, and $f_{gc}$ is the constant value of the carrier frequency of the auxiliary electromagnetic waves applied to the auxiliary B-input of the converter 12. When tuned at the natural resonance frequency $f_D$ (FIG. 6) equal to $2.f_{gc}$, the output resonant circuit 17 (FIG. 19) included in the output resonant system 12b (FIG. 7) isolates a region in the converted electromagnetic wave spectrum which has the intermediate carrier frequency $f_{i2}$ equal to $2.f_{gc}$ (see, for instance, FIGS. 11, 13). The filter 14 (FIGS. 2,18) blocks the second harmonic of the local oscillator 13, i.e. the frequency equal to $2.f_{gc}$. When the output resonant circuit 17 (FIG. 19) is tuned to the natural resonance frequency $f_D$(FIG. 6) equal to $4.f_{gc}$, this circuit detects a region in the spectrum of the converted electromagnetic waves which has an intermediate carrier frequency $f_{i4}$ equal to $4.f_{gc}$(see, for example, FIGS. 11, 13). In this case, the filter 14 (FIGS. 2, 18) must reject the fourth harmonic of the local oscillator 13, i.e., the frequency $4.f_{gc}$. Likewise, when the output resonant circuit 17 (FIG. 19) is tuned to resonance at its natural frequency $f_D$ (FIG. 6) equal to $6.f_{gc}$, this circuit detects a region in the frequency spectrum of the converted electromagnetic waves having an intermediate carrier frequency $f_{i6}$ equal to $6.f_{gc}$ (as, for example, in FIGS. 11, 13). In the latter case the filter 14 (FIGS. 2, 18) must filter out the sixth harmonic of the local oscillator 13 equal to the frequency $6.f_{gc}$, etc. The frequency bandwidth $\Delta F_D$ (FIG. 6) of the output resonant circuit 17 (FIG. 19) becomes equal to the bandwidth of the frequency spectrum (see, for example, FIG. 12) of the electromagnetic waves supplied to the A-input (FIG. 19) of the converter 12 regardless of the value of $m$. The conversion coefficient of the converter 12, say, in a 3-om radio wave band, provided that the number of the conductor loops 20b is 15-20 and the ferromagnetic resonance bandwidth (if an yttrium-iron garnet is used) is approximately I oersted, will be about 1-10 microvolt/milliwatt.

The converted electromagnetic signals of the output resonant circuit 17 are delivered via the additional filter 18 to the D-output of the converter 12. The additional filter 18 additionally suppresses electromagnetic waves having the constant carrier frequency equal to the frequency $f_{gc}$ of the auxiliary electromagnetic waves. In this way the converter 12 (FIGS. 18, 19) converts the carrier frequency $f_s$ (FIG. 18) of the frequency spectrum (see, for instance, FIG. 12) of the incoming electromagnetic waves, i.e. substitutes the carrier frequency $f_s$ by the intermediate carrier frequency $f_{im}$ (see, for example, FIG. 13) which in this concrete embodiment is a multiple of the constant frequency $f_{gc}$ of the auxiliary electromagnetic waves with $m = 2,4,6, \ldots$ etc.

Figure 20:
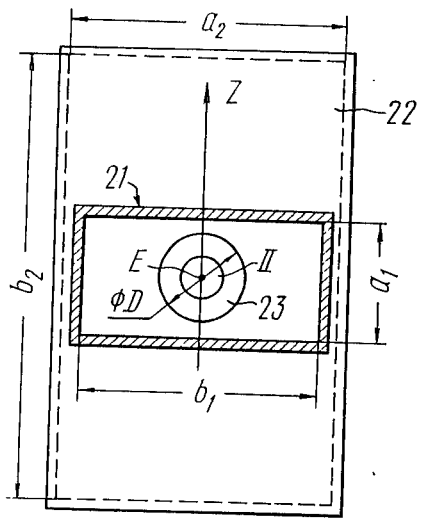
Figure 21:
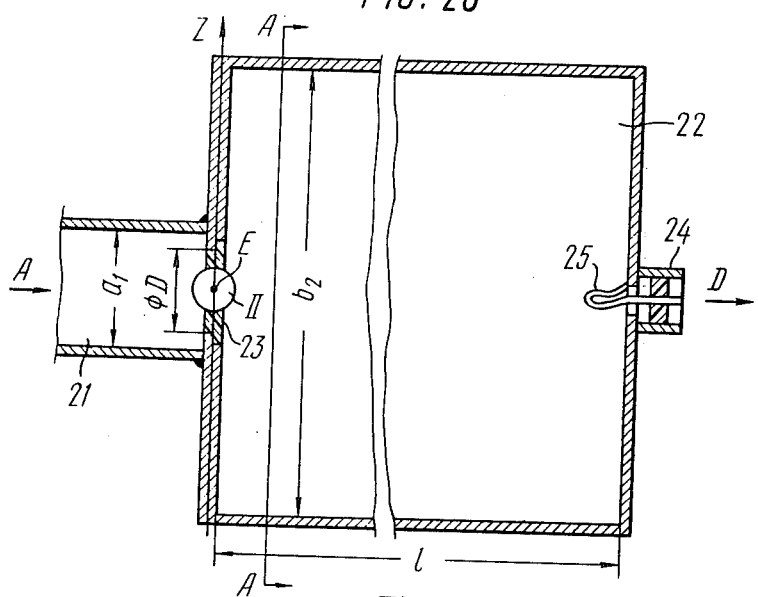

FIG. 20 and FIG. 21 are a schematic representation of another embodiment of the converter 12 (FIGS. 2, 7, 18) for converting amplitude-frequency-modulated waves. This converter comprises a rectangular metal waveguide 21, a cavity resonator 22, and a semiconductor element II. The cavity resonator 22 is a waveguide section short-circuited at its both ends or a coaxial transmission line short-circuited from the two ends. To make our example more concrete, the converter uses a cavity resonator 22 which is a section of a rectangular metal wavelength with its cross-section AA larger than the cross-section BB of the waveguide 21. The waveguide cross-section is generally assumed to be a cross-section normal to the longitudinal axis of symmetry of the entire waveguide. The input of the waveguide 21 is the A-input of the entire converter 21 (FIGS. 2, 7, 18). The output of the waveguide 21 is connected to the input of the cavity resonator 22 which is a slot of a diameter D in the metal wall of the cavity resonator 22 (FIG. 21). The slot is plugged with a disk 23 made from some dielectric material, for example, teflon or polystyrene. The disk 23 carries the semiconductor element II subjected to the effect of an external constant magnetic field $\overline{H}_{AO}$ which can, however, be adjusted with the aid of an electromagnet (FIG. 20).

In this embodiment of the converter 12 (FIGS. 20, 21), the input resonant system 12a (FIG. 7) comprises the rectangular metal waveguide 21 and the semiconductor element II. The output resonant system 12b (FIG. 7) of the converter 12 (FIGS. 20, 21) includes only the cavity resonator 22. The D-output (FIGS. 2, 7, 18) of the converter 12 (FIG. 21) is a coaxial output 24 of the cavity resonator 22. The spatial detection system 12c (FIG. 7) consists of the semiconductor element II (FIGS. 20, 21) and a waveguide section acting as the cavity resonator 22 disposed in the immediate vicinity of this semiconductor element. This embodiment of the converter 12 (FIGS. 20, 21) does not have the B- and C-inputs (FIG. 7) and, therefore, the local oscillator 13 (FIG. 18) and the filter 14 are not provided in the receiver (FIG. 18) containing the converter 12 (FIGS. 20, 21) under consideration.

The rectangular metal waveguide 21 (FIGS. 20, 21) has dimensions $a_1$ and $b_1$ determined by the average value $f_{SO}$ (FIG. 5b) of the carrier frequency $f_s$ of the incoming electromagnetic waves in the case of propagation of the dominant $H_{OI}$ wave in the waveguide 21 (FIGS. 20, 21). The dimensions $a_1$ and $b_1$ of the waveguide 21 are found from the conventional formulas (for example, A. F. Harvey, "Microwave Engineering", 1963, Academic press, London and New-York).

The semiconductor element II is made from a magnetic semiconductor material-ferrite. In our example, the ferrite of the converter 12 (FIGS. 20, 21) is shaped as a sphere. The centre E of this sphere coincides with the centre of the input slot of the cavity resonator 22 and with the centre of the disk 23 and lies on the longitudinal symmetry axis (FIG. 21) of the waveguide section forming the cavity resonator 22. The above centres may not necessarily lie on the longitudinal symmetry axis of the waveguide 21, for instance, when maximum coupling of the ferrite of the semiconductor element 11 with the waveguide 21 is secured by selecting optimum distances between the centre E of the ferrite sphere (FIGS. 20, 21) and the broad and, respectively, narrow walls of the waveguide 21. Maximum coupling of the semiconductor element II with the waveguide 21 is equivalent to the maximum absorption of the power of electromagnetic waves transmitted through the waveguide 21, in the ferrite.

The semiconductor element II may employ single-crystal ferrite with the relaxation frequency exceeding or approximately equal to the frequency $F_{gc}$ (FIG. 5b) — the rate of change of the carrier frequency $f_s$ of the eletromagnetic waves to be converted. The diameter of the ferrite sphere must be considerably smaller than the length of the electromagnetic waves transmitted through the waveguide 21 (FIGS. 20, 21). Thus, if the average carrier frequency $f_{so}$ of the input electromagnetic waves is $10^{10}$ Hz, the diameter of the ferrite sphere sphere must be about 1 mm. A more precise dimension of the ferrite sphere and also the location of the centre E of this sphere on the axis of the coupling slot between the waveguide 21 and the cavity resonator 22 are determined experimentally for a concrete design of the converter with a view to securing a required, in particular, maximum conversion coefficient in the converter. By the conversion coefficient here, like in the above cited cases, is meant the ratio of the output power of the electromagnetic waves to the input power of the electromagnetic waves. The surface of the ferrite sphere may be polished by pastes with a grain size of about I micron.

The magnitude of the constant, but adjustable magnetic field $\overline{H}_{AO}$ (the field is not shown in FIG. 21) must be such as to give rise to ferromagnetic resonance in the ferrite. If single-crystal isotropic ferrite is used, the intensity $H_{AO}$ of the external constant magnetic field $\overline{H}_{AO}$ is found from the formula $H_{AO} = (2\pi/\gamma)f_{SO}$, where $(\gamma/2\pi) = 2.8$ (MHz/oersted), and $f_{SO}$ is the average value of the carrier frequency $S_z$ of the incoming electromagnetic waves. In the case of single- or poly-crystal hexaferrite featuring oriented internal fields of crystal anisotropy, the intensity $H_{AO}$ of the external constant magnetic field $\overline{H}_{AO}$ for providing ferromagnetic resonance must be relatively small as compared with single- and poly-crystal isotropic ferrites. For magnetically saturated single- and poly-crystal hexaferrites in which the external constant magnetic field $\overline{H}_{AO}$ is oriented along the direction of easy magnetization of these hexaferrites, the intensity $H_{AO}$ (FIG. 20) is given by the expression: $H_{AO} = (2\pi/\gamma)f_{SO} - H_{an}$, where $H_{an}$ is the intensity of the oriented internal field of crystal anisotropy in hexaferrites. In the converter (FIGS. 20, 21) using the semiconductor element II made of poly-crystal hexaferrites displaying the property of residual magnetization in the absence of the external constant magnetic field $\overline{H}_{AO}$, the state of natural ferromagnetic resonance can be reached without any external constant magnetic field applied to such hexaferrites. Here, the magnetic moment density vector M (FIG. 8) will precess about easy magnetization axis of the hexaferrite oriented in the converter 12 (FIG. 20) along the Z-axis. The value of the natural ferromagnetic resonance frequency, in this case coincident with a required average value of the frequency $f_{so}$ of the electromagnetic waves to be converted is described by the formula: $(\gamma/2\pi) H_{an}$, where $H_{an}$ is the intensity of the oriented internal field of crystal anisotropy in a hexaferrite (see the reference above). In a further description of operation of the converter 42 (FIGS. 20, 21) consideration of the semiconductor element II will be restricted only a hexaferrite in the state of natural ferromagnetic resonance, i.e. when no external constant magnetic field $\overline{H}_{AO}$ is applied. The absence of the external constant magnetic field $H_{AO}$ in the converter implies that these converters can be designed only for converting the constant average values of the carrier frequencies $f_{so}$ of the incoming electromagnetic waves defined as shown in the above relation by the intensity $H_{an}$ of the internal field of fexaferrite crystal anisotropy oriented along the Z-axis. The diameter $\phi$ D of the coupling slot of the cavity resonator 22 in FIGS. 20 and 21 is larger than the diameter of the hexaferrite sphere. The value of the diameter $\phi$ D must satisfy the following two requirements. First of all, the diameter $\phi$ D must be as small as possible in order to minimize the effect of the characteristics of the cavity resonator 22 on the impedance $Z_A$ as seen looking into the A-input of the waveguide 21. On the other hand, the diameter $\phi$ D of this slot of the cavity resonator 22 must be as large as possible as compared with the diameter of the hexaferrite sphere for minimizing the effect of the metal waveguide walls closest to this sphere on the width of the ferromagnetic resonance line in the sphere. The diameter $\phi$ D of the coupling slot of the cavity resonator 22 can be made practically equal to, or even smaller than, the diameter of the hexaferrite sphere if the wall (or part of the wall) between the waveguide 21 and the cavity resonator 22 is made of dielectric and the surface of the latter facing towards the waveguide 21 is coated with a layer of silver, several microns thick.

The rectangular metal waveguide on which the cavity resonator 22 is based (FIGS. 20, 21) has dimensions $a_2$ and $b_2$ determined from the conventional microwave engineering formulas by the magnitude of the subcarrier frequency $F_{gc}$ (FIG. 5b) of the received electromagnetic waves, this frequency being the rate of variation of the electromagnetic wave carrier frequency (see, for example, A. F. Harvey, "Microwave Engineering", 1963, Academic Press, London and New-York). The narrow wall of the waveguide section acting as the cavity resonator 22 (FIG. 20, 21) is normal to the narrow wall of the waveguide 21 of the converter 12 under consideration and, according, the broad wall of the waveguide section serving as the cavity resonator 22 is normal to the broad wall of the waveguide 21.

The cavity resonator 22 is tuned to resonance at its natural frequency $f_D$ (FIG. 6) equal to twice the frequency $F_{gc}$ (FIG. 5b) which is the rate of change of the carrier frequency $f_s$ of the electromagnetic waves being converted. For carrying into effect the proposed method of converting the carrier frequency of the electromagnetic wave spectrum, the cavity resonator 22 (FIG. 21) can also be tuned to its natural resonance frequency equal to $4.F_{gc}$ or to its natural frequency equal to $6.F_{gc}$, etc. In other words, the cavity resonator 22 can be tuned to resonance at any natural frequency equal to $mF_{gc}$, where $m = 2,4,6,8,10 \ldots$ etc. As to the length (FIG. 21) of the cavity resonator 22, it is calculated on the basis of the well-known formula used in microwave engineering (see, for example, the same book A. F. Harvey, "Microwave Engineering", 1963, Academic Press, London and New-York).

The coaxial output 24 inside the cavity resonator 22 is connected to a conductor loop 25 which abstracts the energy of the converted electromagnetic waves from the cavity resonator 22. The surface of the loop 25 is parallel to the surface of the narrow wall of the waveguide acting as the cavity resonator 22 (FIGS. 20, 21) and perpendicular to the Z-axis.

The cavity resonator 22, as has already been pointed out, may also be a shorted coaxial line, i.e. a coaxial cavity. In this case, while selecting the length of such a coaxial cavity so that its natural resonance frequency equal to $2.F_{gc}$ is obtained, we at the same time automatically tune this coaxial cavity to its natural frequencies equal to $4.F_{gc}$, $6.F_{gc}$, $8.F_{gc}$, $10.F_{gc}$, etc. Therefore, in the cavity resonator 21 being a coaxial line, tuning of the output resonant system 12b (FIG. 7) of the converter 12 (FIG. 18) to the intermediate carrier frequency $f_{i2}$ equal to $2.F_{gc}$ always automatically tunes this resonant system 12b to the values of intermediate carrier frequency $f_{im}$ of the converted electromagnetic waves which are $4.F_{gc}$, $6.F_{gc}$, $8.F_{gc}$, etc. Thus, the output resonant system 12b (FIG. 7) of the converter 12 (FIG. 18) will be tuned simultaneously to all the values of the intermediate carrier frequency $f_{im} = mF_{gc}$, where $m = 2,4,6,8,10$, etc. corresponding to all the regions employed in the frequency spectrum of converted electromagnetic waves. Note that when the output resonant system 12b (FIG. 7) designed as a coaxial line, is tuned to the value of the intermediate carrier frequency $f_{i4}$ equal, say, to $4.F_{gc}$, this output resonant system 12b will be automatically tuned also to the values of the intermediate carrier frequency $f_{im}$ of the converted electromagnetic waves equal to $8.F_{gc}$, $12.F_{gc}$, $16.F_{gc}$, etc.

Consider the operation of the converter (FIGS. 20, 21) in the above embodiment of the invention, that is, the process of transmission of electromagnetic waves through the given converter 12 used for converting the periodically changing carrier frequency $f_s$ (FIG. 5b) of the frequency spectrum of amplitude-frequency-modulated waves, on the condition that $f_s = f_{so} + \Delta f_s$ $max.$ $\sin (2\pi F_{gc}t)$ and $f_A = f_{AC} = $ const., where $f_{so}$ is the average value of the time-varying carrier frequency $f_s$ in the frequency spectrum of the electromagnetic waves to be converted;

$\Delta f_{s\,max}$ = maximum amplitude of the time variations of the carrier frequency $f_s$ of the incoming electromagnetic wave spectrum;

$f_A$ = tuned resonance frequency of the impedance $Z_A$ as seen looking into the A-input of the converter;

$f_{AC}$ = constant value of the resonance frequency $f_A$.

The incoming electromagnetic waves are applied to the A-input of the waveguide 21 of the converter and transmitted along the waveguide to the semiconductor element II whose magnetic moments are affected only by the internal constant magnetic field as determined by the crystal anisotropy field and by the coercive force in a poly-crystal hexaferrite. It is also probable that these moments are affected both by the above internal field and the external constant magnetic field created by the source of an external magnetic field. The electromagnetic waves coming to the semiconductor element induce natural ferromagnetic resonance in the internal constant magnetic field (see, for instance, B. Lax, K. J. Button "Microwave ferrites and ferrimagnetics", McGraw-Hill Book Company, New York, 1962). Natural ferromagnetic resonance is characterized by the precessional motion of the magnetic moment density vector M (FIG. 8) around the direction of easy magnetization of the hexaferrite oriented along the Z-axis (FIG. 20). The frequency of this precessional motion depends on the time-varying carrier frequency $f_s$ (FIG. 5b) of the frequency spectrum of the electromagnetic waves to be converted, whereas the precession angle $\theta$-versus-time relationship (FIG. 8) is determined by the intensity of the magnetic field (power level) set up by the electromagnetic waves to be converted, the magnitude of the carrier frequency $f_s$ of these waves, and by the intensity of the oriented constant crystal anisotropy field of the hexaferrite. The value of the resonance frequency $f_A$ (FIG. 3) of the impedance $Z_A$ as seen looking into the A-input of the converter (FIGS. 20, 21) remains unchanged in time, i.e. satisfies the above relation $f_A = f_{AC}$ = const.

This value of the resonance frequency $f_A$ is determined only by the intensity $H_{an}$ of the oriented internal crystal anisotropy field of the hexaferrite, with $f_A = f_{AC} = (\delta/2\pi)H_{an}$. The maximum amplitude of a change of the precession angle $\theta$ (FIG. 8) in a required conversion mode is secured when the resonance frequency $f_{AC}$ (FIG. 3) of tuning the impedance $Z_A$ as seen looking into the A-input of the converter (FIGS. 20, 21) equals to the average value of the carrier frequency $f_{so}$ of the incoming electromagnetic wave spectrum, i.e. when $f_A = f_{SO}$. Assuming for convenience that the carrier frequency $f_s$ of the frequency spectrum of the amplitude-frequency-modulated electromagnetic waves does not change with time, the nature of the precessional motion of the magnetic moment density vector M (FIG. 8) will depend only on the power level of the received electromagnetic waves. Since apart from intelligence-carrying amplitude modulation, the amplitude-frequency-modulation electromagnetic waves to be converted are also characterized by time variations of their carrier frequency $f_s$, the precession angle $\theta$ (FIG. 8) will additionally undergo periodic variations at a rate which is a multiple of the carrier frequency $F_{gc}$ with which the carrier frequency $f_s$ of the electromagnetic waves is changing in time. The subcarrier frequency $F_{gc}$ is selected so as to be equal to, or smaller than, the relaxation frequency of the hexaferrite used in the converter 12. The value of the maximum amplitude modulation frequency of the amplitude-frequency-modulated waves must be at least five or ten times smaller than the value of the subcarrier frequency $F_{gc}$ which is a rate of change of the carrier frequency $f_s$ of the received electromagnetic waves. In this embodiment of converter 12, a periodic time dependence of the difference between the resonance frequency $f_A$ of the impedance $Z_A$ of the converter 12 and the carrier frequency $f_s$ of the received electromagnetic waves required for operation of the converter 12, i.e. a periodic time dependence of the difference $\Delta f_{AS} = f_A - f_S$ (FIG. 3) is made possible due to periodic time changes of the carrier frequency $f_s$ with $f_A = f_{AC}$ = const. Thus, we obtain a required change of the electromagnetic energy stored in the input resonant system 12a of the converter 12, the modulation frequency of this energy being a multiple of the value of the subcarrier frequency $F_{gc}$.

In the converter (FIGS. 20, 21) the functions of the external constant magnetic field $H_{AO}$ are performed by the oriented internal crystal anisisotropy field $H_{an}$ of the hexaferrite directed along the Z-axis as determined by appropriate alignment of the crystal lattice axes of the hexaferrite secured in the disk 23 of the converter 12.

Spatial detection in the converter (FIGS. 20, 21) is effected with the aid of the hexaferrite and a section of the waveguide 21 (which may be a coaxial line section) located in the immediate vicinity in this hexaferrite and serving as the output resonant system 12b (FIG. 7). This spatial detection phenomenon occurs as follows. The incoming electromagnetic waves acting on the hexaferrite (FIGS. 20, 21) cause periodic time changes in the magnitude of the precession angle $\theta$ (FIG. 8) which, in its turn, leads to a periodic time change in the value of the projection $M_z$ of the magnetic moment density vector M of this hexaferrite (FIGS. 20, 21) onto the Z-axis direction. Further, electromagnetic waves caused by periodic time changes of the magnetization $M_Z$ are detected by means of the cavity resonator 22 (FIGS. 20, 21) which sets up electromagnetic oscillations with the surface of their magnetic lines of force parallel to the broad wall of the waveguide 21 acting as the cavity resonator 22. If the output resonant system 12b (FIG. 7) of the converter 12 is a shorted coaxial line section, i.e. a coaxial cavity, electromagnetic oscillations in the cavity appear under the effect of time variations of the value $M_z$ (FIG. 8). Detection of the electromagnetic oscillations caused by the changes in $M_Z$ is essentially spatial detection in this concrete embodiment of the converter 12. Due to the resonance relationship of the resistive component $R_A$ (FIG. 3) of the impedance $Z_A$ as seen looking into the A-input (FIGS. 20, 21) of the converter 12, electromagnetic oscillations arising in the cavity resonator 22 will have the carrier frequency given by $f_{im} = mF_{gc}$, where $m = 2,4,6\ldots$, and $F_{gc}$ is the constant value of the subcarrier frequency or, which is the same, the frequency of variation of the carrier frequency $f_S$ of the electromagnetic waves applied to the A-input of the converter 12.

Figure 11:
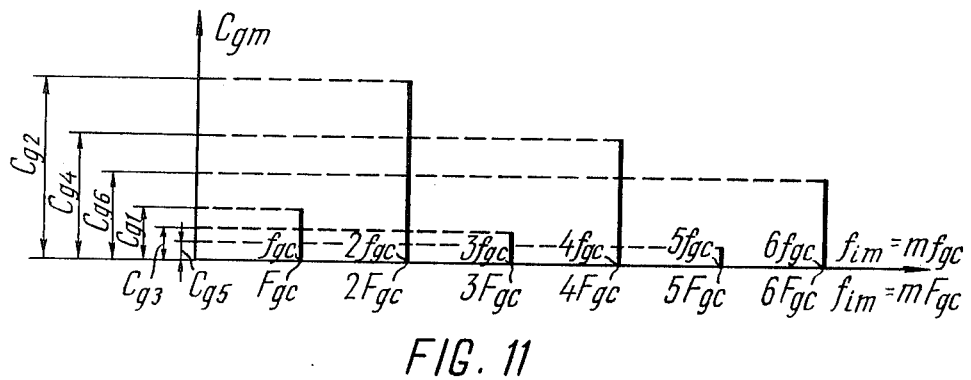
FIG. 11 illustrates a frequency spectrum of converted electromagnetic signals at the D-output of the converter when monochrome electromagnetic waves are fed to its A-input and auxiliary electromagnetic waves are delivered to its auxiliary B-input, according to the invention.
Figure 14:
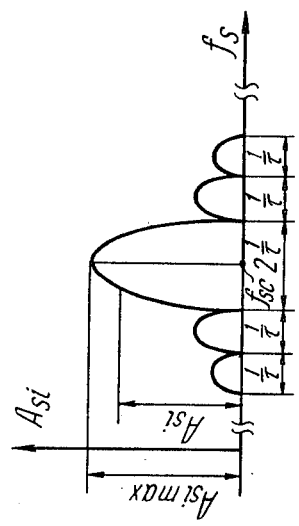
FIG. 14 shows the envelope of the frequency spectrum of amplitude-modulated electromagnetic pulses as applied to the A-input of the converter, according to the invention.
Figure 15:
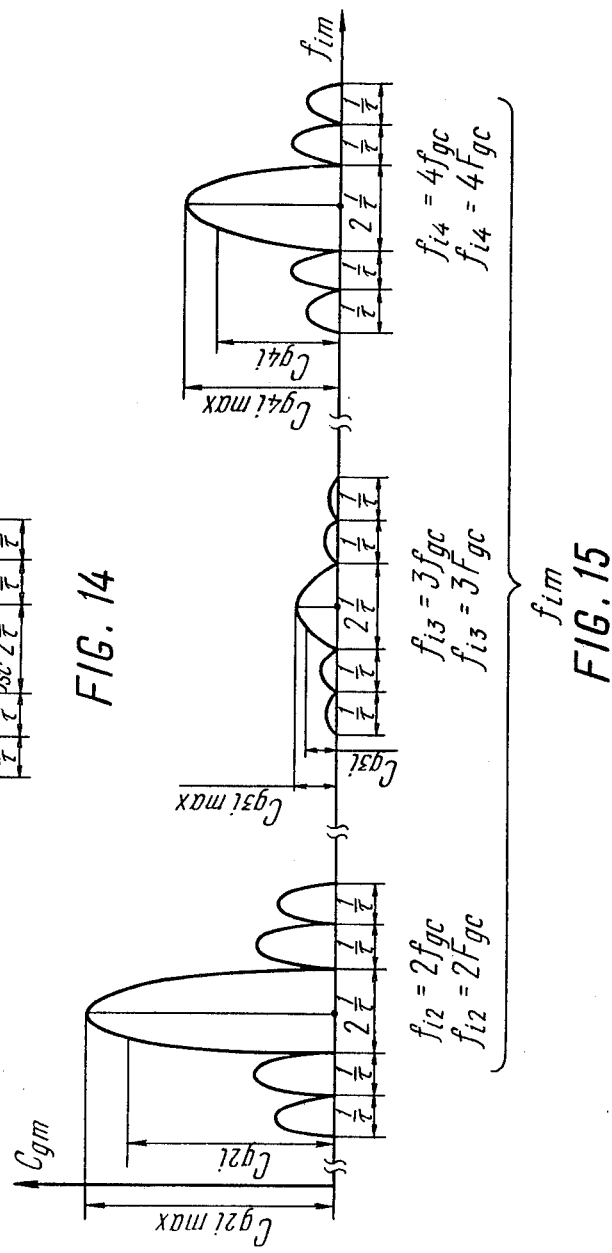
FIG. 15 shows the envelopes of different regions in the frequency spectrum of converted electromagnetic waves at the D-output of the converter when amplitude-modulated electromagnetic pulses are applied to its A-input, and auxiliary electromagnetic waves are delivered to the auxiliary B-input, according to the invention.

When tuned to its natural resonance frequency $f_D$ (FIG. 6) equal to $2.F_{gc}$, the cavity resonator 22 (FIGS. 20, 21) included in the output resonant system 12b (FIG. 7) selects in the frequency spectrum of the converted electromagnetic waves a spectral region with the intermediate carrier frequency $f_{l2}$ equal to $2.F_{gc}$ (see, for example, FIGS. 11, 13). If tuned to resonance at the natural frequency $f_D$ (FIG. 6) equal to $4.F_{gc}$, the cavity resonator 22 (FIGS. 20, 21) detects a spectral region with the intermediate carrier frequency $f_{l4}$ equal to $4.F_{gc}$ (FIGS. 11, 13). Similarly, in case the natural resonance frequency of the cavity resonator 22 (FIGS. 20, 21) is $f_D$ (FIG. 6) equal to $6.F_{gc}$, the resonator isolates in the frequency spectrum of the converted electromagnetic waves a region having the intermediate carrier frequency $f_{i6}$ equal to $6.F_{gc}$ (FIGS. 11, 13), etc. The frequency bandwidth $\Delta F_D$ (FIG. 6) of the resonator 22 (FIGS. 20, 21) is made equal to the bandwidth of the frequency spectrum (see, for instance, FIG. 12) of the electromagnetic waves applied to the A-input of the converter 12 (FIGS. 20, 21) regardless of the value of $m$. The converted electromagnetic waves are taken out of the cavity resonator 22 (FIGS. 20, 21) with the aid of the conductor loop 25 and the coaxial output 24.

Thus, the converter 12 converts the carrier frequency $f_s$ (FIG. 18) of the frequency spectrum of the electromagnetic waves applied to the A-input of this converter 12, or, rather, substututes the carrier frequency $f_S$ (FIG. 18) by the intermediate carrier frequency $f_{im}$ which in this concrete case is a multiple of the subcarrier frequency $F_{gc}$ or, which is the same, to the rate of change of the carrier frequency $f_s$ of the received electromagnetic waves.

It should be pointed out that in the output resonant system 12b (FIG. 7) of the converter 12 made, similar to the latter embodiment, as a shorted coaxial line section, in other words, as a coaxial cavity, tuning to the intermediate carrier frequency $f_{i2}$ equal to $2.F_{gc}$ automatically tunes the resonator to all the other values of the intermediate carrier frequency $f_{im} = mF_{gc}$, where $m = 4,6,8,10, \ldots$ etc. In other words, in this case we obtain the maximum possible power simultaneously in all the regions of the converted electromagnetic wave spectrum.

Various types of the converter may employ components of different designs. Thus, for instance, the components of the converter 12 intended for measuring the energy of amplitudemodulated electromagnetic waves propagating through the waveguide 15 (FIG. 19) may be of different design as compared with the same converter used with the waveguide 21 (FIGS. 20, 21). In the converter 12 (FIG. 2) illustrated in FIG. 22 the electromagnetic energy is fed to the semiconductor element II along the waveguide 21 similar to the converter of FIGS. 20, 21. The semiconductor element II may be placed either in the end wall or in the side wall of the waveguide 21. With a view to increasing the intensity of the elecetromagnetic field at the semiconductor element II at the fixed carrier frequency $f_s$ of the electromagnetic waves being converted, the waveguide 21 may be replaced by a cavity resonator based, for example, on the same waveguide 21.

Figures 22, 23:
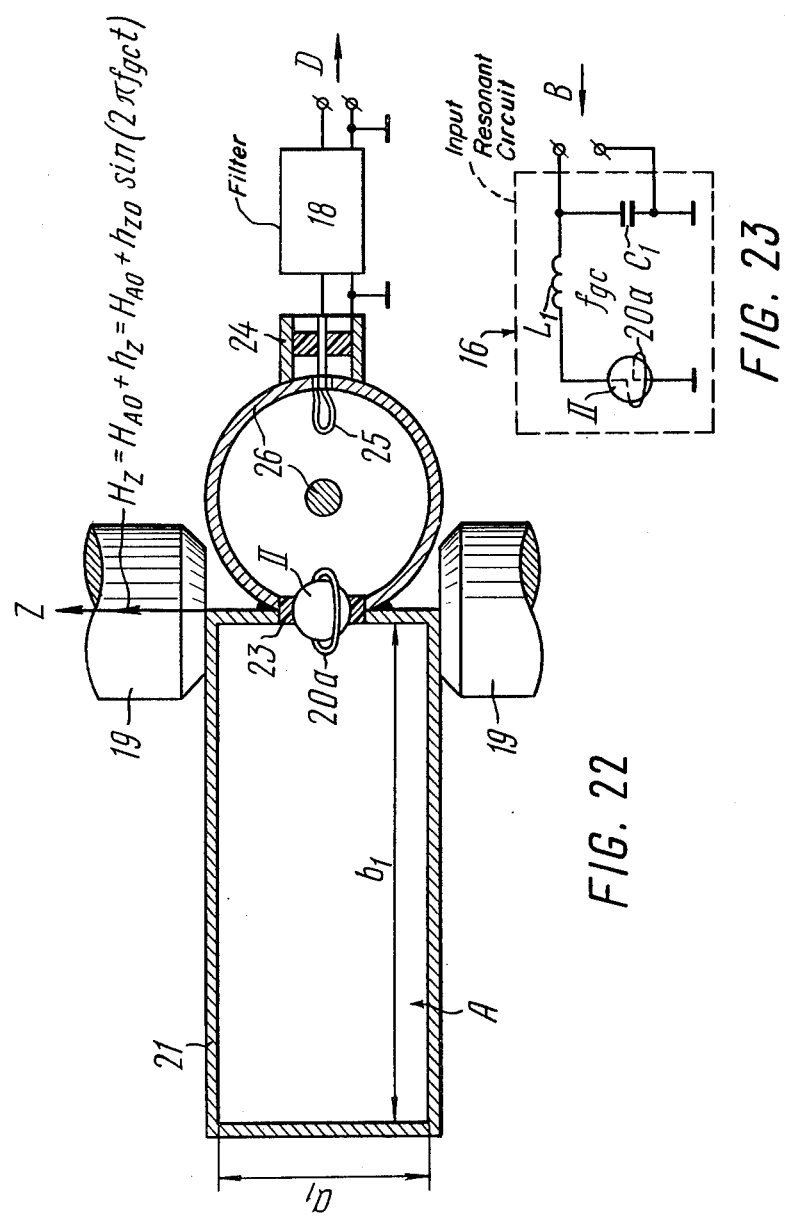
FIG. 23 shows an input resonant circuit of the converter of FIG. 22, according to the invention.

Similar to the loops 20a of the input resonant circuit 16 of the converter (FIG. 19), the identical conductor loops 20a of the input resonant circuit 16 (FIG. 23) are disposed in the vicinity of the semiconductor element II (FIG. 22). The input resonant circuit 16 (FIG. 23) is identical with the input resonant circuit 16 of FIG. 19. The input resonant circuit 16 (FIG. 23) comprises the same components: the inductor $L_1$ and the capacitor $C_1$, the leads of the loops 20a being passed through the disk 23 secured in the narrow wall of the waveguide 21 and series-connected to the inductor $L_1$ and the capacitor $C_1$. The terminals of the capacitor $C_1$ (FIG. 23) serve as an additional B-input of the converter 12 (FIGS. 2,7,18). The semiconductor element II (FIG. 22) employed as an isotropic ferrite which may be, for example, a single-crystal yttrium-iron or calcium-bismuth-vanadium garnet or some other single-crystal isotropic ferrite with a wide ferromagnetic resonance band. The ferrite is made in the form of a sphere and secured in the narrow wall of the waveguide 21 (FIG. 22) (when measuring incident energy, it may also be fastened in the end wall of the waveguide). The diameter of the ferrite sphere must be such as to provide matching of the sphere with the waveguide 21 and the output resonant system of the converter 12 under consideration. The ferrite is acted upon by the external constant magnetic field $\overline{H}_{AO}$ induced by the source 19, similarly to the external constant magnetic field $\overline{H}_{AO}$ applied to the ferrite of the converter 12 of FIG. 19. In the converter illustrated in FIG. 22, the output resonant system 12b (FIG. 7) is a cavity resonator built on a coaxial line section 26 in the same manner as that of the converter illustrated in FIGS. 20, 21. At the ends of the coaxial line section 26 (FIG. 22) are provided shorting plungers (not shown in FIG. 22) which are movable along the symmetry axis of this coaxial line section 26 (see the reference above). The shorting plungers are used in order to secure the optimum coupling of the ferrite of the semiconductor element II with the cavity resonator built on the above coaxial line section 26 with a view to adjusting the cavity resonator to a selected sequence of values of $m$ for the intermediate carrier frequency $f_{im} = mf_{gc}$, where $m = 2,4,6,8,10, \ldots$ etc., and $f_{gc}$ is the carrier frequency of the auxiliary electromagnetic waves applied to the auxiliary B-input of the converter (FIG. 22) under consideration. The above sequence of the values of $m$ may start from any number, i.e. from 2,4,6,8,10, etc. For reducing the length of the coaxial line section 26, lumped-constant elements may be used, such as adjustable and non-adjustable capacitors and inductors. Ferrites with magnetically-controlled characteristics may also be employed for periodic retuning of the cavity resonator 26a built on the coaxial line section 26.

The D-output (FIGS. 2,7,18) of the converter illustrated in FIG. 22 is the output of the additional filter 18 which receives electromagnetic waves from the coaxial output 24 of the coaxial cavity in the converter 12 under consideration. The additional filter 18 in this case rejects additionally, if necessary, electromagnetic waves having a carrier frequency equal to the carrier frequency $f_{gc}$ of the auxiliary electromagnetic waves, similar to the converter 12 (FIG. 19). The coaxial output 24 (FIG. 22) is identical with that illustrated in FIG. 21. The coaxial output 24 (FIG. 22) is connected to the conductor loops 25 with the loop surface normal to the magnetic lines of force of the electromagnetic waves in the short-circuited coaxial line section 26. The loop 25 is intended for abstracting the energy of the converted electromagnetic waves out of the coaxial cavity. The loop 25 is located at a maximum possible distance from the loops 20 along the coaxial line section 26 with a view to attenuating direct electromagnetic coupling between these loops.

Preparation of the received electromagnetic waves in the converter illustrated in FIG. 22 is similar to their passage through corresponding converters illustrated in FIGS. 19,20,21 described above.

Let us consider passage of electromagnetic waves through the converter 12 (FIG. 22) used for converting the time-constant value of the carrier frequency $f_s$, $mf_{sc}$ = const in the frequency spectrum of amplitude-modulated electromagnetic waves. The electromagnetic waves come to the A-input of the waveguide 21 of the converter 12 and propagate through this waveguide to reach the ferrite of the semiconductor element II.

The ferromagnetic resonance in the ferrite (see the reference above) is characterized by the magnetic moment density vector $\overline{M}$ (FIG. 8) precessing about the direction of the intensity of the constant magnetic field $\overline{H}_{AO}$ created by the source 19 (FIG. 22) and oriented along the Z-axis. The frequency of this precessional motion is determined by the magnitude of the carrier frequency $f_{sc}$ of the electromagnetic waves being converted, while the steady-state value of the precession angle $\theta$ depends on the power level of these waves at certain values of the intensity $H_{AO}$ and the frequency $f_{sc}$. The value of the resonance frequency $f_A$ (FIG. 3) of the impedance $Z_A$ as seen looking into the A-input of the converter (FIG. 22) is dependent on the intensity of the constant magnetic field $\overline{H}_{AO}$ (FIGS. 8, 22). On condition that the intensity $H_{AO}$ satisfies the above relation $H_{AO} = 2\pi/\gamma f_{sc}$, the resonance frequency $f_A$ (FIG. 3) of the impedance $Z_A$ as seen looking into the A-input of the converter (FIG. 22) will be equal to the carrier frequency $f_{sc}$ of the frequency spectrum of the received electromagnetic waves, i.e. $f_A = f_{sc} = \gamma/2\pi\ H_{AO}$. In this case, a matched termination or a shorting plunger of the waveguide 21 is provided at the output of the waveguide 21 (this output is disposed at the waveguide and opposite to the A-input). With $f_A = f_{SC}$, the precession angle $\theta$ (FIG. 8) has its maximum value as determined by the power level of incoming the electromagnetic waves. Due to amplitude modulation imposed on the incoming electromagnetic waves, the precession angle $\theta$ will change with time in accordance with the change of the intensity of the magnetic component in the field set up by the received electromagnetic waves.

Let us apply auxiliary electromagnetic waves having the constant carrier frequency $f_{gc}$ to the auxiliary B-input (FIG. 23) of the converter (FIG. 22). If the semiconductor element II of the converter 12 is made of a ferrite of the calcium-bismuth-vanadium or yttrium-iron garnet type, the carrier frequency $f_{gc}$ of the auxiliary electromagnetic waves may range from fractions of one hertz to several megahertz. In this range the magnitude of the carrier frequency $f_{gc}$ of the auxiliary electromagnetic waves must be such as to exceed by at least 5 or 10 times the maximum amplitude modulation frequency of the amplitude-modulated electromagnetic waves that is taken into account in the calculations. The input resonant circuit 16 (FIG. 22) of the input resonant system 12a of the converter 12 is tuned to the constant value of the resonance frequency equal to the carrier frequency $f_{gc}$ of the auxiliary electromagnetic waves by adjusting the inductance of the inductor $L_1$ and the capacitance of the capacitor $C_1$. Then, the amplitude $h_{zo}$ of the magnetic field induced by the conductor loops 20a (FIGS. 22, 23) of the input resonant circuit 16 along the Z-axis, must be equal to several oersteds. A more accurate value of the amplitude $h_{zo}$ (FIG. 22) is set during adjustment of the entire converter 12 by selecting the optimum amplitude value in order to ensure the maximum power of the converted electromagnetic waves at the D-output of the converter 12 under consideration. The variable magnetic field induced by the conductor loops 20a along the Z-axis having the intensity $h_z = h_{zo} \sin(2\pi f_{gc}t)$, where $h_{zo}$ is the amplitude of the intensity of this magnetic field, adds to the external constant magnetic field $\overline{H}_{AO}$ directed along the same Z-axis to form a resultant magnetic field with the intensity $H_z = H_{AO} + h_z$. Periodic time variations of the intensity $H_z$ of the resultant magnetic field cause periodic time changes of the resonance frequency $f_A$ (FIG. 5a) of the impedance $Z_A$ as seen looking into the A-input of the converter 12 (FIG. 22) meeting the following condition:

$$f_A = \gamma/2\pi\ H_z = \gamma/2\pi\ H_{AO} + \gamma/2\pi h_{zo}\sin(2\pi f_{gc}t).$$

Figure 3:
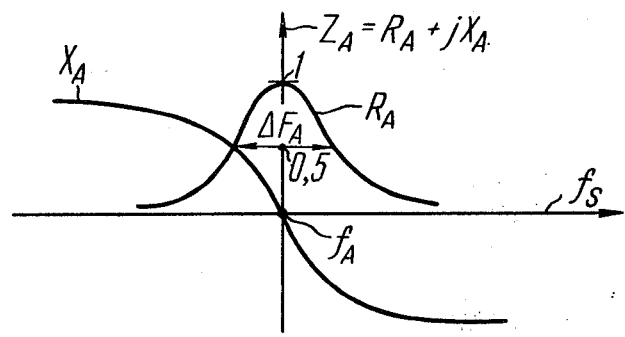
FIG. 3 shows the response curves of the resistive component $R_A$ and reactive component $X_A$ of the converter impedance $Z_A$ as seen looking into the A-input in the absence of auxiliary electromagnetic waves at an auxiliary B-input and of additional electromagnetic waves at a C-input, according to the invention.
Figure 4:
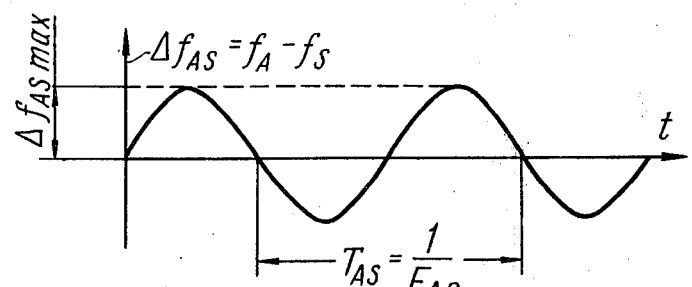
FIG. 4 shows the time-response curve of the difference $\Delta f_{AS}$ between the resonance frequency $f_A$ of tuning the converter impedance $Z_A$ as seen looking into the A-input and the carrier frequency $f_s$ of the spectrum of electromagnetic waves which are applied to this A-input, according to the invention.

In the description of the proposed conversion method, the relationship for the resonance frequency $f_A$ (FIG. 5a) was given in the form: $f_A(t) = f_{AO} + \Delta f_{A\ max}\sin(2\pi f_{gc}t)$, where $f_{AO}$ is the average value of the time-varying resonance frequency $f_A$ (FIG. 3) of the impedance $Z_A$ of the converter 12 (FIGS. 2,7,18), and $f_{A\ max}$ (FIG. 5a) is the maximum amplitude of the time variation of this resonance frequency $f_A$ (FIG. 3). The last two equaltions show that for the concrete embodiment of the converter (FIG. 22) being considered, we have $f_{AO} = \gamma/2\pi\ H_{AO}$ and $\Delta f_{A\ max} = \gamma/2\pi h_{zo}$, where $H_{AO}$ is the intensity of the external constant magnetic field along the Z-axis, and $h_{zo}$ is the amplitude of the intensity of the variable magnetic field induced by the conductor loops 20a. A periodic change in the resonance frequency $f_A$ (FIG. 5a) of the impedance $Z_A$ as seen looking into the A-input of the converter (FIG. 22) causes a periodic time change of the difference $f_{AS}$ (FIG. 4) between the above resonance frequency $f_A$ and the carrier frequency $f_s$ of the received electromagnetic wave spectrum. In this way, the input electromagnetic energy stored in the input resonant system 12a of the converter 12 is changed as required, the modulation frequency of this energy being a multiple of the carrier frequency $f_{gc}$ of the auxiliary electromagnetic waves applied to the auxiliary B-input of this converter 12 (FIG. 22). Spatial detection in the converter 12 (FIG. 22) is carried out with the aid of a coaxial line section disposed in the immediate vicinity of the ferrite of the semiconductor element II and used as the output resonant system 12b (FIG. 7). Spatial detection is effected as follows. The combined action of the electromagnetic waves to be converted and auxiliary electromagnetic waves on the ferrite (FIG. 22) causes periodic time changes in the magnitude of the precession angle $\theta$ (FIG. 8) which in turn, results in a periodic time change in the magnitude of the projection $M_z$ of the magnetic moment density vector M of the ferrite onto the Z-axis. In further operation, electromagnetic waves which appear as a result of changes in $M_z$ are isolated by means of a coaxial cavity 26a (FIG. 22) built on a short-circuited section of this coaxial line 26. Electromagnetic waves arise in the coaxial line. Isolation of the electromagnetic oscillations caused by changes in $M_z$ is essentially what is called spatial detection in this concrete embodiment of the converter (FIG. 22). Due to the resonance nature of the relationship of the resistive component $R_A$ (FIG. 3) of the impedance $Z_A$ as seen looking into the A-input (FIG. 22) of the converter 12, electromagnetic oscillations set up in the coaxial cavity 26a will have the carrier frequency of the type $f_{im} = mf_{gc}$, where $m = 2,4,6,\ldots$ etc. and $f_{gc}$ is a constant value of the carrier frequency of the auxiliary electromagnetic waves applied to the auxiliary B-input (FIG. 23) of the converter (FIG. 22).

If the resonance frequency $f_D$ (FIG. 6) of the coaxial cavity 26 (FIG. 22) included in the output resonant system 12b (FIG. 7) equals $2.f_{gc}$, the coaxial cavity 26 isolates all the regions in the frequency spectrum of the converted electromagnetic waves that have the intermediate carrier frequencies equal to $2.f_{gc}, 4.f_{gc}, 6.f_{gc}, 8.f_{gc}$, etc. This is accounted for by the fact that tuning of the coaxial cavity 26 (FIG. 22) to electromagnetic wave resonance at the frequency $2.f_{gc}$ automatically adjusts it to the resonance of electromagnetic waves having the frequencies $4.f_{gc}$, $6.f_{gc}$, $8.f_{gc}$, etc. If the resonance frequency $f_D$ (FIG. 6) of the coaxial cavity 26 (FIG. 22) is equal to $4.f_{gc}$, this cavity isolates the regions in the converted electromagnetic wave spectrum which have the intermediate carrier frequencies of $8.f_{gc}$, $12.f_{gc}$, $16.f_{gc}$, etc. The frequency bandwidth $\Delta F_D$ (FIG. 6) of the coaxial cavity 26 (FIG. 22) becomes equal to the bandwidth of the frequency spectrum (see, for example, FIG. 12) of the received electromagnetic waves. The converted electromagnetic waves are taken out of the coaxial cavity 26 (FIG. 22) by means of the conductor loop 25 and the coaxial output 24. These waves may further be passed through the additional filter 18 which blocks additionally electromagnetic waves with the frequency equal to the carrier frequency $f_{gc}$ of the auxiliary electromagnetic waves.

It is important to point out that by tuning the coaxial cavity 26 to the intermediate carrier frequency $f_{im} = m f_{gc}$ at the largest possible values of $m$, in other words, by tuning the output resonant system 12b (FIG. 7) so that its resonance frequency $f_D$ (FIG. 6) has a maximum deviation from the carrier frequency $f_{gc}$ of the auxiliary electromagnetic waves, it is possible to reduce direct passage of these auxiliary electromagnetic waves through the given output resonant system 12b (FIG. 7). This latter advantage permits lowering of the requirements to be met by the electromagnetic characteristics of the additional filter 18 (FIG. 22) or makes this filter altogether redundant. Direct passage of auxiliary electromagnetic waves can also be reduced in a considerably larger degree if, apart from making the frequency $f_D$ differ from $f_{gc}$ as much as possible, the converter 12 (FIG. 22) employs a waveguide cavity resonator rather than a coaxial cavity. The waveguide cavity resonator may be based on a waveguide of dimensions beyond critical values (see the reference above) for auxiliary electromagnetic waves with the carrier frequency equal to $f_{gc}$.

Thus, the converter 12 (FIG. 22) converts the carrier frequency $f_s$ (FIG. 18) in the frequency spectrum of the electromagnetic waves applied to the A-input of this converter, or, to put it more precisely, substitutes this frequency $f_s$ by the intermediate carrier frequency $f_{im}$ which in this concrete example is a multiple of the carrier frequency $f_{gc}$ of the auxiliary electromagnetic waves.

Let us now proceed to the examples of embodiments of the converters 12 (FIG. 7) with higher power conversion coefficients as compared with those described above. Consider the embodiment of the converter schematically shown in FIG. 24. This converter, similar to other embodiments described above, comprises: the input resonant system 12a (FIGS. 7, 24), with the A-input receiving the electromagnetic waves at the carrier frequency $f_s$, and the auxiliary B-input intended for accepting auxiliary electromagnetic waves with the carrier frequency $f_{gc}$; the output resonant system 12b with the D-output for taking off converted electromagnetic waves having the intermediate carrier frequency $f_{im}$ which is a multiple of (or, in a special case, equal to) the frequency $f_{gc}$ of the auxiliary electromagnetic waves; and, finally, the spatial detection system 12c which couples the input resonant system 12a and the output resonant system 12b of the converter 12. The input resonant system 12a and the spatial detection system 12c are sections of the same metal waveguide 27 of, say, rectangular cross-section. A partition 28 and a partition 29 divide the waveguide 27 into an input portion, a cavity resonator 30, and an output portion. The partitions 28 and 29 are metal diaphragms with coupling slots. The partitions 28 and 29 are disposed in the transverse cross-sections of the waveguide 27. The second partition 29 can be made as a dielectric slug also located transverse to the waveguide axis and acting as a filter in the way of waves propagating in this waveguide 27. A section of the waveguide 27 (FIG. 24) from its input which is the A-input of the entire converter 12 to the first partition 28 is the input portion of the waveguide 27. The coupling slot of the first partition 28 is plugged with the disk 23 made of some dielectric material in which a semiconductor element IIa is secured. This semiconductor element IIa is a sphere of single- or poly-crystal ferrite in the state of ferromagnetic resonance. The ferrite sphere is fastened in the disk 23 similar to the some arrangement in the converter 12 of FIG. 22. The ferrite sphere (FIG. 24) is placed inside a constant magnetic field with the intensity $H_{AO}$ produced by the source 19. The source 19 is located outside the waveguide 27 and is a permanent magnet and/or electromagnet. The ferrite sphere is surrounded with the conductor loops 20a intended to create a variable magnetic field $h_z$ associated with the auxiliary electromagnetic waves with the carrier frequency $f_{gc}$ and directed along the Z-axis. The leads of the conductor loops 20a are seriesconnected through the narrow wall of the rectangular metal waveguide 27 to the inductor $L_1$ and the capacitor $C_1$ placed outside the waveguide 27. The loops 20a, the inductor $L_1$ and the capacitor $C_1$ form the input resonant circuit 16. The terminals of the capacitor $C_1$ of which one is connected to the body of the waveguide 27 act as the auxiliary B-input (FIG. 24) of the converter 12 (FIGS. 2,7,18,24). The body of the waveguide 27 is earthed. The converter employes one more semiconductor element IIb which is a varactor diode disposed between the first partition 28 and the second partition 29 in the resonator 30 having its natural resonance frequency determined by the frequency of other auxiliary electromagnetic waves. The varactor diode is so positioned in the waveguide 27 that the impedance in the transverse cross-section BB of this waveguide 27 (the cross-section BB is drawn between the varactor diode and the partition 28) as seen looking into the varactor diode equals to the wave impedance of the waveguide 27 in the broadest possible range of the carrier frequencies $f_s$ of the incoming electromagnetic waves. In other words, the varactor diode with due account of the effect of the second partition 29 must be coupled with the empty waveguide. One varactor diode terminal is connected to the body of the waveguide 27, and the other terminal is taken via the broad wall of the waveguide 27 to a tuned $R_1 C_3$-circuit located outside the waveguide 27 and is connected through an adjustable resistor $R_2$ to the source $E_A$ of a constant electric field. The second lead of the source $E_A$ is connected to the body of the waveguide 27. The above tuned $R_1 C_3$ circuit comprises a resistor $R_1$ and a capacitor $C_3$. One lead of the resistor $R_1$ and one terminal of the capacitor $C_3$ are interconnected and their common point is coupled to the aforementioned second terminal of the varactor. The second lead of the resistor $R_1$ and the second terminal of the capacitor $C_3$ are interconnected and their common point is connected to the body of the waveguide 27. The natural resonance frequency of the resonator 30 in the concrete waveguide 27 is determined, in the first place, by a distance between the first partition 28 and the second partition 29, and also by the varactor diode impedance. The natural resonance frequency of the resonator 30 must lie outside the working range of the carrier frequencies $f_s$ of the electromagnetic waves applied to the A-input of the waveguide 27. The natural resonance frequency of the resonator 30 can by adjusted by conventional tuners, such as a capacitance probe 31 (more than one probes can be used). In the output portion of the waveguide 27 enclosed between the partition 29 and a shorting plunger 34 of the waveguide 27 there is an additional semiconductor element IIc in the form of a crystal detector. One terminal of the crystal detector is connected to the body of the waveguide 27, while the other terminal of the crystal detector is coupled through the broad wall of the waveguide 27 to another tuned $R_4C_5$-circuit and through an adjustable resistor $R_3$ to another source $E_C$ of a constant electric field. The other lead of the source $E_C$ is connected to the body of the waveguide 27. The aforementioned other tuned $R_4C_5$-circuit consists of a resistor $R_4$ and a capacitor $C_5$. One lead of the resistor $R_4$ and one terminal of the capacitor $C_5$ are interconnected and their common point is connected to the second terminal of the crystal detector. The second lead of the resistor $R_4$ is connected to the second terminal of the capacitor $C_5$ and they both are coupled to the body of the waveguide 27. A directional coupler 33 is connected to the output portion of the waveguide 27 in such a manner that the entire electromagnetic energy produced by a spatial detection system generator 32 transmitted through the waveguide is directed towards the partition 29. The resonator 30 separated from the rest of the waveguide 27 by this partition 29 can be tuned by one of the two possible methods. The first method consists in making the natural frequency of the resonator 30 precisely equal to the value of the carrier frequency of the other auxiliary electromagnetic waves produced by the generator 32 of the spatial detection system. The other method of tuning is that the natural resonance frequency of the resonator 30 is selected such as to be somewhat different from this carrier frequency of the other auxiliary electromagnetic waves. The carrier frequency of the other auxiliary electromagnetic waves must, nevertheless, remain within the resonance portion of the resistive component curve in the impedance of the resonator 30 as seen looking into the partition 29. At the frequency of the other electromagnetic waves generated by the generator 32, the impedance of the waveguide section accommodating the crystal detector and the shorting plunger 34 of the waveguide 27 possesses only the resistive component the magnitude of which is equivalent to the wave impedance of the unactivated waveguide.

In the preferred embodiment of the converter the output resonant system 12b is an oscillatory $L_3C_6$-circuit. The terminal of the inductor $L_3$ and capacitor $C_6$ included in this circuit are interconnected and their junction is coupled to the second terminal of the aforementioned capacitor $C_4$. The other terminal of this inductor $L_3$ and the other terminal of the capacitor $C_3$ are interconnected and their junction is also coupled to the body of the waveguide 27. In this way, the oscillatory $L_3C_6$-circuit of the output resonant system 12b is connected through the capacitor $C_4$ to the crystal detector; in some cases, this $L_3C_6$-circuit can also be coupled directly to the crystal detector.

The output resonant system 12b is constantly tuned to resonance at its natural resonance frequency equal to the intermediate carrier frequency $f_{im}$ of the converted electromagnetic waves. In its turn, this intermediate carrier frequency $f_{im}$ is a multiple of the carrier frequency $f_{gc}$ of the auxiliary electromagnetic waves applied to the auxiliary B-input of the input resonant system 12a of the converter, i.e. $f_{im} = mf_{gc}$, where $m = 1,2,3,4, \ldots$ etc.

The terminal of the capacitor $C_6$ are the D-output for the entire converter and give out the aforementioned converted electromagnetic waves having the carrier frequency equal to $f_{im} = mf_{gc} =$ const.

Figure 24:
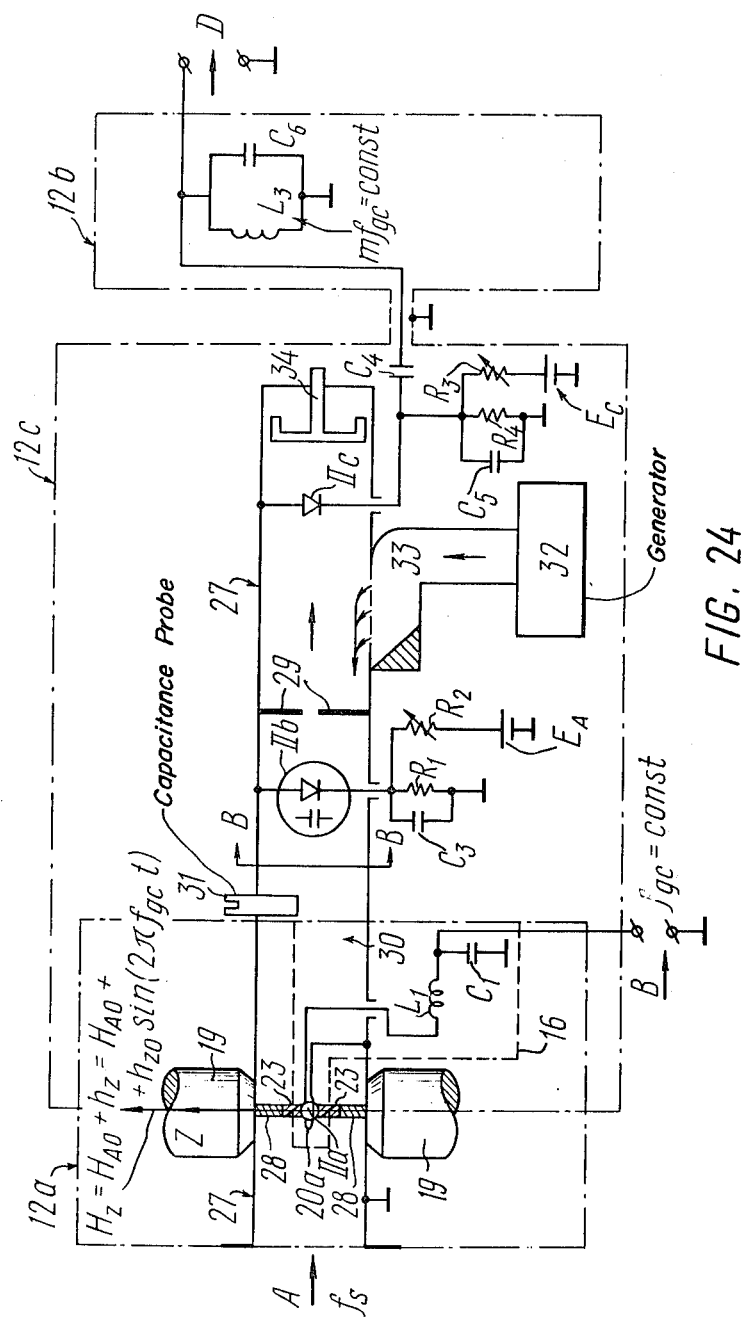
FIGS. 24 and 25 show other embodiments of the converter, according to the invention.

Consider operation of the converter 12 in the aforementioned concrete embodiment of the invention illustrated in FIG. 24; i.e. the process of passage of electromagnetic waves through this converter 12 used for converting the time-constant value of the carrier frequency $f_s = f_{sc} =$ const. of the frequency spectrum of amplitude-modulated electromagnetic waves. The electromagnetic waves come to the A-input of the waveguide 27 and propagate in the waveguide to reach a ferrite (IIa). Under the effect of the electromagnetic waves the ferromagnetic resonance phenomenon occurs in the ferrite (IIa) (see Lax and Button "Microwave ferrites and ferrimagnetics", supra) which is characterized by the precessional motion of the magnetic moment density vector M (FIG. 8) around the direction of the constant magnetic field oriented along the Z-axis and having the intensity $H_{AO}$. The frequency of this precession is determined by the magnitude of the carrier frequency $f_{sc}$ of the electromagnetic waves to be converted, whereas the steady-state value of the precession angle $\theta$ at definite values of the intensity $\overline{H}_{AO}$ of the external constant magnetic field $\overline{H}_{AO}$ and at a definite preset value of $f_{sc}$ depends on the power of these electromagnetic waves. The magnitude of the resonance frequency $f_A$ (FIG. 3) of the impedance $Z_A$ of the converter 12 (FIG. 24) as seen looking into its A-input is also dependent on the above intensity $H_{AO}$ (FIGS. 8, 24). On condition that this intensity $H_{AO}$ meets the above relationship $H_{AO} = 2\pi/\gamma f_{sc}$ the resonance frequency $f_A$ (FIG. 3) of the impedance $Z_A$ as seen looking into the A-input of the converter 12 will be equal to the carrier frequency $f_{sc}$ of the frequency spectrum of the received electromagnetic waves, i.e. $f_A = f_{sc} = \gamma/2\pi H_{AO}$. With $f_A = f_{SC}$ the precession angle $\theta$ (FIG. 8) will be maximum as determined by the power of the electromagnetic waves to be converted. The precession angle $\theta$ together with the magnetic moment density $\overline{M}$ determine the value of the energy stored in the precessional motion of the magnetic moment density vector $\overline{M}$. This energy of the precessional motion of the magnetic moment density vector $\overline{M}$ in the steady-state ferroresonance mode is the measure of the electromagnetic energy stored in the input resonant system 12a of the converter. Since the incoming electromagnetic waves undergo their own amplitude modulation, the nature of time variations of the magnitude of the precession angle $\theta$ (FIG. 8) will depend on time variations of the intensity of the magnetic component of the field induced by the received electromagnetic waves and on the relaxation time of the above magnetic moment density $\overline{M}$ (see the reference above).

Let us apply auxiliary electromagnetic waves with the constant carrier frequency $f_{gc}$ to the auxiliary B-input of the converter. If the converter ferrite is of a calcium-bismuth-vanadium or yttrium-iron garnet, the carrier frequency $f_{gc}$ of the auxiliary electromagnetic waves may range from fractions of one hertz to several megahertz. In these limits the magnitude of the carrier frequency $f_{gc}$ of the auxiliary electromagnetic waves must be such as to exceed the maximum amplitude modulation frequency of the amplitude-modulated electromagnetic waves by at least 5 or 10 times. The input resonant circuit 16 of the input resonant system 12a of the converter 12 is tuned to the constant value to the resonance frequency equal to the carrier frequency $f_{gc}$ of the auxiliary electromagnetic waves by adjusting the inductance of the inductor $L_1$ and the capacitance of the capacitor $C_1$. The amplitude $h_{zo}$ of the intensity of the magnetic field induced by the conductor loops 20a of the input resonant circuit 16, along the Z-axis, must be equal to several oersteds. A more accurate value of the amplitude $h_{zo}$ is not during adjustment of the entire converter. The optimum magnitude of this amplitude must be selected so as to obtain maximum modulation percentage (at the frequency which is a multiple of the carrier frequency $f_{gc}$ of the auxiliary electromagnetic waves) of the electromagnetic waves which appear as a result of the precessional motion of the magnetic moment density $\overline{M}$. These waves are directed towards the other semiconductor element IIb of the input resonant system 12a of the converter 12 which is made in the form of a varactor diode. The variable magnetic field induced by the conductor loops 20a along the Z-axis which has the intensity $h_z = h_{zo}\sin(2\pi f_{gc}t)$, where $h_{zo}$ is the intensity amplitude of this variable magnetic field, adds to the constant magnetic field $\overline{H}_{AO}$ directed along the same Z-axis to form a resultant magnetic field with the intensity $H_Z = H_{AO} + h_z$. Periodic time variations of the intensity $H_z$ of the resultant magnetic field cause periodic time changes of the resonance frequency $f_A$ (FIG. 5a) of the impedance $Z_A$ as seen looking into the A-input of the converter 12 (FIG. 24), meeting the following condition:

$$f_A = \gamma/2\pi H_z = \gamma/2\pi H_{AO} + \gamma/2\pi h_{zo}\sin(2\pi f_{gc}t).$$

In the description of the proposed conversion method, the relationship for the resonance frequency $f_A$ (FIG. 5a) was given in the form: $f_A(t) = f_{AO} + \Delta f_{A\,max}\sin(2\pi f_{gc}t)$, where $f_{AO}$ = the average value of the time-varying resonance frequency $f_A$ (FIG. 3) of tuning the impedance $Z_A$ of the converter 12 (FIGS. 2,7,18), and $\Delta f_{A\,max}$ (FIG. 5a) = the maximum amplitude of variation of this resonance frequency $f_A$ (FIG. 3) with time. From the last two equaltions it follows that in the concrete embodiment of the converter (FIG. 24) being considered, $f_{AO} = \gamma/2\pi H_{AO}$ and $\Delta f_{A\,max} = \gamma/2\pi h_{zo}$, where $H_{AON}$ is the intensity of the external constant magnetic field along the Z-axis, and $h_{zo}$ is the intensity amplitude of the variable magnetic field induced by the conductor loops 20a. A periodic change in the resonance frequency $f_A$ (FIG. 5a) of the impedance $Z_A$ as seen looking into the A-input of the converter (FIG. 24) course a periodic time change of the quantity $\Delta f_{AS}$(FIG. 4) which is a difference between the above resonance frequency $f_A$ and the carrier frequency $f_s$ of the frequency spectrum of the incoming electromagnetic waves. In this way, the input electromagnetic waves energy accumulated in the ferrite (IIa) (FIG. 24) and, consequently, in the input resonant system 12a of the converter 12 is additionally modulated, the frequency of the auxiliary modulation imposed on this energy being a multiple of the frequency $f_{gc}$ of the auxiliary electromagnetic waves delivered to the auxiliary B-input of this converter.

The electromagnetic waves retransmitted under the effect of the precessional motion of the magnetic moment density $\overline{M}$ come to the other semiconductor element IIb made in the form of a varactor diode. The varactor diode and the tuned $R_1C_3$-circuit connected thereto serve to achieve the following three aims. First, the varactor diode together with the tuned $R_1C_3$-circuit demodulates the incoming electromagnetic waves with the carrier frequency equal to the carrier frequency $f_{sc}$ of the received electromagnetic waves having auxiliary amplitude modulation at a frequency which is a multiple of the carrier frequency $f_{gc}$ of the auxiliary electromagnetic waves. Second, a voltage rise across the tuned $R_1C_3$-circuit follows the information it received about the time dependence of the electromagnetic energy stored in the procession of the magnetic moment density $\overline{M}$ of the ferrite. The third function performed by the varactor diode with the tuned $R_1C_3$-circuit is that it changes the resistive and reactive components of the impedance of the resonator 30 due to an increase of the varactor diode capacitance as a function of the aforementioned increment of voltage at the tuned $R_1C_3$-circuit. The above voltage increment at the tuned $R_1C_3$-circuit and, consequently, appropriate changes in the resistive and reactive components of the impedance of the resonator 30 undergo auxiliary modulation of their magnitudes with a frequency being a multiple of the carrier frequency $f_{gc}$ of the auxiliary electromagnetic waves applied to the auxiliary B-input of the converter. Now, to simplify further consideration of converter operation it will be assumed that no electromagnetic waves come to the A-input of the converter, and that, therefore, no waves are retransmitted to the resonator 30. As a result, the resonator 30 will receive only the other auxiliary electromagnetic waves produced by the generator 32 of the spatial detection system and entering the resonator 30 through a coupling slot in the partition 29. The carrier frequency of these other auxiliary electromagnetic waves can be selected, for example, in conformity with the first resonator tuning method described above, to be equal to the natural resonance frequency of this resonator 30. If so required, the natural resonance frequency of the resonator 30 can be adjusted to the precise value of the carrier frequency of the other auxiliary electromagnetic waves by means of at least one capacitance probe 31 inserted into the resonator 30 through its broad wall. Such tuning may be necessary for instance, because the varactor diode impedance depends on the power level of the electromagnetic waves coming to this varactor diode. Therefore, each definite power level of the other auxiliary electromagnetic waves produced by the generator 32 of the spatial detection system 12c is associated with a fixed value of the natural resonance frequency of the resonator 30 detuned off its value corresponding to the infinitesimal power levels of these other auxiliary electromagnetic waves. This detuning may be offset by inserting at least one aforementioned capacitance probe 31 into the resonator 30. It can also be compensated for by offsetting voltage at the tuned $R_1C_3$-circuit connected to the varactor diode. This compensation method will be described in detail below.

Since all the other auxiliary electromagnetic waves applied to the resonator 30 through the coupling slot in the partition 29 are demodulated by the varactor diode, voltage appears across the aforementioned tuned $R_1C_3$- circuit. This voltage tends to change the capacitance of the varactor diode and, as a result, the impedance of the resonator 30 will change as shown above, namely: there will be a change in the resistive component and the reactive component appears in the impedance of the resonator 30 looking into the partition 29. By using the electric field source $E_4$ and the adjustable resistor $R_2$, it is possible to compensate for the value of the demodulated voltage at the aforementioned tuned $R_1C_3$-circuit and thereby make up for a change in the varactor diode capacitance caused by this demodulated voltage, which is equivalent to balancing the above change in the impedance of the resonator 30 looking into the partition 29. This compansation completed, the resonator 30 will again be tuned to its natural resonance frequency corresponding to the infinitesimal power of the other auxiliary electromagnetic waves and equal to the carrier frequency of these other auxiliary electromagnetic waves produced by the generator 32 of the spatial detection system 12c. The result of the above compensation will be that at a frequency equal to the carrier frequency of the other auxiliary electromagnetic waves at the operating power level of these waves, the impedance of the resonator 30 looking into the partition 29 will be purely resistive. In a general case, the source $E_A$ can be used for selecting the operation mode determined by the varactor operating point.

Now let incoming electromagnetic waves be applied to the A-input of the converter, while no auxiliary electromagnetic waves appear at the auxiliary B-input of the converter. By varying the intensity $H_{AO}$ of the constant magnetic field $\overline{H}_{AO}$, the resonance frequency $f_A$ (FIG. 3) of the impedance $Z_A$ looking into the A-input of the converter (FIG. 24) can be made equal to the carrier frequency $f_{sc}$ of the electromagnetic waves to be converted. Then, the tuned $R_1C_3$-circuit connected to the varactor diode develops a voltage rise whose magnitude is determined by the power of the electromagnetic waves retransmitted by the ferrite. If the incoming electromagnetic waves are monochrome, this voltage increment across the tuned $R_1C_3$-circuit will be constant in time, and if electromagnetic pulses are delivered, the tuned $R_1C_3$-circuit will develop, accordingly, a pulse voltage. An increase of voltage across the tuned $R_1C_3$-circuit brought about by the electromagnetic waves applied to the A-input of the converter leads to an increase in the varactor diode capacitance which results in the change of the magnitudes of the resistive and the reactive components in the impedance looking into the partition 29 of the resonator 30 for the other auxiliary electromagnetic waves coming to this resonator 30. In its turn, this change of the resistive and reactive components of the impedance of the resonator 30 changes the magnitude and direction of the reflection coefficient for the other auxiliary electromagnetic waves reflected from the partition 29. A change in the magnitude of the reflection coefficient in a case when, for example, the A-input of the converter receives a signal with the power $P_S$ at the carrier frequency identically equal to the carrier frequency $f_s$ of the incoming electromagnetic waves, corresponds to a power drop $\Delta P_r$ of the other electomagnetic waves produced by the generator 32 of the spatial detection system and reflected from the partition 29. The ratio of $\Delta P_r$ to $P_s$ may exceed unity and then be called the power gain of the signal. The electomagnetic energy of the other auxiliary electromagnetic waves applied to the partition 29 is injected into the output portion of the waveguide 27 through the directional coupler 33 (FIG. 24). Part of the electromagnetic energy of the other auxiliary electromagnetic waves reflected from the partition 29 arrives at the additional semiconductou element IIc in the form of a crystal detector. The shorting plunger 34 is so placed inside the waveguide 27 that the impedance of the output portion of the waveguide 27 containing the crystal detector and the plunger 34 is purely resistive with the resistance equal to the wave impedance of the vacant waveguide 27 at the frequency of the other auxiliary electromagnetic waves. The other auxiliary electromagnetic waves demodulated by the crystal detector set up voltage across another tuned $R_4C_5$-circuit connected to this crystal detector. The abovementioned power drop $\Delta P_r$ of the other auxiliary electromagnetic waves reflected from the partition 29 will be associated with a definite voltage drop across the other tuned $R_4C_5$-circuit. Let us consider this process in greater detail. If no electromagnetic waves are applied to the A-input of the converter 12, i.e. if there is no aforementioned power drop $\Delta P_r$, the other tuned $R_4C_5$-circuit carries constant voltage which is the result of the demodulation of the other auxiliary electromagnetic waves reflected from the partition 29 by the crystal detector. This constant voltage at the other tuned $R_4C_5$-circuit can be totally or partially compensated by selecting a required resistance of the variable resistor $R_3$ which varies the magnitude of the other constant electric field source $E_c$. Delivery of monochrome electromagnetic waves to the A-input of the converter produces the aforementioned drop $\Delta P_r$ in the power of the other auxiliary electromagnetic waves reflected from the partition 29, and, accordingly, a corresponding voltage drop arises across the other tuned $R_4C_5$-circuit. The magnitude of this voltage drop is, in the long run, also dependent on the power level $P_s$ of the electromagnetic waves to be converted. After auxiliary electromagnetic waves are applied to the auxiliary B-input of the converter, this voltage drop across the other tuned $R_4C_5$-circuit is demodulated, with the modulation frequency being a multiple of the carrier frequency $f_{gc}$ of the auxiliary electromagnetic waves. Due to this latter circumstance, the oscillatory $L_3C_6$-circuit of the output resonant system 12b of the converter can be excited through the capacitor $C_4$ with a frequency which is a multiple of the carrier frequency $f_{gc}$ of the auxiliary electromagnetic waves. The voltage taken off the aforementioned $L_3C_6$-circuit is sent to the D-output of the converter.

Thus, if no electromagnetic waves are applied to the A-input of the converter, there will appear no converted electromagnetic waves at the D-output of the converter 12, regardless of the presence or absence of the auxiliary electromagnetic waves across the auxiliary B-input of this converter. When the A-input of the converter 12 receives electromagnetic waves and when auxiliary electromagnetic waves are applied to the auxiliary B-input of this converter, the D-output of the converter gives out converted electromagnetic waves having a frequency which is a multiple of the carrier frequency $f_{gc}$ of the auxiliary electromagnetic waves and an amplitude varying as a function of the power of the aforementioned electromagnetic waves to be converted.

Still another embodiment of the converter 12 (FIGS. 2, 7, 18) wherein, apart from auxiliary electromagnetic waves, other auxiliary electromagnetic waves are used for converting the carrier frequency of the electromagnetic wave spectrum, is shown schematically in FIG.

25. Like the other embodiments of the converter 12 considered above, the converter of FIG. 25 comprises: the input resonant system 12a (FIGS. 7, 25) having the A-input which accepts the incoming electromagnetic waves with the carrier frequency $f_s$, and the auxiliary B-input intended for receiving auxiliary electromagnetic waves with the carrier frequency $f_{gc}$; the output resonant system 12b with the D-output for taking off the converted electromagnetic waves with the intermediate carrier frequency $f_{im}$ which is a multiple of (or, in a special case, equal to) the frequency $f_{gc}$ of the auxiliary electromagnetic waves; and, finally, the spatial detection system 12c for coupling the input resonant system 12a and the output resonant system 12b of the converter. The input resonant system 12a is made as a metal waveguide 35 (FIG. 25) of, say, rectangular cross-section. The waveguide 35 contains the partition 28 constructionally identical with the partition 28 of the converter illustrated in FIG. 24, that is, the partition 28 in the waveguide 35 (FIG. 25) is a metal diaphragm disposed across the waveguide 35. The coupling slot provided in the partition 28 accommodates the disk 23 made from some dielectric material on which the semiconductor element 11 a is secured. The semiconductor element IIa is a sphere of single- or poly-crystal ferrite in the state of ferromagnetic resonance. The ferrite sphere is fastened in the disk 23 like in the converter illustrated in FIG. 22. The ferrite sphere (FIG. 25) is placed inside a constant, for example, magnetic field with the intensity $H_{AO}$ thereof. This field is induced by the source 19 (FIGS. 25, 24, 22) disposed outside the waveguide 35. The conductor loops 20a around the ferrite sphere are designed to create a variable magnetic field oriented along the Z-axis with the intensity $h_s$ associated with the auxiliary electromagnetic waves having the carrier frequency $f_{gc}$. The leads of the conductor loops 20a are series-connected through the narrow wall of the rectangular metal waveguide 35 to the inductor $L_1$ and the capacitor $C_1$ located outside the waveguide 35. The loops 20a, the inductor $L_1$ and the capacitor $C_1$ serve as the input resonant circuit 16. The terminals of the capacitor $C_1$ one of which is shorted to the body of the waveguide 35 (i.e. to earth) act as the auxiliary B-input (FIG. 25) of the converter 12 (FIGS. 2, 7, 18, 25). Behind the first partition 28 in the waveguide 35 is placed another additional semiconductor element IId in the form of a crystal detector (a crystal mixer may be used). The crystal detector is so positioned in the waveguide 35 that the impedance in the transverse cross-section BB of this waveguide 35 (the cross-section is drawn between the crystal detector and the partition 28) as seen looking into the crystal detector equals to the wave impedance of the waveguide 35 in the broadest possible range of the carrier frequencies of the incoming electromagnetic waves. In other words, the crystal detector (with consideration of the effect of a shorting plunger 36) must be matched with the vacant waveguide. One of the two terminals of the crystal detector is connected to the body of the wave-guide 35, and the other terminal is taken through the broad wall of the waveguide 35 to a tuned $R_5C_7$-circuit disposed outside the waveguide 35. The tuned $R_5C_7$-circuit comprises a resistor $R_5$ and a capacitor $C_7$. One lead of the resistor $R_5$ and one terminal of the capacitor $C_7$ are interconnected and their common junction is joined to the aforementioned second terminal of the crystal detector and to the terminal of the capacitor $C_8$. The other lead of the resistor $R_5$ and the other terminal of the capacitor $C_7$ are interconnected and their common junction is brought to the body of the waveguide 35.

The spatial detection system 12c (FIG. 25) is built on a metal waveguide 37 of, for example, rectangular cross-section. The waveguide 37 is divided by the partition 29 into two parts, the part between a metal end wall 38 of the waveguide 37 and the partition 29 acting as the resonator 30. In the resonator cavity, there is another semiconductor element IIb in the form of a varactor diode. The natural resonance frequency of the resonator 30 depends, mainly, on the distance between the end wall 38 of the resonator 30 and the partition 29; cross-sectional dimensions of the waveguide 37 on which the resonator 30 is built, and on the varactor diode impedance. Unlike the resonator 30 of the converter of FIG. 24, the resonator 30 under consideration (FIG. 25) may have a natural resonance frequency within the working range of the carrier frequencies $f_s$ of the electromagnetic waves applied to the A-input of the waveguide 35. The natural resonance frequency of the resonator 30 may be adjusted with the aid of conventional tuners, such as the capacitance probes 31 (one or more probes may be employed). The varactor diode is placed in the resonator 30 (FIG. 25) so that a change in the resistive component of the varactor diode impedance causes a maximum possible detuning of the resonator 30 off the natural resonance frequency. The varactor diode has two terminals one of which is shorted to the body of the waveguide 37 and the other connected through the broad wall of the waveguide 37 to a tuned $R_6C_9$-circuit located outside the boundaries of the waveguide of the 37 and through an adjustable resistor $R_7$, to the constant electric field source $E_A$. The abovementioned $R_6C_9$-circuit consists of a resistor $R_6$ and a capacitor $C_9$. One lead of the resistor $R_6$ and one terminal of the capacitor $C_9$ are interconnected and coupled to the aforementioned second varactor terminal. The common joint of the terminals of the varactor diode, tuned $R_6C_9$-circuit and adjustable resistor $R_7$ is connected to the other terminal of the capacitor $C_8$. The second lead of the resistor $R_6$ and the second terminal of the capacitor $C_9$ are joined and connected of the body of the waveguide 37. The other lead of the constant electric field source $E_A$ is shorted to the body of the waveguide 37. The additional semiconductor element IIc made in the form of a crystal detector is placed between the partition 29 and the shorting plunger 34 of the waveguide 37. One terminal of the crystal detector is shorted to the body of the waveguide 37, the other terminal of this crystal detector being connected through the broad wall of the waveguide 37 to the other tuned $R_4C_5$-circuit outside the waveguide 37 and through the adjustable resistor $R_3$ to another source $E_c$ of a constant electric field. The other lead of the source $E_c$ is shorted out to the body of the waveguide 37. The tuned $R_4C_5$-circuit incorporates the resistor $R_4$ and the capacitor $C_5$. The interconnected lead of the resistor $R_4$ and one terminal of the capacitor $C_5$ are joined to the other terminal of the crystal detector. The second lead of the resistor $R_4$ and the second terminal of the capacitor $C_5$ are interconnected and shorted out to the body of the waveguide 37. The output portion of the waveguide 37 is connected to the directional coupler 33 in such a way that the electromagnetic energy generated by the generator 32 of the spatial detection system 12c passing through this coupler is directed towards the partition 29 in the waveguide 37. The resonator 30 can be tuned by two methods. The first method consists in making the natural resonance frequency of the resonator 30 precisely equal to the carrier frequency of the other auxiliary electromagnetic waves produced by the generator 32 of the spatial detection system 12c. By the second method, the natural resonance frequency of the resonator 30 is changed so as to be somewhat different from this carrier frequency of the other auxiliary electromagnetic waves. However, the carrier frequency of the other auxiliary electromagnetic waves must remain within the resonance portion of the impedance resistance curve of the resonator 30 from the side of the partition 29. At the frequency of the other auxiliary electromagnetic waves produced by the generator 32 of the spatial detection system 12c the impedance of the section of the waveguide 37 containing the crystal detector and the shorting plunger 34 must be purely resistive with the resistance equal to the wave impedance of the vacant waveguide 37. The bodies of the waveguides 35 and 37 are interconnected and shorted to earth.

In the embodiment of the converter under consideration, the output resonant system 12b is the oscillator $L_3C_6$-circuit. The terminals of the inductor $L_3$ and the capacitor $C_6$ composing this $L_3C_6$-circuit are interconnected. One common point is connected to the second terminal of the aforementioned capacitor $C_4$ and the other shorted to the body of the waveguide 37, coupling thereby the oscillatory $L_3C_6$-circuit of the output resonant system 12b via the capacitor $C_4$ to the crystal detector. Sometimes, this $L_3C_6$-circuit can be connected directly to the crystal detector.

The output resonant system 12b is constantly tuned to its natural resonance frequency equal to the intermediate carrier frequency $f_{im}$ of the converted electromagnetic waves. In turn, this intermediate carrier frequency $f_{im}$ is a multiple of the carrier frequency $f_{gc}$ of the auxiliary electromagnetic waves applied to the auxiliary B-input of the input resonant system 12a of the converter, i.e. $f_{im} = mf_{gc}$, where $m = 1,2,3,4, \ldots$ etc.

The terminals of the capacitor $C_6$ serve as the D-output of the entire converter and give out the above converted electromagnetic waves with the carrier frequency $f_{im} = mf_{gc} = $ const.

Figure 25:
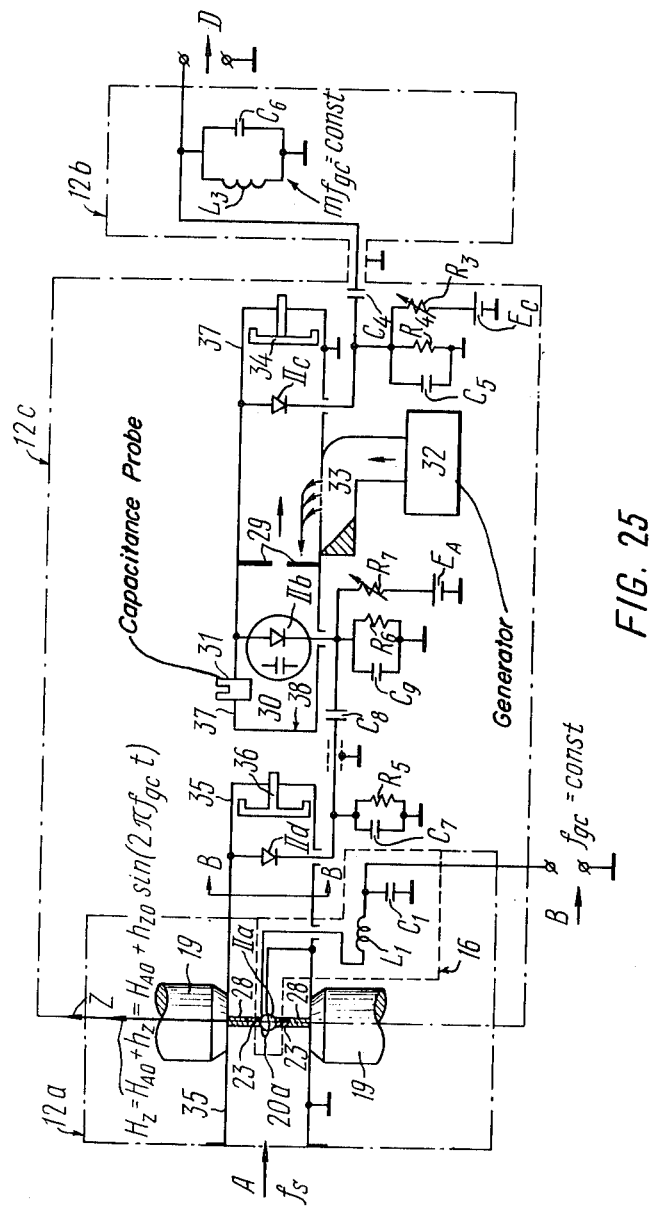

Below is described operation of the converter in the aforementioned concrete embodiment of the invention illustrated in FIG. 25. Consider the process of passage of electromagnetic waves through this converter used for converting the time-constant carrier frequency, $f_s = f_{sc} = $ const. of the frequency spectrum of amplitude-modulated electromagnetic waves. The electromagnetic waves come to the A-input of the converter waveguide 37 and propagate in the waveguide to reach the ferrite. Under the effect of the incoming electromagnetic waves the ferromagnetic resonance phenomenon occurs in the ferrite (see the reference above) which is characterised by the precessional motion of the magnetic moment density vector $\overline{M}$ (FIG. 8) around the direction of the constant magnetic field $\overline{H}_{AO}$ (FIG. 25) oriented along the Z-axis and set up by the source 19. The frequency of this precessional motion is determined by the magnitude of the carrier frequency $f_{sc}$ of the incoming electromagnetic waves, whereas the steady-state value of the precession angle $\theta$ at definite values of the intensity $H_{AO}$ of the constant magnetic field and at a definite preset value of $f_{sc}$ depends on the power of these electromagnetic waves. The magnitude of the resonance frequency $f_A$ (FIG. 3) of the impedance $Z_A$ looking into the A-input of the converter 12 (FIG. 25) is also dependent on the above intensity $H_{AO}$ (FIGS. 8, 25). On condition that this intensity $H_{AO}$ meets the above relationship $H_{AO} = 2\pi/\gamma \, f_{sc}$, the resonance frequency $f_A$ (FIG. 3) of the impedance $Z_A$ looking into the A-input of the converter (FIG. 25) will be equal to the carrier frequency $f_{sc}$ of the electromagnetic wave frequency spectrum, i.e. $f_A = fsc = \gamma/2\pi \, H_{AO}$. With $f_A = f_{sc}$ the precession angle $\theta$ (FIG. 8) will be maximum as determined by the power of the electromagnetic waves being coverted. The precession angle $\theta$ together with the magnitude of the magnetic moment density $\overline{M}$ determine the value of the energy stored in the precessional motion of the magnetic moment density vector $\overline{M}$. Thie energy of the precessional motion of the magnetic moment density vector $\overline{M}$ in the stead-state ferroresonance mode is the measure of the electromagnetic energy stored in the input resonant system 12a of the converter. Since the incoming electromagnetic waves are subjected to amplitude modulation, the nature of time variations of the precession angle $\theta$ (FIG. 8) will depend on the time variations of the intensity of the magnetic component of the field induced by the incoming electromagnetic waves, and on the relaxation time of the above magnetic moment density $\overline{M}$ (see the reference above).

Let us apply auxiliary electromagnetic waves with the constant carrier frequency $f_{gc}$ to the auxiliary B-input (FIG. 25) of the converter 12. If the converter ferrite is a calcium-bismuth-vanadium or yttrium-iron garnet, the carrier frequency $f_{gc}$ of the auxiliary electromagnetic waves may range from fractions of one hertz to several megahertz. In these limits the magnitude of the carrier frequency $f_{gc}$ of the auxiliary electromagnetic waves must be such as to exceed the maximum amplitude modulation frequency of the incoming amplitude-modulation electromagnetic waves by at least 5 or 10 times. The input resonant circuit 16 (FIG. 25) of the input resonant system 12a of the converter 12 is tuned to the constant value of the resonance frequency equal to the carrier frequency $f_{gc}$ of the auxiliary electromagnetic waves by adjusting the inductance of the inductor $L_1$ and the capacitance of the capacitor $C_1$. The amplitude $h_{zo}$ of the varying intensity of the magnetic field induced by the conductor loops 20a of the input resonant circuit 16 along the Z-axis, must be equal to several oersteds. A more accurate value of the amplitude $h_{zo}$ is set during adjustment of the entire converter. The optimum magnitude of this amplitude must be selected so as to obtain maximum modulation percentage (at the frequency which is a multiple of the carrier frequency $f_{gc}$ of the auxiliary electromagnetic waves) of the electromagnetic retransmitted by the precessional motion of the magnetic moment density $\overline{M}$. There retransmitted waves are directed towards another semiconductor element IId of the input resonant system 12a of the converter 12 which is made in the form of a crystal detector. The variable magnetic field induced by the conductor loops 20a (FIG. 25) along the Z-axis which has the intensity $h_z = h_{zo} \sin(2\pi f_{gc}t)$, where $h_{zo}$ is the intensity amplitude of this variable magnetic field, adds to the constant magnetic field $H_{AO}$ directed along the same Z-axis to form a resultant magnetic field with the intensity $H_z = H_{AO} + h_z$. Periodic time variations of the intensity $H_z$ of the resultant magnetic field $\overline{H}_z$ cause periodic time changes of the resonance frequency $f_A$ (FIG. 5a) of the impedance $Z_A$ looking into the A-input of the converter meeting the following condition:

$$f_A = \gamma/2\pi \, H_z = \gamma/2\pi \, H_{AO} + \gamma/2\pi \, h_{zo}\sin(2\pi f_{gc}t).$$

In the description of the proposed conversion method, the relationship for the resonance frequency $f_A$ (FIG. 5a) was given in the form: $f_A(t) = f_{AO} + \Delta f_{A\,max}\sin(2\pi f_{gc}t)$, where $f_{AO}$ is the average value of the time-varying resonance frequency $f_A$ (FIG. 3) of the impedance $Z_A$ of the converter 12 (FIGS. 2, 7, 18), and $\Delta f_{A\,max}$ (FIG. 5a) is the maximum amplitude of the time variation of this resonance frequency $f_A$ (FIG. 3). From the last two equations it follows that in the concrete embodiments of the converter (FIG. 24) being considered, $f_{AO} = \gamma/2\pi\ H_{AO}$ and $\Delta f_{A\,max} = \gamma/2\pi\ h_{zo}$, where $H_{AO}$ is the intensity of the external constant magnetic field along the Z-axis, and $h_{zo}$ is the intensity amplitude of the variable magnetic field $h_z$ induced by the conductor loops 20a. A periodic change in the resonance frequency $f_A$ (FIG. 5a) of the impedance $Z_A$ looking into the A-input of the converter (FIG. 25) causes a periodic time change of the difference $f_{AS}$ (FIG. 4) between the above resonance frequency $f_A$ and the carrier frequency $f_s$ of the frequency spectrum of the electromagnetic waves being converted. In this way, the energy of the incoming electromagnetic waves accumulated in the ferrite (FIG. 25) and, consequently, in the input resonant system 12a of the converter is additionally modulated, the frequency of this auxiliary power modulation being a multiple of the carrier frequency $f_{gc}$ of the auxiliary electromagnetic waves delivered to the auxiliary B-input of this converter.

The electromagnetic waves arising under the effect of the precession of the magnetic moment density $\overline{M}$ are retransmitted to the other additional semiconductor element IId made, like in the previous example, in the form of a crystal detector. This crystal detector and the tuned $R_5C_7$-circuit connected thereto serve to achieve the following two aims. First, the crystal detector together with the tuned $R_5C_7$-circuit demodulates the incoming electromagnetic waves into the waves with the carrier frequency equal to the carrier frequency $f_{sc}$ of the incoming electromagnetic waves and with auxiliary amplitude modulation at a frequency which is a multiple of the carrier frequency $f_{gc}$ of the auxiliary electromagnetic waves. Second, the demodulated voltage across the tuned $R_5C_7$-circuit is another electromagnetic characteristic which carries information about the time dependence of the electromagnetic energy accumulated in the precessional motion of the magnetic moment density $\overline{M}$ of the ferrite, that is the characteristic which indicates the time dependence of the electromagnetic energy accumulated in the input resonant system 12a of the converter.

Now, to simplify further consideration of converter operation it will be assumed that no electromagnetic waves come to the A-input of the converter. The carrier frequency of the aforementioned other auxiliary electromagnetic waves coming to the resonator 30 can be selected (for example, in conformity with the first resonator tuning method described above) to be equal to the natural resonance frequency of this resonator 30. If so required, the natural resonance frequency of the resonator 30 can be adjusted to the precise value of the carrier frequency of the other auxiliary electromagnetic waves by means of the capacitance probe 31 inserted into the resonator 30 through its broad wall. Such tuning may be necessary, for instance, because the varactor diode impedance depends on the power level of the electromagnetic waves coming to this varactor diode. Therefore, each definite power level of the other auxiliary electromagnetic waves produced by the generator 32 of the spatial detection system 12c is associated with a fixed value of detuning the natural resonance frequency of the resonator 30 with respect to its value corresponding to the infinitesimal power levels of these other auxiliary electromagnetic waves. This detuning may be offset by inserting at least one aforementioned tuning capacitance probe 31 into the resonator 30. It can also be compensated by balancing voltage at the tuned $R_6C_9$-circuit connected to the varactor diode. This compensation method will be described in detail below. Since all the other auxiliary electromagnetic waves applied to the resonator 30 through the coupling slot in the partition 29 are demodulated by the varactor diode, voltage appears across the aforementioned tuned $R_6C_9$-circuit. This voltage tends to change the capacitance of the varactor diode and, as a result, the impedance of the resonator 30 will change as shown above, namely: the resistive component of the impedance of the resonator 30 looking into the partition 29 changes and the reactive component appears in this impedance. By using the electric field source $E_A$ and the adjustable resistor $R_7$, it is possible to compensate for the value of the demodulated voltage at the aforementioned tuned $R_6C_9$-circuit and thereby make up for the aforementioned change in the varactor diode capacitance, which is equivalent to balancing the above change in the impedance of the resonator 30 looking into the partition 29. This compensation completed, the resonator 30 will again be tuned to its original natural resonance frequency equal to the carrier frequency of the other auxiliary electromagnetic waves produced by the generator 32 of the spatial detection system 12c. The result of the above compensation will be that at a frequency equal to the carrier frequency of the other auxiliary electromagnetic waves at the operating power level of the waves, the impedance of the resonator 30 looking into the partition 29 will be purely resistive. In a general case, the source $E_A$ can be used for selecting the operation mode of varactor diode operation.

Now let incoming electromagnetic waves be applied to the A-input of the converter, while the auxiliary B-input of the converter 12 receives no auxiliary electromagnetic waves. By varying the intensity $H_{AO}$ of the constant magnetic field, the resonance frequency $f_A$ (FIG. 3) of the impedance, the resonance frequency $f_A$ (FIG. 3) of the impedance $Z_A$ looking into the A-input of the converter (FIG. 25) is made equal to the carrier frequency $f_{sc}$ of the incoming electromagnetic waves. Then, the tuned $R_5C_7$-circuit connected to the crystal detector develops demodulated voltage whose magnitude is determined by the power of the electromagnetic waves retransmitted by the ferrite. If the electromagnetic waves to be converted are monochrome, this demodulated voltage across the tuned $R_5C_7$-circuit will be constant in time, and if electromagnetic pulses are delivered, the tuned $R_5C_7$-circuit will accordingly develop a pulse voltage. After the auxiliary electromagnetic waves are applied to the auxiliary B-input of the converter, the above demodulated voltage across the tuned $R_5C_7$-circuit is modulated again, the modulation frequency being a multiple of the carrier frequency $f_{gc}$ of the auxiliary electromagnetic waves. The aforementioned detected voltage at the tuned $R_5C_7$-circuit is furnished through a capacitor $C_8$ to the varactor diode which leads to a periodic time change in the increase of the capacitance of the varactor diode and, as a result, causes periodic time changes of the resistive and reactive components of the impedance of the resonator 30 at a frequency which is a multiple of the auxiliary wave carrier frequency $f_{gc}$. The aforementioned increase of the varactor diode capacitance caused by the detected voltage at the tuned $R_5C_7$-circuit can be automatically augmented or reduced depending on the polarity of connection of the varactor diode in the resonator 30 and also depending on the selected operating mode of the varactor diode. This is accomplished by varying the energy of other auxiliary electromagnetic waves in the resonator 30 which arise on account of the aforementioned increase of the varactor diode capacitance. The reason for this phenomenon is that the capacitance of the varactor diode depends on the power levels of the other auxiliary electromagnetic waves in the resonator 30, while the magnitude of the energy accumulated in the resonator 30 depends on the tuning of the resonator determined by the above capacitance of the varactor diode. Selection of the optimum polarity varactor diode connection, optimum time-average voltage at the tuned $R_6C_9$-circuit, and the maximum permissible power of the other auxiliary electromagnetic waves produced by the generator 32 of the spatial detection system 12c, maximum possible stabilization of the power and frequency of these other auxiliary electromagnetic waves, and, finally, optimum tuning of the resonator 30 - all this allows to obtain the maximum ratio of the aforementioned power drop $\Delta P_r$ of the other auxiliary electromagnetic waves reflected from the partition 29 to the power $P_s$ of the incoming electromagnetic waves applied to the A-input of the converter.

Further propagation of the incoming electromagnetic waves through the assemblies of the converter is identical with the passage of these waves through similar assemblies of the converter illustrated in FIG. 24.

Thus, when electromagnetic waves come to the A-input of the converter (FIG. 25) and when auxiliary electromagnetic waves are applied to the auxiliary B-input of this converter, the D-output of the converter will give out converted electromagnetic waves having a carrier frequency which is a multiple of the carrier frequency $f_{gc}$ of the auxiliary electromagnetic waves and an amplitude determined by the power level of the aforementioned incoming electromagnetic waves.

At least one semiconductor element II in the embodiments of the converters described above can be used to solve the following three problems. The first of these problems is accumulation of the energy of the electromagnetic waves coming to the A-input of the converter 12, in the input resonant system 12a of this converter. In all the above embodiments, the material of the semiconductor element II serves as a resonator accomplishing this accumulation of energy. The energy of the incoming electromagnetic waves can also be accumulated in conventional cavity resonators and coaxial metal cavities, as well as in oscillatory LC-circuits comprising at least one aforementioned semiconductor element II. The second problem solved with the aid of at least one semiconductor element II is short-time registration of the electromagnetic energy accumulated in the input resonant system 12a of the converter 12 through an increase in the value of some electromagnetic parameter of the semiconductor element II. This short-time registration is assumed to occur after completion of all the transients associated with varying the value of a given parameter which is the case in the steady-state energy accumulation mode in the input resonant system 12a.

The third problem solved by using at least one semiconductor element II is making provisions for readout (determination) of the increased value of the electromagnetic parameter of the semiconductor element II, corresponding to the amount of the energy of the incoming electromagnetic waves accumulated in the input resonant system 12a of the converter 12. The aforementioned readout is accomplished by periodically varying in time the amount of the energy of the incoming electromagnetic waves accumulated in the input resonant system 12a of the converter 12. This is done in order to ensure a required periodic time change of the increased magnitude of the electromagnetic parameter of the semiconductor element II corresponding to the value of the electromagnetic wave energy accumulated in the input resonant system 12a of the converter 12. In conformity with the above, periodic time variations of the energy accumulated in the input resonant system 12a of the converter 12 may be carried out in the following four ways: first, through periodic time changes in the value of the natural resonance frequency of the resonator in which the energy of the incoming electromagnetic waves is being accumulated (this periodic variation is provided by the auxiliary electromagnetic waves); second, through periodic time changes in the value of the carrier frequency of the incoming electromagnetic waves (without using the auxiliary electromagnetic waves); third, due to the above periodic time variation of the resonance natural frequency of the resonator in which the incoming electromagnetic energy is being accumulated occuring simultaneously with the aforementioned periodic time variation of the carrier frequency of these incoming electromagnetic waves; and, fourth, by using the conventional technique of changing the value of energy in the input resonant system 12a through imposing amplitude modulation on the incoming electromagnetic waves before they reach the A-input of the converter 12. In this latter case, the proposed method of converting the carrier frequency $f_s$ of the incoming electromagnetic waves may be accomplished even if the bandwidth $\Delta F_A$ (FIG. 3) in which varies the resistive component $R_a$ of the impedance $Z_A$ looking into the A-input of the converter 12 is infinitely large, in other words, if the value of the energy accumulated in the input resonant system 12a of the converter 12 is identically equal to the value of the incoming electromagnetic energy applied to the A-input of this converter.

After achieving periodic time variation of the increase in the electromagnetic parameter of the semiconductor element II corresponding to the value of the incoming electromagnetic energy accumulated in the input resonant system 12a of the converter 12, the incoming electromagnetic waves may further be converted in the following two ways. The first of the available two ways makes it possible to design converters 12 of elementary design intended for converting relatively powerful electromagnetic (pulse power above $10^{-3} - 10^{-4}$ watt). This first way of conversion has been used in the embodiments of the converters 12 illustrated in FIGS. 19,20,21,23. These converters make direct use of a periodic time variation of the increased value of the electromagnetic parameter in the semiconductor element II (corresponding to the value of the accumulated energy) in order to cause electromagnetic oscillations in the output resonant system 12b of the converter 12. In the above converters 12, the electromagnetic parameter of the semiconductor element II whose increase is used for registering the energy accumulated in the input resonant system 12a is the projection of the magnetic moment density $\overline{M}$ (FIG. 8) onto the direction of the external constant magnetic field $\overline{H}_{AO}$ applied to the semiconductor element II, or, in other words, quantity $M_z$ shown in FIG. 8. The second way of conversion is employed in designing more complicated converters 12 intended for converting relatively low-power electromagnetic waves (pulse power less than $10^{-3} - 10^{-4}$ watt). The different between the two techniques is that apart from using auxiliary electromagnetic waves required ultimately for periodic time changes of the increased value of the electromagnetic parameter of the semiconductor element II (corresponding to the amount of energy accumulated in the input resonant system 12a of the converter 12), the second method also uses other auxiliary electromagnetic waves which increase the sensitivity of reading the amplitude of a periodic time change in the increased value of the electromagnetic parameter, increasing thereby the sensitivity of determining the amount of energy accumulated in the input resonant system 12a of the converter 12. This second method is employed for designing the converters 12 shown in FIGS. 24 and 25. In these converters, a periodic time change in the increased value of $M_z$ (equivalent to the amount of energy accumulated in the input resonant system 12a of the converter 12) is transformed into a periodic time variation of the voltage rise across the tuned $R_1C_3$-circuit, and, accordingly, across the tuned $R_5C_7$-circuit and further serves to periodically vary in time the resistive and the reactive components of the impedance of the resonator 30, the latter periodic time variation being achieved by means of the other semiconductor element IIb. So, the amplitudes of variations in the resistive and the reactive components of the impedance of the resonator 30 are also proportional to the magnitude of the incoming electromagnetic energy accumulated in the input resonant system 12a of the converter 12. The aforementioned amplitudes of variations in the resistive and reactive components of the impedance of the resonator 30 are read out by means of other auxiliary electromagnetic waves produced by the generator 32. It should be noted that the magnitudes of the resistive and reactive components of the impedance of the resonator 30 can, in principle, be varied directly through periodic time variation of the aforementioned increase in the electtromagnetic parameter of the semiconductor element IIa corresponding to the magnitude of the energy accumulated in the input resonant system 12a of the converter 12. In further operation, the output resonant system 12b of the converter 12 (FIGS. 24, 25) is excited after conventional demosulation of the aforementioned other auxiliary electromagnetic waves with the aid of the additional semiconductor element IIc.

In all the embodiments of the converter 12 illustrated in FIGS. 19, 20, 21, 22, 23, 24, 25, the output resonant system 12b of the converter 12 detects in the electromagnetic wave spectrum a region which has a carrier frequency determined by the power modulation frequency in the input resonant system 12a of the converter 12. The shape of the envelope in each spectral region of the converted electromagnetic wave spectrum is determined by the shape of the envelope of the incoming wave spectrum, in other words, the amplitudes of the spectral components of the converted electromagnetic waves are determined by corresponding amplitudes of the frequency spectrum of the incoming electromagnetic waves applied to the A-input of the converter 12.

Thus, the proposed method of electromagnetic wave carrier frequency conversion in an electromagnetic energy receiver comprising a converter for converting the aforementioned carrier frequency consists in that the electromagnetic energy coming to the receiver is accumulated in the input resonant system of the above converter which is frequency-selective and can be retuned in the operating frequency range of this receiver. The incoming electromagnetic energy is accumulated either directly in the material of the semiconductor, in particular, dielectric element used in the aforementioned input resonant system, or in the resonator included in the same input resonant system, the aforementioned resonator being made in the form of lumped- or distributed-element lines and containing a semicnductor element with the electromagnetic characteristics thereof depending on the electromagnetic characteristics of the constant and variable magnetic and electric fields acting on this element. By a "semiconductor" in the proposed method of carrier frequency conversion is meant any material other than a conductor, therefore, the terms "semiconductor" and, respectively, "semiconductor element" are used in their broad physical meaning. The periodic time variation of the magnitude of the incoming electromagnetic energy accumulated in the input resonant system of the converter is brought about through selecting appropriate electromagnetic characteristics of the constant and variable magnetic and electric fields acting on the material of the above semiconductor element. Periodic time changes in the magnitude of the incoming electromagnetic energy accumulated in the input resonant system of the receiver converter is called auxiliary power modulation of the incoming electromagnetic waves. Thus, auxiliary power modulation of the incoming electromagnetic waves is provided by the fact that the electromagnetic (i.e. electric and magnetic) characteristics of the semiconductor element used in the input resonant system depend on the frequency, polarization and intensity of the constant and variable magnetic and electric fields to this element. The same dependence makes possible magnetic and/or electric readjustment of the natural resonance frequency of the input resonant system of the receiver converter and, as a result, retuning of the entire receiver in the operating frequency range. The amount of energy accumulated in the input resonant system of the receiver converter determines the magnitude of a certain selected electromagnetic parameter of the converter. Such a parameter may be, for instance, a negative increase in the magnetizing force of the semiconductor element (ferrite) in which the incoming electromagnetic energy can be accumulated, or, for example, a voltage rise across a tuned RC circuit included in the converter. As the aforementioned electromagnetic parameter of the converter depends on the magnitude of the electromagnetic energy accumulated in the input resonant system of the receiver converter, the value of the energy is registered with the aid of this electromagnetic accumulated electromagnetic parameter. The registration time lies between the period of the incoming electromagnetic waves and the maximum time required for free dissipation of the accumulated electromagnetic energy in the receiver converter. This maximum registration time is determined, for example, either by the time of free pressional motion of the magnetic moment density of the aforementioned ferrite, or by the time of free damping of the above voltage rise across the tuned RC-circuit. Since the value of the accumulated electromagnetic energy is registered with the aid of the magnitude of the aforementioned electromagnetic parameter of the converter, auxiliary power modulation of the incoming electromagnetic waves is manifested as an auxiliary time variation of the magnitude of this electromagnetic parameter of the converter. This auxiliary time variation of the magnitude of the electromagnetic parameter is used to excite the output resonant system of the receiver converter, the excitation being accomplished either through using directly the auxiliary time change of the magnitude of the above electromagnetic parameter of the converter, or through employing some electromagnetic waves used for determining (reading) the amplitudes of the obtained auxiliary time variations of the aforementioned electromagnetic parameter of the converter. The above output resonant system of the receiver converter has its natural resonance frequency which is a multiple (or, in a particular case, equals to) the frequency of the auxiliary power modulation in the input resonant system of the receiver converter. The frequency of this auxiliary power modulation in the input resonant system is determined either by the time-constant frequency of the auxiliary electromagnetic waves produced by the local oscillator of the receiver, or by the time-constant frequency of the auxiliary periodic time variation of the carrier frequency of the incoming electromagnetic waves. This periodic time variation of the incoming electromagnetic wave frequency may be accomplished either in the receiver or directly before the electromagnetic waves are applied to the receiver input. As a result, in accordance with the proposed conversion method (which, in its turn, is carried into effect through the proposed converters), the carrier frequency of the incoming electromagnetic wave spectrum is converted into the carrier frequency of the converted wave spectrum, the latter carrier frequency being either a multiple of the time-constant carrier frequency of the auxiliary electromagnetic waves produced by the local oscillator of the receiver, or a multiple of the time-constant frequency of the auxiliary time variation of the incoming electromagnetic wave carrier frequency. For this reason, the proposed frequencyselective electromagnetic energy receiver retunable in its operating frequency range does not require a local oscillator which is retuned in the same frequency range.

What is claimed is:

1. In a method of converting the carrier frequency of the electromagnetic frequency spectrum in an electromagnetic energy receiver including a converter, the steps of: transmitting to the input of said converter incoming electromagnetic waves and conveying from the output thereof converted electromagnetic waves, having the incoming electromagnetic waves act on at least one semiconductor element in said converter with the electromagnetic characteristics thereof depending on the intensity, polarization and frequency of the field associated with said incoming electromagnetic waves, effecting auxiliary power modulation of said incoming electromagnetic waves, and subjecting the frequency spectrum, polarization and intensity of the field set up by said incoming electromagnetic waves to said auxiliary power modulation, to establish the magnitudes and directions of the magnetic or electric moments, and the conductance and impedance of said semiconductor element such that said carrier frequency of each region in the spectrum of the converted electromagnetic waves becomes a multiple of the frequency of said auxiliary power modulation of said electromagnetic waves being converted.

2. A method as defined in claim 1, wherein a constant field is set up in said converter, the magnitude and direction of the intensity vector of this constant field determining additionally the magnitude and directions of the magnetic and/or electric moments, and said conductance and impedance of said semiconductor element.

3. A method as defined in claim 1, wherein a constant magnetic and constant electric field is set up in said converter, the magnitude and the intensity vector of these constant fields determining additionally the magnitudes and directions of the magnetic and electric moments, and the conductance and impedance of said semiconductor element.

4. A method as defined in claim 1, wherein said auxiliary power modulation of incoming electromagnetic waves is provided by additionally creating auxiliary electromagnetic waves; the frequency, polarization and intensity of said field associated with the auxiliary electromagnetic waves additionally determining the magnitude and direction of the magnetic or electric moments, and the conductance and impedance, of at least one said semiconductor element of said converter, due to which said carrier frequency of each spectral region of said converted electromagnetic waves becomes a multiple of the carrier frequency of said auxiliary electromagnetic waves determining the frequency of said auxiliary power modulation of said electromagnetic waves being converted.

5. A method as defined in claim 1, wherein said auxiliary power modulation of said incoming electromagnetic waves is provided by additionally setting up auxiliary electromagnetic waves; the frequency, polarization and intensity of the field induced by said auxiliary electromagnetic waves additionally determining the magnitude and direction of the magnetic and electric moments, and the conductance and impedance of at least one said semiconductor element of said converter, due to which said carrier frequency of each spectral region of said converted electromagnetic waves becomes a multiple of the carrier frequency of said auxiliary electromagnetic waves determining the frequency of said auxiliary power modulation of said electromagnetic waves being converted.

6. A method as defined in claim 1, wherein said semiconductor element of said converter is placed in a constant field, the magnitude and direction of the intensity vector of this constant field additionally determining the magnitudes and directions of the magnetic and electric moments, and said conductance and impedance of said semiconductor element.

7. A method as defined in claim 1, wherein in the case of conversion of electromagnetic waves with a carrier frequency periodically changing with time, said auxiliary power modulation of said electromagnetic waves is provided by using the resonance performance of the resistive and reactive components of the impedance of said converter and also by using said periodic time variations of the carrier frequency of said incoming electromagnetic waves, due to which said carrier frequency of each region in the converted electromagnetic wave spectrum becomes a multiple of the frequency at which the carrier frequency of said incoming electromagnetic waves periodically changes with time and which determines said frequency of the auxiliary power modulation of the same electromagnetic waves to be converted.

8. A method as defined in claim 1, wherein said auxiliary power modulation of said incoming electromagnetic waves is provided by additionally creating auxiliary electromagnetic waves; the amplitude, frequency and polarization of said auxiliary electromagnetic waves are adjusted so as to obtain a periodic time change of the difference between said resonance frequency of tuning the impedance of said converter and said carrier frequency of said incoming electromagnetic waves periodically varying with time, due to which the carrier frequency of each spectral region of said converted electromagnetic waves becomes a multiple of the frequency at which changes the difference between said resonance frequency of the impedance of said converter and the carrier frequency of said incoming electromagnetic waves periodically varying with time, whereas said difference determines said frequency of auxiliary power modulation of said electromagnetic waves being converted.

9. A method as defined in claim 4, wherein in the low-frequency, high-frequency and superhigh-frequency bands of said incoming electromagnetic waves said semiconductor element is employed in a mode which secures linear relationship between said magnitude of the resistive or reactive component of its impedance versus the field of said auxiliary electromagnetic waves acting upon this element, while the polarization, frequency and intensity of the field associated with these auxiliary electromagnetic waves are determined as functions of said linear relationship limits.

10. A method as defined in claim 1, wherein for the microwave frequency band of said incoming electromagnetic waves, a ferrite in the state of ferromagnetic resonance is employed as said semiconductor element.

11. An electromagnetic energy receiver, comprising: an input device with a waveguide-feeder system, input circuits connected to said waveguide-feeder system; a frequency-selective amplifier connected to said input circuits; at least one converter with an input resonant system connected to said frequency-selective amplifier and containing at least one semiconductor element, a spatial detection system coupled with said input resonant system; an output resonant system coupled with said spatial detection system, means for effecting auxiliary power modulation of incoming electromagnetic waves received by said converter to establish magnitude and direction of magnetic and electric moments and the conductance and impedance of said semi-conductor element such that the carrier frequency of each region in the spectrum of the converted electromagnetic waves becomes a multiple of the frequency of the auxiliary power modulation of the incoming electromagnetic waves, said spatial detection system being constructed to effect detection in space of electromagnetic waves between said input resonant system and said output resonant system and establishing the time dependence of the magnitude of electromagnetic energy transmitted by said input resonant system externally thereof, an output device connected to said output resonant system and having an intermediatefield associated with said incoming electromagnetic waves, effecting auxiliary power modulation of said incoming electromagnetic waves, and subjecting the frequency spectrum, polarization and intensity of the field set up by said incoming electromagnetic waves to said auxiliary power modulation, to establish the magnitudes and directions of the magnetic or electric moments, and the conductance and impedance of said semiconductor element such that said carrier frequency of each region in the spectrum of the converted electromagnetic waves becomes a multiple of the frequency of said auxiliary power modulation of said electromagnetic waves being converted.

12. A receiver as defined in claim 11, wherein said converter comprises a source of constant magnetic or constant electric field in which said at least one said semiconductor element of said input resonant system is placed.

13. A receiver as defined in claim 11, wherein said converter comprises a source of constant magnetic and constant electric field in which said at least one said semiconductor element of said input resonant system is placed.

14. A receiver as defined in claim 11, wherein said means for effecting auxiliary power modulation comprises: a local oscillator generating auxiliary electromagnetic waves with a time-constant carrier frequency; said input resonant system having an auxiliary input to which said local oscillator is connected, the magnitude and direction of the magnetic or electric moments, conductance and impedance of said at least one said semiconductor element of said input resonant system being additionally determined by the frequency, polarization and intensity of the electromagnetic set up by said auxiliary electromagnetic waves generated by said local oscillator; said output resonant system of said converter being tuned to a constant natural frequency which is a multiple of the carrier frequency of said auxiliary electromagnetic waves generated by said local oscillator.

15. A receiver as defined in claim 12, comprising a means for varying the magnitude of said constant magnetic or said constant electric field, wherein the change in the resonance frequency of said input resonant system containing said semiconductor element situated in said constant magnetic or constant electric field is additionally determined by a change in the intensity of said constant magnetic or constant electric field.

16. A receiver as defined in claim 13, comprising a means for varying the magnitude of said constant magnetic and said constant electric field, wherein the change in the resonance frequency of said input resonance system containing said semiconductor element situated in said constant magnetic and constant electric field is additionally determined by a change in the intensity of said constant magnetic and constant electric field.

17. A receiver as defined in claim 11, comprising: an additional generator producing additional electromagnetic waves with the frequency thereof being equal to the frequency with which said carrier frequency of said incoming electromagnetic waves being converted is changing; said output resonant system of said converter having a local semiconductor element and an additional input connecting said additional generator, the frequency at which the resonance frequency of said output resonant system changes with time being equivalent to the frequency of said additional electromagnetic waves.

18. A receiver as defined in claim 11, comprising means for creating constant magnetic or constant electric fields; said auxiliary power modulation means comprising a local oscillator generating auxiliary electromagnetic waves with a time-constant carrier frequency; said input resonant system including; an auxiliary input to which said local oscillator is connected, said semiconductor element being in the form of a ferrite in the state of ferromagnetic resonance; said input resonant circuit containing a conductor with one of its sections located in the immediate vicinity of said semiconductor element; a tuned LC-circuit to which the leads of said conductor are connected, the terminals of said capacitor C serving as said auxiliary input of said input resonant system; a waveguide; said output resonant sustem of said converter conprising an output resonant circuit with another conductor disposed in the immediate vicinity of said semiconductor element of said input resonant system; another tuned LC-circuit connected to the leads of said other conductor; an additional filter connected to the terminals of said capacitor C; said spatial detection system of said converter incorporating said semiconductor element of said input resonant system and a section of said conductor of said output resonant system located in the immediate vicinity of said semiconductor element.

19. A receiver as defined in claim 11, wherein said input resonant system of said converter comprises; a distributed-parameter circuit; said output resonant system of said converter including another distributed-parameter circuit; said at least one semiconductor element being included in said input resonant system being and a section of said other distributed-parameter circuit of said output resonant system disposed in the immediate vicinity of this semiconductor element.

20. A receiver as defined in claim 19, wherein said distributed-parameter circuit of said input resonant system of said converter is made in the form of a cavity resonator.

21. A receiver as defined in claim 19, wherein said other distributed-parameter circuit of said output resonant system of said converter is another cavity resonator.

22. A receiver as defined in claim 19, wherein said other distributed-parameter circuit of said output resonant system of said converter is a short-circuited coaxial line.

23. A receiver as defined in claim 11, comprising: means for creating a constant magnetic or a constant electric field; said auxiliary power modulation means comprising a local oscillator generating said auxiliary electromagnetic waves with a time-constant carrier frequency; said converter in which said input resonant system with said auxiliary input ot which said local oscillator is connected and said spatial detection system being in the form of a common waveguide; a first partition and a second partition arranged one after another in said common waveauide and dividing the waveguide into a input portion, resonator and an output portion; coupling slots made in said partitions; said semiconductor element which is a ferrite operating in the ferromagnetic resonance mode, and disposed in said coupling slot of said first partition; a conductor located in the immediate proximity of said semiconductor element; a tuned LC-circuit disposed outside said common waveguide and connected to the leads of said conductor, the terminals of said capacitor C forming said auxiliary input of said input resonant system; another semiconductor element which is a varactor diode contained in said resonator; a tuned RC-circuit located outside said common waveguide, one terminal of this circuit being connected to the terminal of said other semiconductor element and the other terminal earthed; a variable resistor with one lead thereof connected to the junction point of said tuned RC-circuit and point of connection of the common junction of said tuned RC-circuit and said other semiconductor element; a source of constant electric field connected to the lead of said variable resistor; an additional semiconductor element which is a crystal detector disposed in said output protion of said waveguide, another tuned RC-circuit located outside the waveguide with one terminal thereof connected to the terminal of said additional semiconductor element and the other terminal earthed; another adjustable resistor one lead of which is connected to the junction of said other tuned RC-circuit and said other semiconductor element; another source of a constant electric field connected to the other lead of said adjustable resistor; a directional coupler connected to said output protion of the waveguide which directs the electromagnetic waves passing through the waveguide and reflected from said second partition to said additional semiconductor element; said output resonant system of said converter having another tuned LC-circuit connected via a capacitor to said additional semiconductor element.

24. A receiver as defined in claim 23, wherein said resonator of said input resonant system and of said spatial detection system of said converter comprises at least one capacitance probe inserted in its wall between said semiconductor element and said other semiconductor element.

25. A receiver as defined in claim 11, which comprises: means for creating a constant magnetic field or a constant electric field; said auxiliary power modulation means comprising a local oscillator generating auxiliary electromagnetic waves with a timeconstant carrier frequency; said converter in which said input resonant system having said auxiliary input to which said local oscillator is connected being an independent waveguide; a first partition provided with a coupling slot and installed in said independent waveguide; said semiconductor element which is a ferrite is the state of ferromagnetic resonance accommodated in said coupling slot of said first partition; a conductor disposed in the immediate proximity of said semiconductor element; a tuned LC-circuit located outside said common waveguide and connected to the leads of said conductor, the terminals of said capacitor C serving said auxiliary input of said input resonant system; another additional semiconductor element which is a crystal detector contained in said independent waveguide behind said semiconductor element; a local tuned RC-circuit disposed outside said independent waveguide with its common point connected to said other additional semiconductor element; said spatial detection system also comprises another independent waveguide and contains another independent waveguide and contains another semiconductor element in the form of a varactor diode disposed in said other independent waveguide; a tuned RC-circuit situated outside said other independent waveguide, one terminal of this circuit being connected to the terminal of said other semiconductor element and the other terminal earthed; an adjustable resistor with one lead thereof connected to the junction of the common point of said tuned RC-circuit with said other semiconductor element; a source of a constant electric field connected to the other lead of said adjustable resistor; an additional semiconductor element which is a crystal detector located in said other independent waveguide; another tuned RC-circuit situated outside this waveguide with one terminal of this circuit connected to the terminal of said additional semiconductor element and the other terminal earthed; another adjustable resistor with one lead thereof connected to the junction of the common point of said tuned RC-circuit with said other semiconductor element; another source of a constant electric field connected to the other lead of said other adjustable resistor; a second partition having a coupling slot and accommodated in said other independent waveguide between said other semiconductor element and said additional semiconductor element; a directional coupler connected to said other independent waveguide between said second partition and said additional semiconductor element so that the electromagnetic energy propagating through the directional coupler and reflected from said second partition is directed to said additional semiconductor element; said output resonant system of said converter having another tuned CL-circuit connected through a capacitor to said additional semiconductor element.

* * * * *